(12) United States Patent
Seo et al.

(10) Patent No.: US 10,164,203 B2
(45) Date of Patent: Dec. 25, 2018

(54) LIGHT-EMITTING ELEMENT, LIGHT-EMITTING DEVICE, ELECTRONIC DEVICE, AND LIGHTING DEVICE

(71) Applicant: Semiconductor Energy Laboratory Co., Ltd., Kanagawa-ken (JP)

(72) Inventors: Satoshi Seo, Kanagawa (JP); Toshiki Sasaki, Kanagawa (JP); Ryohei Yamaoka, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 15/910,374

(22) Filed: Mar. 2, 2018

(65) Prior Publication Data

US 2018/0248146 A1 Aug. 30, 2018

Related U.S. Application Data

(63) Continuation of application No. 15/590,280, filed on May 9, 2017, now Pat. No. 9,911,937.

(30) Foreign Application Priority Data

May 12, 2016 (JP) ................. 2016-096369

(51) Int. Cl.
| | |
|---|---|
| *H01L 35/24* | (2006.01) |
| *H01L 51/00* | (2006.01) |
| *H01L 51/50* | (2006.01) |
| *H01L 27/32* | (2006.01) |
| *H01L 51/56* | (2006.01) |
| *H01L 51/52* | (2006.01) |

(52) U.S. Cl.
CPC ........ *H01L 51/5016* (2013.01); *H01L 27/323* (2013.01); *H01L 27/3244* (2013.01); *H01L 51/0078* (2013.01); *H01L 51/0081* (2013.01); *H01L 51/0085* (2013.01); *H01L 51/0087* (2013.01); *H01L 51/0089* (2013.01); *H01L 51/5036* (2013.01); *H01L 51/5218* (2013.01); *H01L 51/56* (2013.01)

(58) Field of Classification Search
None
See application file for complete search history.

(56) References Cited

U.S. PATENT DOCUMENTS

| | | |
|---|---|---|
| 9,065,066 B2 | 6/2015 | Seo et al. |
| 9,231,042 B2 | 1/2016 | Nishido et al. |
| 9,299,944 B2 | 3/2016 | Seo et al. |
| 9,379,345 B2 | 6/2016 | Seo et al. |
| 9,391,289 B2 | 7/2016 | Seo et al. |

(Continued)

FOREIGN PATENT DOCUMENTS

JP 2007-053090 A 3/2007

*Primary Examiner* — Thien F Tran
(74) *Attorney, Agent, or Firm* — Husch Blackwell LLP

(57) ABSTRACT

A novel light-emitting element is provided. A light-emitting element that emits red light with high color purity and has high emission efficiency is provided. A full-color light-emitting device having low power consumption is provided. In the light-emitting element that exhibits white light emission, the emission wavelength range of red light is a specific range on the longer wavelength side than the conventional emission wavelength range of red light that is usually used, and an optical element having a specific transmittance in the specific wavelength range is used.

18 Claims, 24 Drawing Sheets

(56) References Cited

U.S. PATENT DOCUMENTS

| | | |
|---|---|---|
| 9,515,278 B2 | 12/2016 | Suzuki et al. |
| 9,691,825 B2 | 6/2017 | Seo et al. |
| 2007/0035243 A1 | 2/2007 | Lee |
| 2009/0002858 A1* | 1/2009 | Okutsu .................. G02B 5/201 |
| | | 359/891 |
| 2015/0349278 A1 | 12/2015 | Inoue et al. |

\* cited by examiner

LIGHT-EMITTING ELEMENT, LIGHT-EMITTING DEVICE, ELECTRONIC DEVICE, AND LIGHTING DEVICE

This application is a continuation of copending U.S. application Ser. No. 15/590,280, filed on May 9, 2017 which is incorporated herein by reference.

BACKGROUND OF THE INVENTION

1. Field of the Invention

One embodiment of the present invention relates to a light-emitting element, a light-emitting device, an electronic device, and a lighting device. Note that one embodiment of the present invention is not limited thereto. That is, one embodiment of the invention relates to an object, a method, a manufacturing method, or a driving method. One embodiment of the present invention relates to a process, a machine, manufacture, or a composition of matter. Specifically, other examples of embodiments of the present invention include a semiconductor device, a display device, and a liquid crystal display device.

2. Description of the Related Art

A light-emitting element including an EL layer between a pair of electrodes (also referred to as an organic EL element) has characteristics such as thinness, light weight, high-speed response to input signals, and low power consumption, and a display including such a light-emitting element has attracted attention as a next-generation flat panel display.

In a light-emitting element, voltage application between a pair of electrodes causes recombination, in an EL layer, of electrons and holes injected from the electrodes, which brings a light-emitting substance (organic compound) contained in the EL layer into an excited state, and then light is emitted in returning from the excited state to the ground state. The excited state can be a singlet excited state (S*) and a triplet excited state (T*). Light emission from a singlet excited state is referred to as fluorescence, and light emission from a triplet excited state is referred to as phosphorescence. The statistical generation ratio thereof in the light-emitting element is considered to be S*:T*=1:3. Since the spectrum of light emitted from a light-emitting substance depends on the light-emitting substance, the use of different types of organic compounds as light-emitting substances makes it possible to obtain light-emitting elements which exhibit various colors.

To achieve full color display of an image on a display, for example, light-emitting elements of at least three colors of red, green, and blue are necessary. Furthermore, the light-emitting elements are required to have low power consumption.

Examples of specific methods to achieve full color display are as follows: so-called side-by-side patterning in which light-emitting elements that emit light of different colors are separately formed; a white color filter method in which a white light-emitting element is used in combination with a color filter as an optical element; and a color conversion method in which a light-emitting element that emits monochromatic light, such as a blue light-emitting element, is used in combination with a color conversion filter. Each of the methods has advantages and disadvantages.

REFERENCE

Patent Document

[Patent Document 1] Japanese Published Patent Application No. 2007-53090

SUMMARY OF THE INVENTION

Compared with side-by-side patterning, a white color filter method, which is a specific method to achieve full color display, facilitates high resolution because a plurality of light-emitting elements share one EL layer, and is suitable particularly for the market of displays.

In a white color filter method, red, green, and blue light-emitting elements are formed on the basis of white light emission obtained from a common EL layer; thus, the spectra of the emission colors are preferably separated from each other so that the color purity of the light-emitting elements is increased.

Thus, one embodiment of the present invention provides a novel light-emitting element, a light-emitting element that emits red light with high color purity and has high emission efficiency, or a full-color light-emitting device having low power consumption.

Note that the description of these objects does not disturb the existence of other objects. In one embodiment of the present invention, there is no need to achieve all the objects. Other objects will be apparent from and can be derived from the description of the specification, the drawings, the claims, and the like.

According to one embodiment of the present invention, in a light-emitting element including an EL layer that exhibits white light emission between a pair of electrodes, red light with high color purity can be obtained from the EL layer and emission efficiency can be increased. That is, in the light-emitting element that exhibits white light emission, the emission wavelength range of red light is a specific range on the longer wavelength side than the conventional emission wavelength range of red light that is usually used, and when red light obtained from the EL layer is emitted to the outside, an optical element having a specific transmittance in the specific wavelength range of a wavelength range of light that can be achieved with a conventional optical element (e.g., a color filter) is used.

Note that red light preferably has an emission spectrum peak with a half width (or full width at half maximum) of greater than or equal to 5 nm and less than or equal to 120 nm at greater than or equal to 620 nm and less than or equal to 680 nm. Furthermore, an optical element (e.g., a color filter) having a transmittance of 40% or less of light with a wavelength of 600 nm and a transmittance of 40% or more of light with a wavelength of 630 nm is preferably used as the optical element.

To efficiently obtain red light emission from the EL layer that exhibits white light emission, a structure in which an optical path length between the pair of electrodes is adjusted is preferably also used for the light-emitting element.

Thus, one embodiment of the present invention is a light-emitting element including an EL layer between a reflective electrode and a semi-transmissive and semi-reflective electrode. The EL layer exhibits white light emission. A transparent conductive layer is provided between the reflective electrode and the EL layer. The optical path length between the transparent conductive layer and the semi-transmissive and semi-reflective electrode is set such that red light emission obtained from the EL layer is relatively intensified. An optical element having a transmittance of 40% or less of light with a wavelength of 600 nm and a transmittance of 40% or more of light with a wavelength of 630 nm is provided on the semi-transmissive and semi-reflective electrode side of the light-emitting element. Emission of light whose emission spectrum has a half width of greater than or equal to 5 nm and less than or equal to 120 nm and a peak at greater than or equal to 620 nm and less than or equal to 680 nm is obtained from the light-emitting element.

Another embodiment of the present invention is a light-emitting element including an EL layer between a reflective electrode and a semi-transmissive and semi-reflective electrode. The EL layer exhibits white light emission. A transparent conductive layer is provided between the reflective electrode and the EL layer. The EL layer includes a light-emitting substance with an emission spectrum peak at greater than or equal to 600 nm and less than or equal to 700 nm. The optical path length between the transparent conductive layer and the semi-transmissive and semi-reflective electrode is set such that red light emission obtained from the EL layer is relatively intensified. An optical element is provided on the semi-transmissive and semi-reflective electrode side of the light-emitting element. The optical element has a transmittance of 40% or less of light with a wavelength of 600 nm and a transmittance of 40% or more of light with a wavelength of 630 nm. Emission of light whose emission spectrum has a half width of greater than or equal to 5 nm and less than or equal to 120 nm and a peak at greater than or equal to 620 nm and less than or equal to 680 nm is obtained from the light-emitting element.

Another embodiment of the present invention is a light-emitting element including an EL layer between a reflective electrode and a semi-transmissive and semi-reflective electrode. The EL layer exhibits white light emission. A transparent conductive layer is provided between the reflective electrode and the EL layer. The EL layer includes a first light-emitting layer, a charge generation layer, and a second light-emitting layer. The optical path length between the transparent conductive layer and the semi-transmissive and semi-reflective electrode is set to be more than or equal to one wavelength such that red light emission obtained from the EL layer is relatively intensified. An optical element having a transmittance of 40% or less of light with a wavelength of 600 nm and a transmittance of 40% or more of light with a wavelength of 630 nm is provided on the semi-transmissive and semi-reflective electrode side of the light-emitting element. Emission of light whose emission spectrum has a half width of greater than or equal to 5 nm and less than or equal to 120 nm and a peak at greater than or equal to 620 nm and less than or equal to 680 nm is obtained from the light-emitting element.

Another embodiment of the present invention is a light-emitting element comprising an EL layer between a reflective electrode and a semi-transmissive and semi-reflective electrode. The EL layer exhibits white light emission. A transparent conductive layer is provided between the reflective electrode and the EL layer. The EL layer includes a first light-emitting layer, a charge generation layer, and a second light-emitting layer. The first light-emitting layer or the second light-emitting layer includes a light-emitting substance with an emission spectrum peak at greater than or equal to 600 nm and less than or equal to 700 nm. The optical path length between the transparent conductive layer and the semi-transmissive and semi-reflective electrode is set to be more than or equal to one wavelength such that red light emission obtained from the EL layer is relatively intensified. An optical element is provided on the semi-transmissive and semi-reflective electrode side of the light-emitting element. The optical element has a transmittance of 40% or less of light with a wavelength of 600 nm and a transmittance of 40% or more of light with a wavelength of 630 nm. Emission of light whose emission spectrum has a half width of greater than or equal to 5 nm and less than or equal to 120 nm and a peak at greater than or equal to 620 nm and less than or equal to 680 nm is obtained from the light-emitting element.

Note that the optical element in each of the above structures refers to a filter that transmits light with a specific wavelength, and a color filter or an interference filter can be usually used as the optical element.

Furthermore, in each of the above structures, a phosphorescent organometallic complex is preferably used as the light-emitting substance.

Another embodiment of the present invention is a light-emitting device including the light-emitting element in any of the above structures. That is, a full-color light-emitting device including the red light-emitting element in any of the above structures and also light-emitting elements that exhibit other emission colors is included in the scope of the invention. A light-emitting device further including a housing, a connection terminal, or the like in addition to the light-emitting element is also included in the scope of the invention.

One embodiment of the present invention includes, in its scope, in addition to a light-emitting device including a light-emitting element, an electronic device including the light-emitting element or the light-emitting device (specifically, an electronic device including the light-emitting element or the light-emitting device and a connection terminal or an operation key) and a lighting device including the light-emitting element or the light-emitting device (specifically, a lighting device including the light-emitting element or the light-emitting device and a housing). Accordingly, a light-emitting device in this specification refers to an image display device or a light source (including a lighting device). In addition, the light-emitting device includes, in its category, all of a module in which a connector such as a flexible printed circuit (FPC) or a tape carrier package (TCP) is connected to a light-emitting device, a module in which a printed wiring board is provided on the tip of a TCP, and a module in which an integrated circuit (IC) is directly mounted on a light-emitting element by a chip on glass (COG) method.

In a light-emitting element of one embodiment of the present invention, emission of red light in a specific wavelength range is obtained from an EL layer that exhibits white light emission, whereby the color purity of the red light can be increased. Note that in the case where the emission spectrum of red light is shifted to the long wavelength side to increase the color purity, combination with an optical element (color filter) causes a problem of a decrease in emission intensity due to transmission through the optical element. However, according to one embodiment of the present invention, a light-emitting element with high color purity and high emission efficiency can be provided by being combined with an optical element that has a specific transmittance of red light in the specific wavelength range because a decrease in emission intensity conventionally caused when color purity is increased can be suppressed. Furthermore, by being provided with the red light-emitting element, a full-color light-emitting device with low power consumption can be provided. Furthermore, an electronic device, a lighting device, or the like with low power consumption can be provided.

Note that the description of these effects does not preclude the existence of other effects. One embodiment of the present invention does not necessarily achieve all the effects listed above. Other effects will be apparent from and can be derived from the description of the specification, the drawings, the claims, and the like.

BRIEF DESCRIPTION OF THE DRAWINGS

FIGS. 15A, 15B1, and 15B2 illustrate block diagrams of display devices.

DETAILED DESCRIPTION OF THE INVENTION

Figure 1:
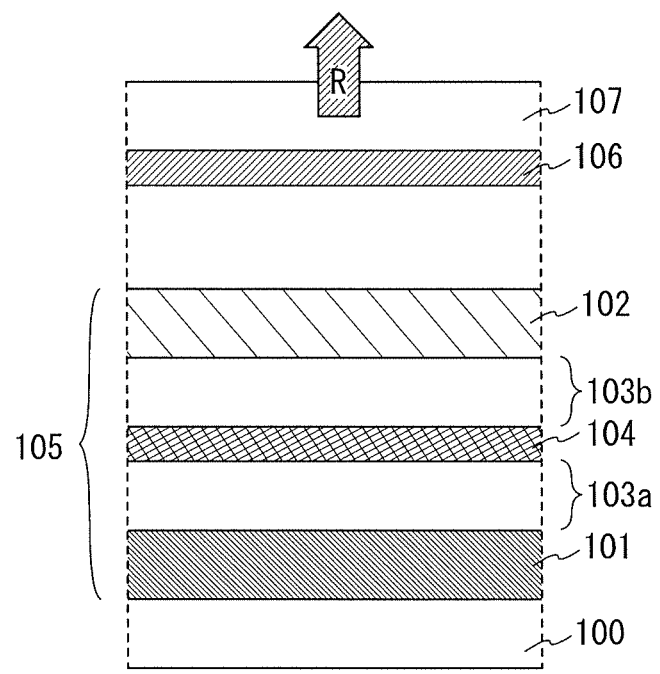
FIG. 1 illustrates a light-emitting element that is one embodiment of the present invention.

Embodiments and Example of the present invention will be described below with reference to the drawings. Note that the present invention is not limited to the following description, and the modes and details of the present invention can be modified in various ways without departing from the spirit and scope of the present invention. Therefore, the present invention should not be construed as being limited to the description in the following embodiments and Example.

Note that the position, the size, the range, or the like of each structure illustrated in the drawings and the like are not accurately represented in some cases for easy understanding. Therefore, the disclosed invention is not necessarily limited to the position, size, range, or the like as disclosed in the drawings and the like.

In the description of modes of the present invention in this specification and the like with reference to the drawings, the same components in different diagrams are denoted by the same reference numeral in some cases.

(Embodiment 1)

In this embodiment, a light-emitting element that is one embodiment of the present invention will be described with reference to FIG. 1.

In FIG. 1, a light-emitting element 105 is formed on a substrate 100, and an optical element 106 is formed on a substrate 107. Note that any material that can be used as a substrate can be appropriately used as each of the substrate 100 and the substrate 107 in the light-emitting element illustrated in FIG. 1 as long as at least the substrate 107 has a light-transmitting property.

The light-emitting element 105 includes an EL layer that exhibits white light emission between a first electrode 101 and a second electrode 102; a first EL layer 103a and a second EL layer 103b are stacked with a charge generation layer 104 therebetween in this embodiment. Note that in the case where the first electrode 101 is an anode and the second electrode 102 is a cathode, the charge generation layer 104 has a function of injecting electrons into the first EL layer 103a and injecting holes into the second EL layer 103b. The charge generation layer 104 has a light-transmitting property.

Light from the first EL layer 103a and the second EL layer 103b is emitted to the second electrode 102 side of the light-emitting element 105; thus, at least the second electrode 102 needs to have a light-transmitting property. In this embodiment, the first electrode 101 is formed to function as a reflective electrode, and the second electrode 102 is formed to function as a semi-transmissive and semi-reflective electrode.

In the light-emitting element 105, white light emission can be obtained by combining light emitted from the first EL layer 103a and light emitted from the second EL layer 103b, and a combination of a color of light emitted from the first EL layer 103a and a color of light emitted from the second EL layer 103b can be appropriately adjusted. For example, a structure can be employed in which blue light emission is obtained from the first EL layer 103a and green light emission and red light emission are obtained from the second EL layer 103b. In the light-emitting element 105 in this embodiment, the first EL layer 103a or the second EL layer 103b includes a substance that emits red light (red light-emitting substance).

Furthermore, the light-emitting element 105 and the optical element 106 are provided so as to overlap with each other with a space therebetween, and light from the light-emitting element 105 is emitted to the outside of the substrate 107 through the optical element 106. Note that in the case where a color filter that transmits only red light is used as the optical element 106, light from the light-emitting element 105 is emitted as red light to the outside. In the case where a color filter that transmits only blue light is used as the optical element 106, light from the light-emitting element 105 is emitted as blue light to the outside. In the case where a color filter that transmits only green light is used as the optical element 106, light from the light-emitting element 105 is emitted as green light to the outside. The same applies to the case where light emission of any other color is obtained.

In this embodiment, the emission spectrum of red light included in white light obtained from the EL layer has a half width of greater than or equal to 5 nm and less than or equal to 120 nm and a peak at greater than or equal to 620 nm and less than or equal to 680 nm. As the optical element 106, a color filter whose transmittance of light with a wavelength of 600 nm is greater than or equal to 0% and less than or equal to 40% and whose transmittance of light with a wavelength of 630 nm is greater than or equal to 40% and less than or equal to 100% is used. This allows red light of white light emitted from the light-emitting element 105 to be emitted to the outside as shown by the arrow in FIG. 1. Accordingly, a red light-emitting element having higher color purity and higher emission efficiency than a conventional one can be obtained.

It is preferred that a light-emitting substance with an emission spectrum peak at greater than or equal to 600 nm and less than or equal to 700 nm, more preferably at greater than or equal to 620 nm and less than or equal to 700 nm, be used as the red light-emitting substance for the first EL layer 103a or the second EL layer 103b. As such a light-emitting substance, a known material can be used. For example, any of the following can be used: bis{4,6-dimethyl-2-[3-(3,5-dimethylphenyl)-5-phenyl-2-pyrazinyl-κN] phenyl-κC} (2,6-dimethyl-3,5-heptanedionato-$\kappa^2$O,O') iridium(III) (abbreviation: [Ir(dmdppr-P)$_2$(dibm)]), bis{4,6-dimethyl-2-[5-(4-cyano-2,6-dimethylphenyl)-3-(3,5-dimethylphenyl)-2-pyrazin yl-κN]phenyl-κC} (2,2,6,6-tetramethyl-3,5-heptanedionato-$\kappa^2$O,O')iridium (III) (abbreviation: [Ir(dmdppr-dmCP)$_2$(dpm)]), (acetylacetonato)bis[2-methyl-3-phenylquinoxalinato-N,$C^{2'}$]iridium(III) (abbreviation: [Ir(mpq)$_2$(acac)]), and (acetylacetonato)bis(2,3-diphenylquinoxalinato-N,$C^{2'}$)iridium(III) (abbreviation: [Ir(dpq)$_2$(acac)]).

Note that in the case where green light or blue light is emitted to the outside, an optical element that transmits only light of the corresponding color is provided.

Using such a red light-emitting element, a blue light-emitting element, a green light-emitting element in combination enables fabrication of a light-emitting device with high color purity and low power consumption.

Note that the structure shown in this embodiment can be used in combination with any of the structures shown in the other embodiments as appropriate.

(Embodiment 2)

In this embodiment, a light-emitting element that is one embodiment of the present invention will be described.

<<Basic Structure of Light-Emitting Element>>

Figure 2A:
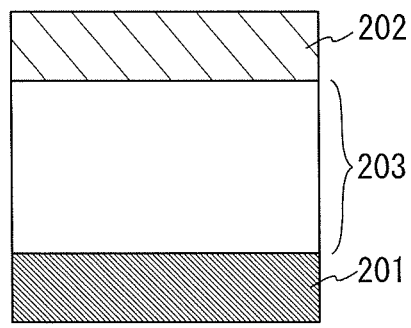
FIGS. 2A to 2D illustrate the structures of light-emitting elements.

Next, a basic structure of the light-emitting element will be described. FIG. 2A illustrates a light-emitting element in which an EL layer including a light-emitting layer is provided between a pair of electrodes. Specifically, an EL layer 203 is provided between a first electrode 201 and a second electrode 202 (single structure).

Figure 2B:
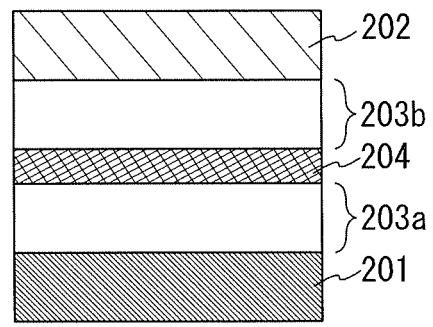

FIG. 2B illustrates a light-emitting element that has a stacked-layer structure (tandem structure) in which a plurality of EL layers (two EL layers 203a and 203b in FIG. 2B) are provided between a pair of electrodes and a charge generation layer 204 is provided between the EL layers. With the use of such a tandem light-emitting element, a low-power light-emitting device which can be driven at low voltage can be obtained.

The charge generation layer 204 has a function of injecting electrons into one of the EL layers (203a or 203b) and injecting holes into the other of the EL layers (203b or 203a) when a voltage is applied between the first electrode 201 and the second electrode 202. Thus, in FIG. 2B, when a voltage is applied between the first electrode 201 and the second electrode 202 such that the potential of the first electrode 201 is higher than that of the second electrode 202, the charge generation layer 204 injects electrons into the EL layer 203a and injects holes into the EL layer 203b.

Note that in terms of light extraction efficiency, the charge generation layer 204 preferably has a light-transmitting property with respect to visible light (specifically, the charge generation layer 204 has a visible light transmittance of 40% or more). The charge generation layer 204 functions even if it has lower conductivity than the first electrode 201 or the second electrode 202.

Figure 2C:
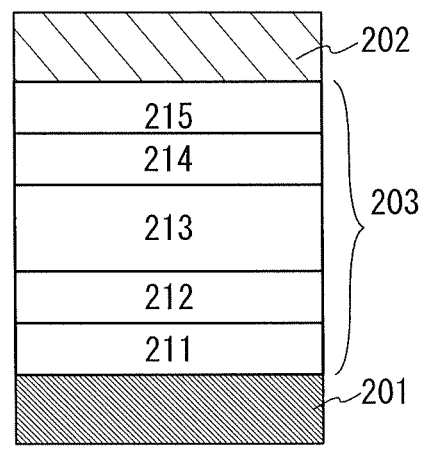

FIG. 2C illustrates a stacked-layer structure of the EL layer 203 of the light-emitting element of one embodiment of the present invention. Note that in the case, it is assumed that the first electrode 201 functions as an anode. The EL layer 203 has a structure in which a hole-injection layer 211, a hole-transport layer 212, a light-emitting layer 213, an electron-transport layer 214, and an electron-injection layer 215 are stacked in this order over the first electrode 201. Also in the case where a plurality of EL layers are provided as in the tandem structure illustrated in FIG. 2B, the layers in each EL layer are sequentially stacked from the, anode side as described above. When the first electrode 201 is a cathode and the second electrode 202 is an anode, the stacking order of the layers is reversed.

The light-emitting layer 213 included in each of the EL layers (203, 203a, and 203b) contains an appropriate combination of a light-emitting substance and a plurality of substances, so that fluorescence or phosphorescence of a desired emission color can be obtained. The light-emitting layer 213 may include stacked layers having different emission colors. In that case, the light-emitting substance and other substances are different between the stacked light-emitting layers. Alternatively, the plurality of EL layers (203a and 203b) in FIG. 2B may exhibit the respective emission colors. Also in that case, the light-emitting substance and other substances are different between the light-emitting layers.

In the light-emitting element of one embodiment of the present invention, for example, a micro optical resonator (microcavity) structure is employed in which the first electrode 201 is a reflective electrode and the second electrode 202 is a semi-transmissive and semi-reflective electrode as shown in FIG. 2C, whereby light emission from the light-emitting layer 213 in the EL layer 203 can be resonated between the electrodes so that light emission obtained through the second electrode 202 can be intensified.

Note that when the first electrode 201 of the light-emitting element is a reflective electrode with a structure in which a reflective conductive material and a light-transmitting conductive material (transparent conductive film) are stacked, optical adjustment can be performed by controlling the thickness of the transparent conductive film. Specifically, when the wavelength of light from the light-emitting layer 213 is λ, the distance between the first electrode 201 and the second electrode 202 is preferably adjusted to around $m\lambda/2$ (m is a natural number).

To amplify desired light (wavelength: λ) obtained from the light-emitting layer 213, the optical path length from the first electrode 201 to a region in the light-emitting layer 213 that emits the desired light (light-emitting region) and the optical path length from the second electrode 202 to the region in the light-emitting layer 213 that emits the desired light (light-emitting region) are each preferably adjusted to around $(2m'+1)\lambda/4$ (m' is a natural number). Here, the light-emitting region means a region where holes and electrons are recombined in the light-emitting layer 213.

By such optical adjustment, the spectrum of specific monochromatic light from the light-emitting layer 213 can be narrowed and light emission with a high color purity can be obtained.

In that case, the optical path length between the first electrode 201 and the second electrode 202 is, to be exact, represented by the total thickness from a reflective region in the first electrode 201 to a reflective region in the second electrode 202. However, it is difficult to exactly determine the reflective regions in the first electrode 201 and the second electrode 202; thus, it is assumed that the above effect can be sufficiently obtained wherever the reflective regions may be set in the first electrode 201 and the second electrode 202. Further, the optical path length between the first electrode 201 and the light-emitting layer that emits desired light is, to be exact, the optical path length between the reflective region in the first electrode 201 and the light-emitting region in the light-emitting layer that emits desired light. However, it is difficult to exactly determine the reflective region in the first electrode 201 and the light-emitting region in the light-emitting layer that emits desired light; thus, it is assumed that the above effect can be sufficiently obtained wherever the reflective region and the light-emitting region may be set in the first electrode 201 and the light-emitting layer that emits desired light.

The light-emitting element illustrated in FIG. 2C has a microcavity structure, with which light (monochromatic light rays) with different wavelengths can be extracted from the same EL layer. Thus, side-by-side patterning to obtain light emissions of different colors (e.g., RGB) is not needed. Therefore, it is easy to achieve high resolution display. Note that a combination with coloring layers (color filters) is also possible. In addition, emission intensity of light with a specific wavelength in the front direction can be increased, whereby power consumption can be reduced.

In the light-emitting element of one embodiment of the present invention described in this embodiment, at least one of the first electrode 201 and the second electrode 202 is a light-transmitting electrode (a transparent electrode, a semi-transmissive and semi-reflective electrode, or the like). In the case where the light-transmitting electrode is a transparent electrode, the transparent electrode has a visible light transmittance of greater than or equal to 40%. In the case where the light-transmitting electrode is a semi-transmissive and semi-reflective electrode, the semi-transmissive and semi-reflective electrode has a visible light reflectance of greater than or equal to 20% and less than or equal to 80%, preferably greater than or equal to 40% and less than or equal to 70%. These electrodes preferably have a resistivity of $1\times10^{-2}$ Ωcm or less.

Furthermore, when one of the first electrode 201 and the second electrode 202 is a reflective electrode in the above light-emitting element of one embodiment of the present invention, the visible light reflectance of the reflective electrode is greater than or equal to 40% and less than or equal to 100%, preferably greater than or equal to 70% and less than or equal to 100%. This electrode preferably has a resistivity of $1\times10^{-2}$ Ωcm or less.

<<Specific Structure and Manufacturing Method of Light-Emitting Element>>

Specific structures and specific manufacturing methods of light-emitting elements of embodiments of the present invention will be described with reference to FIGS. 2A to 2D. Here, a light-emitting element having the tandem structure in FIG. 2B and microcavity structures will be described with reference to FIG. 2D. In the light-emitting element in FIG. 2D having microcavity structures, a reflective electrode is formed as the first electrode 201 and a semi-transmissive and semi-reflective electrode is formed as the second electrode 202. Therefore, a single-layer structure or a stacked-layer structure can be formed using one or more kinds of desired electrode materials. Note that the second electrode 202 is formed after formation of the EL layer 203b, with the use of a material selected as described above. For fabrication of these electrodes, a sputtering method or a vacuum evaporation method can be used.

<First Electrode and Second Electrode>

As materials for forming the first electrode 201 and the second electrode 202, any of the materials below can be used in an appropriate combination as long as the functions of the electrodes described above can be fulfilled. For example, a metal, an alloy, an electrically conductive compound, a mixture of these, and the like can be appropriately used. Specifically, an In—Sn oxide (also referred to as ITO), an In—Si—Sn oxide (also referred to as ITSO), an In—Zn oxide, an In—W—Zn oxide, or the like can be used. In addition, it is possible to use a metal such as aluminum (Al), titanium (Ti), chromium (Cr), manganese (Mn), iron (Fe), cobalt (Co), nickel (Ni), copper (Cu), gallium (Ga), zinc (Zn), indium (In), tin (Sn), molybdenum (Mo), tantalum (Ta), tungsten (W), palladium (Pd), gold (Au), platinum (Pt), silver (Ag), yttrium (Y), or neodymium (Nd) or an alloy containing an appropriate combination of any of these metals. It is also possible to use a Group 1 element or a Group 2 element in the periodic table (e.g., lithium (Li), cesium (Cs), calcium (Ca), or strontium (Sr)), a rare earth metal such as europium (Eu) or ytterbium (Yb), an alloy containing an appropriate combination of any of these elements, graphene, or the like.

Figure 2D:
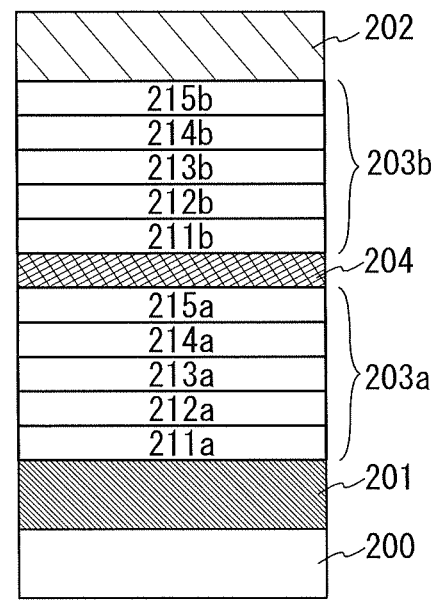

In the light-emitting element in FIG. 2D, when the first electrode 201 is an anode, a hole-injection layer 211a and a hole-transport layer 212a of the EL layer 203a are sequentially stacked over the first electrode 201 by a vacuum evaporation method. After formation of the EL layer 203a and the charge generation layer 204, a hole-injection layer 211b and a hole-transport layer 212b of the EL layer 203b are sequentially stacked over the charge generation layer 204 in a similar manner.

<Hole-Injection Layer and Hole-Transport Layer>

The hole-injection layers (211, 211a, and 211b) inject holes from the first electrode 201 that is an anode and the charge generation layer 204 to the EL layers (203, 203a, and 203b) and each contain a material with an excellent hole-injection property.

As examples of the material with an excellent hole-injection property, transition metal oxides such as molybdenum oxide, vanadium oxide, ruthenium oxide, tungsten oxide, and manganese oxide can be given. Alternatively, it is possible to use any of the following materials: phthalocyanine-based compounds such as phthalocyanine (abbreviation: H$_2$Pc) and copper phthalocyanine (abbreviation: CuPc); aromatic amine compounds such as 4,4'-bis[N-(4-diphenylaminophenyl)-N-phenylamino]biphenyl (abbreviation: DPAB) and N,N'-bis{4-[bis(3-methylphenyl)amino]phenyl}-N,N'-diphenyl-(1,1'-biphenyl)-4,4'-diam ine (abbreviation: DNTPD); high molecular compounds such as poly(3,4-ethylenedioxythiophene)/poly(styrenesulfonic acid) (abbreviation: PEDOT/PSS); and the like.

Alternatively, as the material with an excellent hole-injection property, a composite material containing a hole-transport material and an acceptor material (electron-accepting material) can also be used. In that case, the acceptor material extracts electrons from a hole-transport material, so that holes are generated in the hole-injection layers (211, 211a, and 211b) and the holes are injected into the light-emitting layers (213, 213a, and 213b) through the hole-transport layers (212, 212a, and 212b). Note that each of the hole-injection layers (211, 211a, and 211b) may be formed to have a single-layer structure using a composite material containing a hole-transport material and an acceptor material (electron-accepting material), or a stacked-layer structure in which a layer including a hole-transport material and a layer including an acceptor material (electron-accepting material) are stacked.

The hole-transport layers (212, 212a, and 212b) transport the holes, which are injected from the first electrode 201 by the hole-injection layers (211, 211a, and 211b), to the light-emitting layers (213, 213a, and 213b). Note that the hole-transport layers (212, 212a, and 212b) each contain a hole-transport material. It is particularly preferable that the HOMO level of the hole-transport material included in the hole-transport layers (212, 212a, and 212b) be the same as or close to that of the hole-injection layers (211, 211a, and 211b).

Examples of the acceptor material used for the hole-injection layers (211, 211a, and 211b) include an oxide of a metal belonging to any of Group 4 to Group 8 of the periodic table. Specifically, molybdenum oxide, vanadium oxide, niobium oxide, tantalum oxide, chromium oxide, tungsten oxide, manganese oxide, and rhenium oxide can be given. Among these, molybdenum oxide is especially preferable since it is stable in the air, has a low hygroscopic property, and is easy to handle. Alternatively, organic acceptors such as a quinodimethane derivative, a chloranil derivative, and a hexaazatriphenylene derivative can be used. Specifically, 7,7,8,8-tetracyano-2,3,5,6-tetrafluoroquinodimethane (abbreviation: $F_4$-TCNQ), chloranil, 2,3,6,7,10,11-hexacyano-1,4,5,8,9,12-hexaazatriphenylene (abbreviation: HAT-CN), or the like can be used.

The hole-transport materials used for the hole-injection layers (211, 211a, and 211b) and the hole-transport layers (212, 212a, and 212b) are preferably substances with a hole mobility of greater than or equal to $10^{-6}$ cm$^2$/Vs. Note that other substances may be used as long as the substances have a hole-transport property more excellent than an electron-transport property.

Preferred hole-transport materials are π-electron rich heteroaromatic compounds (e.g., carbazole derivatives and indole derivatives) and aromatic amine compounds, examples of which include compounds having an aromatic amine skeleton, such as 4,4'-bis[N-(1-naphthyl)-N-phenylamino]biphenyl (abbreviation: NPB or α-NPD), N,N'-bis(3-methylphenyl)-N,N'-diphenyl-[1,1'-biphenyl]-4,4'-diamine (abbreviation: TPD), 4,4'-bis[N-(spiro-9,9'-bifluoren-2-yl)-N-phenylamino]biphenyl (abbreviation: BSPB), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), 4-phenyl-4'-(9-phenyl-9H-carbazol-3-yl)triphenylamine (abbreviation: PCBA1BP), 3-[4-(9-phenanthryl)-phenyl]-9-phenyl-9H-carbazole (abbreviation: PCPPn), N-(4-biphenyl)-N-(9,9-dimethyl-9H-fluoren-2-yl)-9-phenyl-9H-carbazol-3-amine (abbreviation: PCBiF), N-(1,1'-biphenyl-4-yl)-N-[4-(9-phenyl-9H-carbazol-3-yl)phenyl]-9,9-dimethyl-9H-fluor en-2-amine (abbreviation: PCBBiF), 4,4'-diphenyl-4"-(9-phenyl-9H-carbazol-3-yl)triphenylamine (abbreviation: PCBBi1BP), 4-(1-naphthyl)-4'-(9-phenyl-9H-carbazol-3-yl) triphenylamine (abbreviation: PCBANB), 4,4'-di(1-naphthyl)-4"-(9-phenyl-9H-carbazol-3-yl)triphenylamine (abbreviation: PCBNBB), 9,9-dimethyl-N-phenyl-N-[4-(9-phenyl-9H-carbazol-3-yl)phenyl]fluoren-2-amine (abbreviation: PCBAF), N-phenyl-N-[4-(9-phenyl-9H-carbazol-3-yl)phenyl]spiro-9,9'-bifluoren-2-amine (abbreviation: PCBASF), 4,4',4"-tris(carbazol-9-yl)triphenylamine (abbreviation: TCTA), 4,4',4"-tris(N,N-diphenylamino)triphenylamine (abbreviation: TDATA), and 4,4',4"-tris[N-(3-methylphenyl)-N-phenylamino]triphenylamine (abbreviation: MTDATA); compounds having a carbazole skeleton, such as 1,3-bis(N-carbazoly)benzene (abbreviation: mCP), 4,4'-di(N-carbazolyl)biphenyl (abbreviation: CBP), 3,6-bis (3,5-diphenylphenyl)-9-phenylcarbazole (abbreviation: CzTP), 3,3'-bis(9-phenyl-9H-carbazole) (abbreviation: PCCP), 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), 3-[N-(1-naphthyl)-N-(9-phenylcarbazol-3-yl)amino]-9-phenylcarbazole (abbreviation: PCzPCN1), 1,3,5-tris[4-(N-carbazolyl)phenyl]benzene (abbreviation: TCPB), and 9-[4-(10-phenyl-9-anthracenyl)phenyl]-9H-carbazole (abbreviation: CzPA); compounds having a thiophene skeleton, such as 4,4',4"-(benzene-1,3,5-triyl)tri (dibenzothiophene) (abbreviation: DBT3P-II), 2,8-diphenyl-4-[4-(9-phenyl-9H-fluoren-9-yl)phenyl]dibenzothiophene (abbreviation: DBTFLP-III), and 4-[4-(9-phenyl-9H-fluoren-9-yl)phenyl]-6-phenyldibenzothiophene (abbreviation: DBTFLP-IV); and compounds having a furan skeleton, such as 4,4',4"-(benzene-1,3,5-triyl)tri(dibenzofuran) (abbreviation: DBF3P-II) and 4-{3-[3-(9-phenyl-9H-fluoren-9-yl)phenyl]phenyl}dibenzofuran (abbreviation: mmDBFFLBi-II).

A high molecular compound such as poly(N-vinylcarbazole) (abbreviation: PVK), poly(4-vinyltriphenylamine) (abbreviation: PVTPA), poly [N-(4-{N'-[4-(4-diphenylamino)phenyl]phenyl-N-phenylamino}phenyl)methacryla mide] (abbreviation: PTPDMA), or poly[N,N'-bis(4-butylphenyl)-N,N'-bis(phenyl)benzidine] (abbreviation: Poly-TPD) can also be used.

Note that the hole-transport material is not limited to the above examples and may be one of or a combination of various known materials when used for the hole-injection layers (211, 211a, and 211b) and the hole-transport layer (212, 212a, 212b). Note that the hole-transport layers (212, 212a, and 212b) may each be formed of a plurality of layers. That is, for example, the hole-transport layers may each have a stacked-layer structure of a first hole-transport layer and a second hole-transport layer.

Next, in the light-emitting element in FIG. 2D, the light-emitting layer 213a is formed over the hole-transport layer 212a of the EL layer 203a by a vacuum evaporation method. After the EL layer 203a and the charge generation layer 204 are formed, the light-emitting layer 213b is formed over the hole-transport layer 212b of the EL layer 203b by a vacuum evaporation method.

<Light-Emitting Layer>

The light-emitting layers (213, 213a, and 213b) each contain a light-emitting substance. Note that as the light-emitting substance, a substance whose emission color is blue, violet, bluish violet, green, yellowish green, yellow, orange, red, or the like is appropriately used. When the plurality of light-emitting layers (213a and 213b) are formed using different light-emitting substances, different emission colors can be exhibited (for example, complementary emission colors are combined to achieve white light emission). Furthermore, a stacked-layer structure in which one light-emitting layer contains two or more kinds of light-emitting substances may be employed.

The light-emitting layers (213, 213a, and 213b) may each contain one or more kinds of organic compounds (a host material and an assist material) in addition to a light-emitting substance (guest material). As the one or more kinds of organic compounds, one or both of the hole-transport material and the electron-transport material described in this embodiment can be used.

In the light-emitting element of one embodiment of the present invention, a light-emitting substance that exhibits red light emission (red light-emitting substance) is used as a guest material in one of the light-emitting layers (213a and 213b). It is preferred that a light-emitting substance with an emission spectrum peak at greater than or equal to 600 nm and less than or equal to 700 nm, more preferably greater than or equal to 620 nm and less than or equal to 700 nm, be used here as the red light-emitting substance. For the light-emitting substance, a known material can be used. For example, any of the following materials can be used: bis{4,6-dimethyl-2-[3-(3,5-dimethylphenyl)-5-phenyl-2-pyrazinyl-κN]phenyl-κC} (2,6-dimethyl-3,5-heptanedionato-$κ^2$O,O')iridium(III) (abbreviation: [Ir(dmdppr-P)$_2$(dibm)]), bis{4,6-dimethyl-2-[5-(4-cyano-2,6-dimethylphenyl)-3-(3,5-dimethylphenyl)-2-pyrazin yl-κN]phenyl-κC} (2,2,6,6-tetramethyl-3,5-heptanedionato-$κ^2$O,O')iridium(III) (abbreviation: [Ir(dmdppr-dmCP)$_2$(dpm)]), (acetylacetonato)bis[2-methyl-3-phenylquinoxalinato-N,$C^{2'}$]iridium(III) (abbreviation: Ir(mpq)$_2$(acac)), and (acetylacetonato)bis(2,3-diphenylquinoxalinato-N,$C^{2'}$)iridium(III) (abbreviation: [Ir(dpq)$_2$(acac)]).

There is no particular limitation on the light-emitting substances that can be used for the light-emitting layers (213, 213a, and 213b), and a light-emitting substance that converts singlet excitation energy into light emission in the visible light range or a light-emitting substance that converts triplet excitation energy into light emission in the visible light range can be used. Examples of the light-emitting substance are given below.

As an example of the light-emitting substance that converts singlet excitation energy into light emission, a substance that emits fluorescence (fluorescent material) can be given. Examples of the substance that emits fluorescence include a pyrene derivative, an anthracene derivative, a triphenylene derivative, a fluorene derivative, a carbazole derivative, a dibenzothiophene derivative, a dibenzofuran derivative, a dibenzoquinoxaline derivative, a quinoxaline derivative, a pyridine derivative, a pyrimidine derivative, a phenanthrene derivative, and a naphthalene derivative. A pyrene derivative is particularly preferable because it has a high emission quantum yield. Specific examples of the pyrene derivative include N,N'-bis(3-methylphenyl)-N,N'-bis[3-(9-phenyl-9H-fluoren-9-yl)phenyl]pyrene-1,6-dia mine (abbreviation: 1,6mMemFLPAPm), N,N'-diphenyl-N,N'-bis[4-(9-phenyl-9H-fluoren-9-yl)phenyl]pyrene-1,6-diamine (abbreviation: 1,6FLPAPm), N,N'-bis(dibenzofuran-2-yl)-N,N'-diphenylpyrene-1,6-diamine (abbreviation: 1,6FrAPm), N,N'-bis(dibenzothiophen-2-yl)-N,N'-diphenylpyrene-1,6-diamine (abbreviation: 1,6ThAPm), N,N'-(pyrene-1,6-diyl)bis[(N-phenylbenzo[b]naphtho[1,2-d]furan)-6-amine] (abbreviation: 1,6BnfAPm), N,N'-(pyrene-1,6-diyl)bis[(N-phenylbenzo[b]naphtho[1,2-d]furan)-8-amine] (abbreviation: 1,6BnfAPm-02), and N,N'-(pyrene-1,6-diyl)bis[(6,N-diphenylbenzo[b]naphtho[1,2-d]furan)-8-amine] (abbreviation: 1,6BnfAPm-03).

In addition, it is possible to use 5,6-bis[4-(10-phenyl-9-anthryl)phenyl]-2,2'-bipyridine (abbreviation: PAP2BPy), 5,6-bis[4'-(10-phenyl-9-anthryl)biphenyl-4-yl]-2,2'-bipyridine (abbreviation: PAPP2BPy), N,N'-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), 4-(9H-carbazol-9-yl)-4'-(9,10-diphenyl-2-anthryl)triphenylamine (abbreviation: 2YGAPPA), N,9-diphenyl-N-[4-(10-phenyl-9-anthryl)phenyl]-9H-carbazol-3-amine (abbreviation: PCAPA), 4-(10-phenyl-9-anthryl)-4'-(9-phenyl-9H-carbazol-3-yl)triphenylamine (abbreviation: PCBAPA), 4-[4-(10-phenyl-9-anthryl)phenyl]-4'-(9-phenyl-9H-carbazol-3-yl)triphenylamine (abbreviation: PCBAPBA), perylene, 2,5,8,11-tetra(tert-butyl)perylene (abbreviation: TBP), N,N''-(2-tert-butylanthracene-9,10-diyldi-4,1-phenylene)bis[N,N',N'-triphenyl-1,4-pheny lenediamine] (abbreviation: DPABPA), N,9-diphenyl-N-[4-(9,10-diphenyl-2-anthryl)phenyl]-9H-carbazol-3-amine (abbreviation: 2PCAPPA), N-[4-(9,10-diphenyl-2-anthryl)phenyl]-N,N',N'-triphenyl-1,4-phenylenediamine (abbreviation: 2DPAPPA), or the like.

As examples of a light-emitting substance that converts triplet excitation energy into light emission, a substance that emits phosphorescence (phosphorescent material) and a thermally activated delayed fluorescence (TADF) material that exhibits thermally activated delayed fluorescence can be given.

Examples of a phosphorescent material include an organometallic complex, a metal complex (platinum complex), and a rare earth metal complex. These substances exhibit the respective emission colors (emission peaks) and thus, any of them is appropriately selected according to need.

As examples of a phosphorescent material which exhibits blue or green light emission and whose emission spectrum has a peak wavelength at greater than or equal to 450 nm and less than or equal to 570 nm, the following substances can be given.

For example, organometallic complexes having a 4H-triazole skeleton, such as tris{2-[5-(2-methylphenyl)-4-(2,6-dimethylphenyl)-4H-1,2,4-triazol-3-yl-κN2]phenyl-κ C} iridium(III) (abbreviation: [Ir(mpptz-dmp)$_3$]), tris(5-methyl-3,4-diphenyl-4H-1,2,4-triazolato)iridium(III) (abbreviation: [Ir(Mptz)$_3$]), tris[4-(3-biphenyl)-5-isopropyl-3-phenyl-4H-1,2,4-triazolato]iridium(III) (abbreviation: [Ir(iPrptz-3b)$_3$]), and tris[3-(5-biphenyl)-5-isopropyl-4-phenyl-4H-1,2,4-triazolato]iridium(III) (abbreviation: [Ir(iPr5btz)$_3$]); organometallic complexes having a 1H-triazole skeleton, such as tris[3-methyl-1-(2-methylphenyl)-5-phenyl-1H-1,2,4-triazolato]iridium(III) (abbreviation: [Ir(Mptz1-mp)$_3$]) and tris(1-methyl-5-phenyl-3-propyl-1H-1,2,4-triazolato)iridium (III) (abbreviation: [Ir(Prptz1-Me)$_3$]); organometallic complexes having an imidazole skeleton, such as fac-tris[1-(2,6-dim, isopropylphenyl)-2-phenyl-1H-imidazole]iridium (III) (abbreviation: [Ir(iPrpmi)$_3$]) and tris[3-(2,6-dimethylphenyl)-7-methylimidazo[1,2-f]phenanthridinato]iridium (III) (abbreviation: [Ir(dmpimpt-Me)$_3$]); organometallic complexes in which a phenylpyridine derivative having an electron-withdrawing group is a ligand, such as bis[2-(4',6'-difluorophenyl)pyridinato-N,$C^{2'}$]iridium(III) tetrakis(1-pyrazolyl)borate (abbreviation: FIr6), bis[2-(4',6'-difluorophenyl)pyridinato-N,$C^{2'}$]iridium(III) picolinate (abbreviation: FIrpic), bis{2-[3',5'-bis(trifluoromethyl)phenyl]pyridinato-N,$C^{2'}$}iridium(III) picolinate (abbreviation: [Ir(CF$_3$ppy)$_2$(pic)]), and bis[2-(4',6'-difluorophenyl)pyridinato-N,$C^{2'}$]iridium(III) acetylacetonate (abbreviation: FIr(acac)); and the like can be given.

As examples of a phosphorescent material which exhibits green or yellow light emission and whose emission spectrum has a peak wavelength at greater than or equal to 495 nm and less than or equal to 590 nm, the following substances can be given.

For example, organometallic iridium complexes having a pyrimidine skeleton, such as tris(4-methyl-6-phenylpyrimidinato)iridium(III) (abbreviation: [Ir(mppm)₃]), tris(4-t-butyl-6-phenylpyrimidinato)iridium(III) (abbreviation: [Ir(tBuppm)₃]), (acetylacetonato)bis(6-methyl-4-phenylpyrimidinato)iridium(III) (abbreviation: [Ir(mppm)₂(acac)]), (acetylacetonato)bis(6-tert-butyl-4-phenylpyrimidinato)iridium(III) (abbreviation: [Ir(tBuppm)₂(acac)]), (acetylacetonato)bis[6-(2-norbornyl)-4-phenylpyrimidinato]iridium(III) (abbreviation: [Ir(nbppm)₂(acac)]), (acetylacetonato)bis [5-methyl-6-(2-methylphenyl)-4-phenylpyrimidinato]iridium(III) (abbreviation: [Ir(mpmppm)₂(acac)]), (acetylacetonato)bis{4,6-dimethyl-2-[6-(2,6-dimethylphenyl)-4-pyrimidinyl-κN3]phenyl-κC}iridium(III) (abbreviation: [Ir(dmppm-dmp)₂(acac)]), and (acetylacetonato)bis(4,6-diphenylpyrimidinato)iridium(III) (abbreviation: [Ir(dppm)₂(acac)]); organometallic iridium complexes having a pyrazine skeleton, such as (acetylacetonato)bis(3,5-dimethyl-2-phenylpyrazinato)iridium(III) (abbreviation: [Ir(mppr-Me)₂(acac)]) and (acetylacetonato)bis(5-isopropyl-3-methyl-2-phenylpyrazinato)iridium (III) (abbreviation: [Ir(mppr-iPr)₂(acac)]); organometallic iridium complexes having a pyridine skeleton, such as tris(2-phenylpyridinato-N,C²')iridium(III) (abbreviation: [Ir(ppy)₃]), bis(2-phenylpyridinato-N,C²')iridium(III) acetylacetonate (abbreviation: [Ir(ppy)₂(acac)]), bis(benzo[h]quinolinato)iridium(III) acetylacetonate (abbreviation: [Ir(bzq)₂(acac)]), tris(benzo[h]quinolinato)iridium(III) (abbreviation: [Ir(bzq)₃]), tris(2-phenylquinolinato-N,C²')iridium(III) (abbreviation: [Ir(pq)₃]), and bis(2-phenylquinolinato-N,C²')iridium(III) acetylacetonate (abbreviation: [Ir(pq)₂(acac)]); organometallic complexes such as bis(2,4-diphenyl-1,3-oxazolato-N,C²')iridium(III) acetylacetonate (abbreviation: [Ir(dpo)₂(acac)]), bis{2-[4'-(perfluorophenyl)phenyl]pyridinato-N,C²'}iridium(III) acetylacetonate (abbreviation: [Ir(p-PF-ph)₂(acac)]), and bis(2-phenylbenzothiazolato-N,C²')iridium(III) acetylacetonate (abbreviation: [Ir(bt)₂(acac)]); and rare earth metal complexes such as tris(acetylacetonato)(monophenanthroline)terbium(III) (abbreviation: [Tb(acac)₃(Phen)]) can be given.

As examples of a phosphorescent material which exhibits yellow or red light emission and whose emission spectrum has a peak wavelength at greater than or equal to 570 nm and less than or equal to 750 nm, the following substances can be given.

For example, organometallic complexes having a pyrimidine skeleton, such as (diisobutyrylmethanato)bis[4,6-bis(3-methylphenyl)pyrimidinato]iridium(III) (abbreviation: [Ir(5mdppm)₂(dibm)]), bis[4,6-bis(3-methylphenyl)pyrimidinato](dipivaloylmethanato)iridium(III) (abbreviation: [Ir(5mdppm)₂(dpm)]), and bis[4,6-di(naphthalen-1-yl)pyrimidinato](dipivaloylmethanato)iridium(III) (abbreviation: [Ir(d1npm)₂(dpm)]); organometallic complexes having a pyrazine skeleton, such as (acetylacetonato)bis(2,3,5-triphenylpyrazinato)iridium(III) (abbreviation: [Ir(tppr)₂(acac)]), bis(2,3,5-triphenylpyrazinato)(dipivaloylmethanato)iridium(III) (abbreviation: [Ir(tppr)₂(dpm)]), and (acetylacetonato)bis[2,3-bis(4-fluorophenyl)quinoxalinato]iridium(III) (abbreviation: [Ir(Fdpq)₂(acac)]); organometallic complexes having a pyridine skeleton, such as tris(1-phenylisoquinolinato-N,C²')iridium(III) (abbreviation: [Ir(piq)₃]) and bis(1-phenylisoquinolinato-N,C²')iridium(III) acetylacetonate (abbreviation: [Ir(piq)₂(acac)]); platinum complexes such as 2,3,7,8,12,13,17,18-octaethyl-21H,23H-porphyrinplatinum(II) (abbreviation: [PtOEP]); and rare earth metal complexes such as tris(1,3-diphenyl-1,3-propanedionato)(monophenanthroline)europium(III) (abbreviation: [Eu(DBM)₃(Phen)]) and tris[1-(2-thenoyl)-3,3,3-trifluoroacetonato](monophenanthroline)europium(III) (abbreviation: [Eu(TTA)₃(Phen)]) can be given.

As the organic compounds (the host material and the assist material) used in the light-emitting layers (213, 213a, and 213b), one or more kinds of substances having a larger energy gap than the light-emitting substance (the guest material) are used. Note that any of the hole-transport materials listed above and the electron-transport materials given below may be used as the organic compounds (the host material and the assist material).

When the light-emitting substance is a fluorescent material, it is preferable to use, as the host material, an organic compound that has a high energy level in a singlet excited state and has a low energy level in a triplet excited state. For example, an anthracene derivative or a tetracene derivative is preferably used. Specific examples include 9-phenyl-3-[4-(10-phenyl-9-anthryl)phenyl]-9H-carbazole (abbreviation: PCzPA), 3-[4-(1-naphthyl)-phenyl]-9-phenyl-9H-carbazole (abbreviation: PCPN), 9-[4-(10-phenyl-9-anthracenyl)phenyl]-9H-carbazole (abbreviation: CzPA), 7-[4-(10-phenyl-9-anthryl)phenyl]-7H-dibenzo[c,g]carbazole (abbreviation: cgDBCzPA), 6-[3-(9,10-diphenyl-2-anthryl)phenyl]-benzo[b]naphtho[1,2-d]furan (abbreviation: 2mBnfPPA), 9-phenyl-10-{4-(9-phenyl-9H-fluoren-9-yl)biphenyl-4'-yl }anthracene (abbreviation: FLPPA), 5,12-diphenyltetracene, and 5,12-bis(biphenyl-2-yl)tetracene.

In the case where the light-emitting substance is a phosphorescent material, an organic compound having triplet excitation energy (energy difference between a ground state and a triplet excited state) which is higher than that of the light-emitting substance is preferably selected as the host material. In that case, it is possible to use a zinc- or aluminum-based metal complex, an oxadiazole derivative, a triazole derivative, a benzimidazole derivative, a quinoxaline derivative, a dibenzoquinoxaline derivative, a dibenzothiophene derivative, a dibenzofuran derivative, a pyrimidine derivative, a triazine derivative, a pyridine derivative, a bipyridine derivative, a phenanthroline derivative, an aromatic amine, a carbazole derivative, and the like.

Specific examples include metal complexes such as tris(8-quinolinolato)aluminum(III) (abbreviation: Alq), tris(4-methyl-8-quinolinolato)aluminum(III) (abbreviation: Almq₃), bis(10-hydroxybenzo[h]quinolinato)beryllium(II) (abbreviation: BeBq₂), bis(2-methyl-8-quinolinolato)(4-phenylphenolato)aluminum(III) (abbreviation: BAlq), bis(8-quinolinolato)zinc(II) (abbreviation: Znq), bis[2-(2-benzoxazolyl)phenolato]zinc(II) (abbreviation: ZnPBO), and bis[2-(2-benzothiazolyl)phenolato]zinc(II) (abbreviation: ZnBTZ); heterocyclic compounds such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), 2,2',2"-(1,3,5-benzenetriyl)-tris(1-phenyl-1H-benzimidazole) (abbreviation: TPBI), bathophenanthroline (abbreviation: BPhen), bathocuproine (abbreviation: BCP), 2,9-bis(naphthalen-2-yl)-4,7-diphenyl-1,10-phenanthroline (abbreviation: NBphen), and 9-[4-(5-phenyl-1,3,4-oxadiazol-2-yl)phenyl]-9H-carbazole (abbreviation: CO11); and aromatic amine compounds such as NPB, TPD, and BSPB.

In addition, condensed polycyclic aromatic compounds such as anthracene derivatives, phenanthrene derivatives, pyrene derivatives, chrysene derivatives, and dibenzo[g,p]chrysene derivatives can be used. Specifically, 9,10-diphenylanthracene (abbreviation: DPAnth), N,N-diphenyl-9-[4-(10-phenyl-9-anthryl)phenyl]-9H-carbazol-3-amine (abbreviation: CzA1PA), 4-(10-phenyl-9-anthryl)triphenylamine (abbreviation: DPhPA), YGAPA, PCAPA, N,9-diphenyl-N-{4-[4-(10-phenyl-9-anthryl)phenyl]phenyl}-9H-carbazol-3-amine (abbreviation: PCAPBA, 2PCAPA, 6,12-dimethoxy-5,11-diphenylchrysene, DBC1, 9-[4-(10-phenyl-9-anthracenyl)phenyl]-9H-carbazole (abbreviation: CzPA), 3,6-diphenyl-9-[4-(10-phenyl-9-anthryl)phenyl]-9H-carbazole (abbreviation: DPCzPA), 9,10-bis(3,5-diphenylphenyl)anthracene (abbreviation: DPPA), 9,10-di(2-naphthyl)anthracene (abbreviation: DNA), 2-tert-butyl-9,10-di(2-naphthyl)anthracene (abbreviation: t-BuDNA), 9,9'-bianthryl (abbreviation: BANT), 9,9'-(stilbene-3,3'-diyl)diphenanthrene (abbreviation: DPNS), 9,9'-(stilbene-4,4'-diyl)diphenanthrene (abbreviation: DPNS2), 1,3,5-tri(1-pyrenyl)benzene (abbreviation: TPB3), or the like can be used.

In the case where a plurality of organic compounds are used for the light-emitting layers (213, 213a, and 213b), it is preferable to use compounds that form an exciplex in combination with a light-emitting substance. In that case, although any of various organic compounds can be combined appropriately to be used, to form an exciplex efficiently, it is particularly preferable to combine a compound that easily accepts holes (hole-transport material) and a compound that easily accepts electrons (electron-transport material). As the hole-transport material and the electron-transport material, specifically, any of the materials described in this embodiment can be used.

The TADF material is a material that can up-convert a triplet excited state into a singlet excited state (i.e., reverse intersystem crossing is possible) using a little thermal energy and efficiently exhibits light emission (fluorescence) from the singlet excited state. The TADF is efficiently obtained under the condition where the difference in energy between the triplet excited level and the singlet excited level is greater than or equal to 0 eV and less than or equal to 0.2 eV, preferably greater than or equal to 0 eV and less than or equal to 0.1 eV. Note that "delayed fluorescence" exhibited by the TADF material refers to light emission having the same spectrum as normal fluorescence and an extremely long lifetime. The lifetime is $10^{-6}$ seconds or longer, preferably $10^{-3}$ seconds or longer.

Specific examples of the TADF material include fullerene, a derivative thereof, an acridine derivative such as proflavine, and eosin. Other examples include a metal-containing porphyrin, such as a porphyrin containing magnesium (Mg), zinc (Zn), cadmium (Cd), tin (Sn), platinum (Pt), indium (In), or palladium (Pd). Examples of the metal-containing porphyrin include a protoporphyrin-tin fluoride complex ($SnF_2$(Proto IX)), a mesoporphyrin-tin fluoride complex ($SnF_2$(Meso IX)), a hematoporphyrin-tin fluoride complex ($SnF_2$(Hemato IX)), a coproporphyrin tetramethyl ester-tin fluoride complex ($SnF_2$(Copro III-4Me)), an octaethylporphyrin-tin fluoride complex ($SnF_2$(OEP)), an etioporphyrin-tin fluoride complex ($SnF_2$(Etio I)), and an octaethylporphyrin-platinum chloride complex ($PtCl_2$OEP).

Alternatively, a heterocyclic compound having a π-electron rich heteroaromatic ring and a π-electron deficient heteroaromatic ring, such as 2-(biphenyl-4-yl)-4,6-bis(12-phenylindolo[2,3-a]carbazol-11-yl)-1,3,5-triazine (PIC-TRZ), 2-{4-[3-(N-phenyl-9H-carbazol-3-yl)-9H-carbazol-9-yl]phenyl}-4,6-diphenyl-1,3,5-tria zine (PCCzPTzn), 2-[4-(10H-phenoxazin-10-yl)phenyl]-4,6-diphenyl-1,3,5-triazine (PXZ-TRZ), 3-[4-(5-phenyl-5,10-dihydrophenazin-10-yl)phenyl]-4,5-diphenyl-1,2,4-triazole (PPZ-3TPT), 3-(9,9-dimethyl-9H-acridin-10-yl)-9H-xanthen-9-one (ACRXTN), bis[4-(9,9-dimethyl-9,10-dihydroacridine)phenyl]sulfone (DMAC-DPS), or 10-phenyl-10H,10'H-spiro[acridin-9,9'-anthracen]-10'-one (ACRSA), can be used. Note that a substance in which the π-electron rich heteroaromatic ring is directly bonded to the π-electron deficient heteroaromatic ring is particularly preferable because both the donor property of the π-electron rich heteroaromatic ring and the acceptor property of the π-electron deficient heteroaromatic ring are increased and the energy difference between the singlet excited state and the triplet excited state becomes small.

Note that when a TADF material is used, the TADF material can be combined with another organic compound.

In the light-emitting element in FIG. 2D, the electron-transport layer 214a is formed over the light-emitting layer 213a of the EL layer 203a by a vacuum evaporation method. After the EL layer 203a and the charge generation layer 204 are formed, the electron-transport layer 214b is formed over the light-emitting layer 213b of the EL layer 203b by a vacuum evaporation method.

<Electron-Transport Layer>

The electron-transport layers (214, 214a, and 214b) transport the electrons, which are injected from the second electrode 202 by the electron-injection layers (215, 215a, and 215b), to the light-emitting layers (213, 213a, and 213b). Note that the electron-transport layers (214, 214a, and 214b) each contain an electron-transport material. It is preferable that the electron-transport materials included in the electron-transport layers (214, 214a, and 214b) be substances with an electron mobility of higher than or equal to $1\times10^{-6}$ cm$^2$/Vs. Note that other substances may also be used as long as the substances have an electron-transport property more excellent than a hole-transport property.

Examples of the electron-transport material include metal complexes having a quinoline ligand, a benzoquinoline ligand, an oxazole ligand, and a thiazole ligand; an oxadiazole derivative; a triazole derivative; a phenanthroline derivative; a pyridine derivative; and a bipyridine derivative. In addition, a π-electron deficient heteroaromatic compound such as a nitrogen-containing heteroaromatic compound can also be used.

Specifically, it is possible to use metal complexes such as Alq$_3$, tris(4-methyl-8-quinolinolato)aluminum (abbreviation: Almq$_3$), bis(10-hydroxybenzo[h]quinolinato)beryllium (abbreviation: BeBq$_2$), BAlq, Zn(BOX)$_2$, and bis[2-(2-hydroxyphenyl)benzothiazolato]zinc (abbreviation: Zn(BTZ)$_2$), heteroaromatic compounds such as 2-(4-biphenylyl)-5-(4-tent-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4'-tert-butylphenyl)-4-phenyl-5-(4"-biphenyl)-1,2,4-triazole (abbreviation: TAZ), 3-(4-tert-butylphenyl)-4-(4-ethylphenyl)-5-(4-biphenylyl)-1,2,4-triazole (abbreviation: p-EtTAZ), bathophenanthroline (abbreviation: Bphen), bathocuproine (abbreviation: BCP), and 4,4'-bis(5-methylbenzoxazol-2-yl)stilbene (abbreviation: BzOs), and quinoxaline derivatives and dibenzoquinoxaline derivatives such as 2-[3-(dibenzothiophen-4-yl)phenyl]dibenzo[f,h]quinoxaline (abbreviation: 2mDBTPDBq-II), 2-[3'-(dibenzothiophen-4-yl)biphenyl-3-yl]dibenzo[f,h]quinoxaline (abbreviation: 2mDBTBPDBq-II), 2-[4-(3,6-diphenyl-9H-carbazol-9-yl)phenyl]dibenzo[f,h]quinoxaline (abbreviation: 2CzPDBq-III), 7-[3-(dibenzothiophen-4-yl)phenyl]dibenzo[f,h]quinoxaline (abbreviation: 7mDBTPDBq-II), and 6-[3-(dibenzothiophen-4-yl)phenyl]dibenzo[f,h]quinoxaline (abbreviation: 6mDBTPDBq-II).

Alternatively, a high molecular compound such as poly(2,5-pyridinediyl) (abbreviation: PPy), poly[(9,9-dihexylfluorene-2,7-diyl)-co-(pyridine-3,5-diyl)] (abbreviation: PF- Py), or poly[(9,9-dioctylfluorene-2,7-diyl)-co-(2,2'-bipyridine-6,6'-diyl)] (abbreviation: PF-BPy) can be used.

Each of the electron-transport layers (214, 214a, and 214b) is not limited to a single layer, but may be a stack of two or more layers each containing any of the above substances.

In the light-emitting element in FIG. 2D, the electron-injection layer 215a is formed over the electron-transport layer 214a of the EL layer 203a by a vacuum evaporation method. Subsequently, the EL layer 203a and the charge generation layer 204 are formed, the components up to the electron-transport layer 214b of the EL layer 203b are formed and then, the electron-injection layer 215b is formed thereover by a vacuum evaporation method.

<<Electron-Injection Layer>>

The electron-injection layers (215, 215a, and 215b) each contains a substance having a high electron-injection property. For the electron-injection layers (215, 215a, and 215b), an alkali metal, an alkaline earth metal, or a compound thereof, such as lithium fluoride (LiF), cesium fluoride (CsF), calcium fluoride ($CaF_2$), or lithium oxide ($LiO_x$), can be used. Alternatively, a rare earth metal compound like erbium fluoride ($ErF_3$) can be used. Electride may also be used for the electron-injection layers (215, 215a, and 215b). Examples of the electride include a substance in which electrons are added at a high concentration to calcium oxide-aluminum oxide. Any of the substances for forming the electron-transport layers (214, 214a, and 214b), which are given above, can also be used.

Alternatively, the electron-injection layers (215, 215a, and 215b) may each be formed using a composite material in which an organic compound and an electron donor (donor) are mixed. The composite material is superior in an electron-injection property and an electron-transport property, since electrons are generated in the organic compound by the electron donor. The organic compound here is preferably a material excellent in transporting the generated electrons; specifically, for example, it is possible to use any of the above-described electron-transport materials (e.g., a metal complex and a heteroaromatic compound) that can be used for the electron-transport layers (214, 214a, and 214b). As the electron donor, a substance showing an electron-donating property with respect to the organic compound may be used. Specifically, an alkali metal, an alkaline earth metal, and a rare earth metal are preferable, and lithium, cesium, magnesium, calcium, erbium, ytterbium, and the like can be given. Further, an alkali metal oxide or an alkaline earth metal oxide is preferable, and for example, lithium oxide, calcium oxide, barium oxide, and the like can be given. Alternatively, a Lewis base such as magnesium oxide can also be used. An organic compound such as tetrathiafulvalene (abbreviation: TTF) can also be used.

In the case where light obtained from the light-emitting layer 213b is amplified in the light-emitting element in FIG. 2D, for example, the optical path length between the second electrode 202 and the light-emitting layer 213b is preferably less than one fourth of the wavelength λ of light emitted by the light-emitting layer 213b. In that case, the optical path length can be adjusted by changing the thickness of the electron-transport layer 214b or the electron-injection layer 215b.

<Charge Generation Layer>

In the light-emitting element in FIG. 2D, the charge generation layer 204 has a function of injecting electrons into the EL layer 203a and injecting holes into the EL layer 203b when a voltage is applied between the first electrode (anode) 201 and the second electrode (cathode) 202. The charge generation layer 204 may have either a structure in which an electron acceptor (acceptor) is added to a hole-transport material or a structure in which an electron donor (donor) is added to an electron-transport material. Alternatively, both of these structures may be stacked. Note that forming the charge generation layer 204 by using any of the above materials can suppress an increase in drive voltage caused by the stack of the EL layers.

In the case where the charge generation layer 204 has a structure in which an electron acceptor is added to a hole-transport material, any of the materials described in this embodiment can be used as the hole-transport material. Further, as the electron acceptor, 7,7,8,8-tetracyano-2,3,5,6-tetrafluoroquinodimethane (abbreviation: $F_4$-TCNQ), chloranil, and the like can be given. In addition, an oxide of metals that belong to Group 4 to Group 8 of the periodic table can be given. Specific examples are vanadium oxide, niobium oxide, tantalum oxide, chromium oxide, molybdenum oxide, tungsten oxide, manganese oxide, rhenium oxide, and the like.

In the case where the charge generation layer 204 has a structure in which an electron donor is added to an electron-transport material, any of the materials described in this embodiment can be used as the electron-transport material. As the electron donor, it is possible to use an alkali metal, an alkaline earth metal, a rare earth metal, metals belonging to Groups 2 and 13 of the periodic table, or an oxide or a carbonate thereof. Specifically, lithium (Li), cesium (Cs), magnesium (Mg), calcium (Ca), ytterbium (Yb), indium (In), lithium oxide, cesium carbonate, or the like is preferably used. Alternatively, an organic compound such as tetrathianaphthacene may be used as the electron donor.

<Substrate>

The light-emitting element described in this embodiment can be formed over any of a variety of substrates. Note that the type of a substrate is not limited to a certain type. Examples of the substrate include a semiconductor substrate (e.g., a single crystal substrate or a silicon substrate), an SOI substrate, a glass substrate, a quartz substrate, a plastic substrate, a metal substrate, a stainless steel substrate, a substrate including stainless steel foil, a tungsten substrate, a substrate including tungsten foil, a flexible substrate, an attachment film, paper including a fibrous material, and a base material film.

Examples of the glass substrate include a barium borosilicate glass substrate, an aluminoborosilicate glass substrate, and a soda lime glass substrate. Examples of a flexible substrate, an attachment film, and a base material film include plastics typified by polyethylene terephthalate (PET), polyethylene naphthalate (PEN), and polyether sulfone (PES); a synthetic resin such as acrylic; polypropylene; polyester; polyvinyl fluoride; polyvinyl chloride; polyamide; polyimide; aramid; epoxy; an inorganic vapor deposition film; and paper.

For fabrication of the light-emitting element described in this embodiment, a vacuum process such as an evaporation method or a solution process such as a spin coating method or an ink jet method can be used. When an evaporation method is used, a physical vapor deposition method (PVD method) such as a sputtering method, an ion plating method, an ion beam evaporation method, a molecular beam evaporation method, or a vacuum evaporation method, a chemical vapor deposition method (CVD method), or the like can be used. Specifically, the functional layers (the hole-injection layers (211a and 211b), the hole-transport layers (212a and 212b), the light-emitting layers (213a and 213b), the electron-transport layers (214a and 214b), the electron-injection layers (215a and 215b)) included in the EL layers and the charge generation layer 204 of the light-emitting element can be formed by an evaporation method (e.g., a vacuum evaporation method), a coating method (e.g., a dip coating method, a die coating method, a bar coating method, a spin coating method, or a spray coating method), a printing method (e.g., an ink-jet method, screen printing (stencil), offset printing (planography), flexography (relief printing), gravure printing, micro-contact printing, or a nanoimprinting method), or the like.

Note that materials that can be used for the functional layers (the hole-injection layers (211a and 211b), the hole-transport layers (212a and 212b), the light-emitting layers (213a and 213b), the electron-transport layers (214a and 214b), and the electron-injection layers (215a and 215b)) that are included in the EL layers (203a and 203b) and the charge generation layer 204 in the light-emitting element described in this embodiment are not limited to the above materials, and other materials can be used in combination as long as the functions of the layers are fulfilled. For example, a high molecular compound (e.g., an oligomer, a dendrimer, or a polymer), a middle molecular compound (a compound between a low molecular compound and a high molecular compound with a molecular weight of 400 to 4000), an inorganic compound (e.g., a quantum dot material), or the like can be used. The quantum dot may be a colloidal quantum dot, an alloyed quantum dot, a core-shell quantum dot, a core quantum dot, or the like.

Note that the structure described in this embodiment can be combined with any of the structures described in the other embodiments as appropriate.

(Embodiment 3)

Figure 3A:
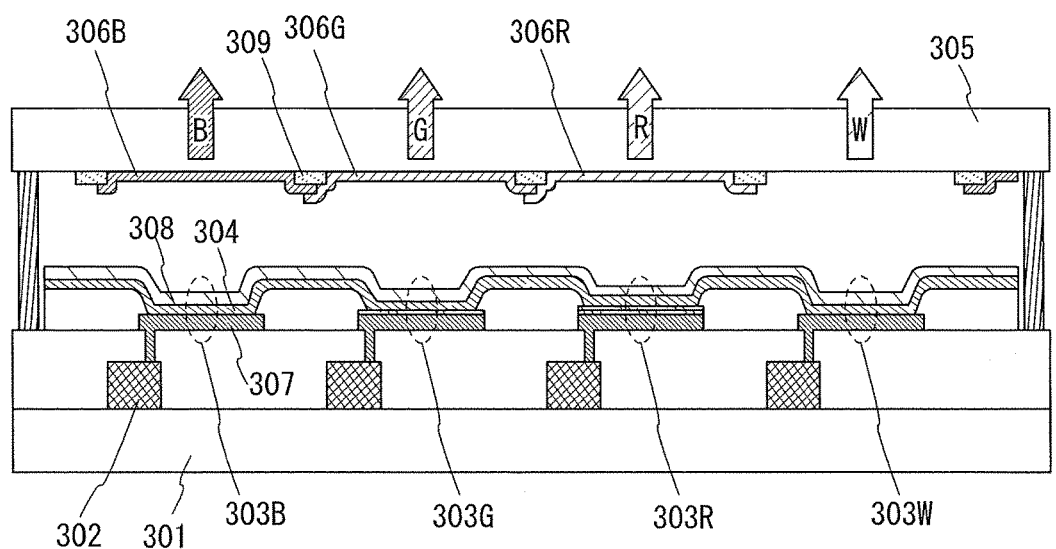
FIGS. 3A and 3B illustrate light-emitting devices.

In this embodiment, a light-emitting device that is one embodiment of the present invention will be described with reference to FIG. 3A. Note that a light-emitting device illustrated in FIG. 3A is an active matrix light-emitting device where transistors (FETs) 302 and light-emitting elements (303R, 303G, 303B, and 303W) over a first substrate 301 are electrically connected. The plurality of light-emitting elements (303R, 303G, 303B, and 303W) include a common EL layer 304 and each have a microcavity structure in which the optical path length between electrodes of the light-emitting element is adjusted in accordance with the emission color of the light-emitting element. The light-emitting device is a top-emission light-emitting device where light from the EL layer 304 is emitted through color filters (306R, 306G, and 306B) formed on the second substrate 305.

The light-emitting device illustrated in FIG. 3A is fabricated such that a first electrode 307 functions as a reflective electrode and a second electrode 308 functions as a semi-transmissive and semi-reflective electrode. Note that description in any of the other embodiments can be referred to as appropriate for electrode materials for the first electrode 307 and the second electrode 308.

Figure 3B:
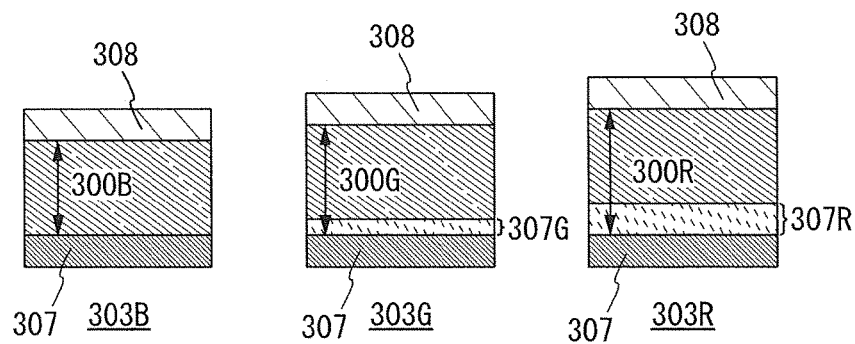

In the case where, for example, the light-emitting element 303R functions as a red light-emitting element, the light-emitting element 303G functions as a green light-emitting element, the light-emitting element 303B functions as a blue light-emitting element, and the light-emitting element 303W functions as a white light-emitting element in FIG. 3A, a gap between the first electrode 307 and the second electrode 308 in the light-emitting element 303R is adjusted to have an optical path length 300R; a gap between the first electrode 307 and the second electrode 308 in the light-emitting element 303G is adjusted to have an optical path length 300G; and a gap between the first electrode 307 and the second electrode 308 in the light-emitting element 303B is adjusted to have an optical path length 300B as illustrated in FIG. 3B. Note that optical adjustment can be performed in such a manner that a conductive layer 307R is stacked over the first electrode 307 in the light-emitting element 303R and a conductive layer 307G is stacked over the first electrode 307 in the light-emitting element 303G as illustrated in FIG. 3B.

The second substrate 305 is provided with the color filters (306R, 306G, and 306B). Note that the color filters are each a filter that transmits visible light in a specific wavelength range and blocks visible light in a specific wavelength range. Thus, as illustrated in FIG. 3A, the color filter 306R that transmits only light in the red wavelength range is provided in a position overlapping with the light-emitting element 303R, whereby red light emission can be obtained from the light-emitting element 303R. Furthermore, the color filter 306G that transmits only light in the green wavelength range is provided in a position overlapping with the light-emitting element 303G, whereby green light emission can be obtained from the light-emitting element 303G. Furthermore, the color filter 306B that transmits only light in the blue wavelength range is provided in a position overlapping with the light-emitting element 303B, whereby blue light emission can be obtained from the light-emitting element 303B. Note that the light-emitting element 303W can exhibit white light emission without a color filter. Note that a black layer (black matrix) 309 may be provided at an end portion of each color filter. The color filters (306R, 306G, and 306B) and the black layer 309 may be covered with an overcoat layer formed using a transparent material.

Although the light-emitting device in FIG. 3A has a structure in which light is extracted from the second substrate 305 side (top emission structure), a structure may be employed in which light is extracted from the first substrate 301 side where the FETs 302 are formed (bottom emission structure). Note that in the light-emitting device having a top emission structure, a light-blocking substrate or a light-transmitting substrate can be used as the first substrate 301, whereas in a light-emitting device having a bottom emission structure, a light-transmitting substrate needs to be used as the first substrate 301.

In FIG. 3A, the light-emitting elements are the red light-emitting element, the green light-emitting element, the blue light-emitting element, and the white light-emitting element; however, the light-emitting elements of one embodiment of the present invention are not limited to the above, and a yellow light-emitting element or an orange light-emitting element may be provided. Note that description in any of the other embodiments can be referred to as appropriate for materials that are used for the EL layer (a light-emitting layer, a hole-injection layer, a hole-transport layer, an electron-transport layer, an electron-injection layer, a charge generation layer, and the like) to fabricate each of the light-emitting elements. In that case, a color filter needs to be appropriately selected in accordance with the emission color of the light-emitting element.

With the above structure, the light-emitting device including the light-emitting elements that exhibit a plurality of emission colors can be fabricated.

Note that the structure described in this embodiment can be combined with any of the structures described in the other embodiments as appropriate.

(Embodiment 4)

In this embodiment, a light-emitting device that is one embodiment of the present invention will be described.

The use of an element structure of a light-emitting element of one embodiment of the present invention allows fabrication of an active matrix light-emitting device or a passive matrix light-emitting device. Note that an active matrix light-emitting device has a structure including a combination of a light-emitting element and a transistor (FET). Thus, each of a passive matrix light-emitting device and an active matrix light-emitting device is one embodiment of the present invention. Note that any of the light-emitting elements described in other embodiments can be used in the light-emitting device described in this embodiment.

In this embodiment, an active matrix light-emitting device will be described with reference to FIGS. 4A and 4B.

Figure 4A:
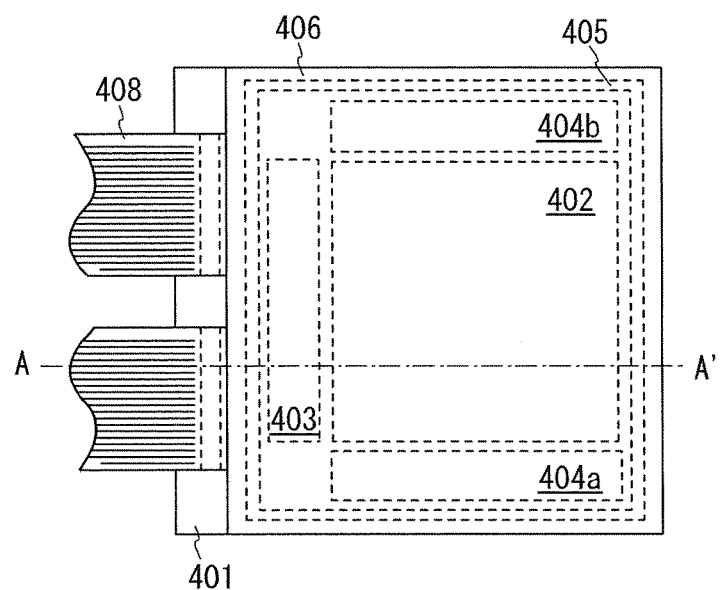
FIGS. 4A and 4B illustrate a light-emitting device.
Figure 4B:
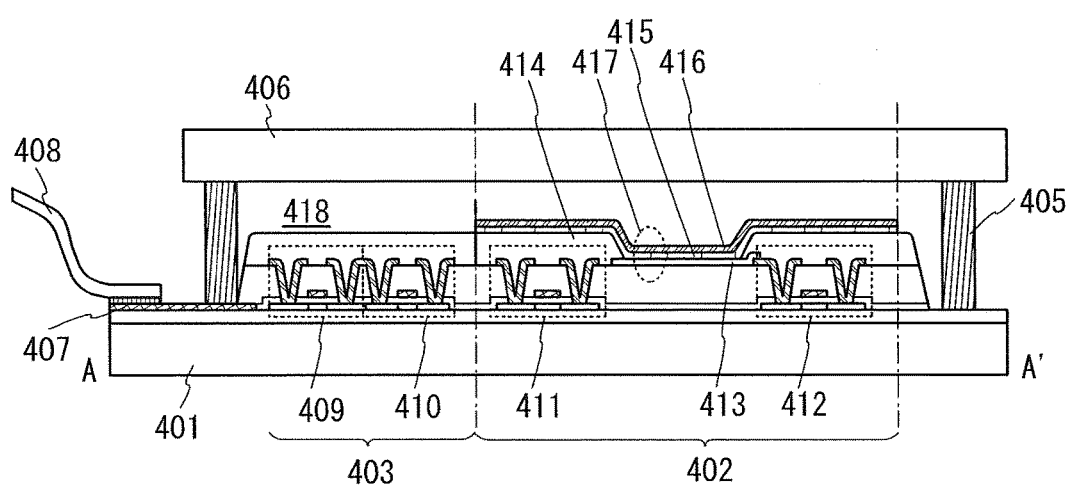

FIG. 4A is a top view illustrating a light-emitting device and FIG. 4B is a cross-sectional view taken along chain line A-A' in FIG. 4A. The active matrix light-emitting device includes a pixel portion 402, a driver circuit portion (source line driver circuit) 403, and driver circuit portions (gate line driver circuits) (404a and 404b) that are provided over a first substrate 401. The pixel portion 402 and the driver circuit portions (403, 404a, and 404b) are sealed between the first substrate 401 and a second substrate 406 with a sealant 405.

A lead wiring 407 is provided over the first substrate 401. The lead wiring 407 is connected to an FPC 408 that is an external input terminal. Note that the FPC 408 transmits a signal (e.g., a video signal, a clock signal, a start signal, or a reset signal) or a potential from the outside to the driver circuit portions (403, 404a, and 404b). The FPC 408 may be provided with a printed wiring board (PWB). Note that the light-emitting device provided with an FPC or a PWB is included in the category of a light-emitting device.

FIG. 4B illustrates a cross-sectional structure of the light-emitting device.

The pixel portion 402 includes a plurality of pixels each of which includes an FET (switching FET) 411, an FET (current control FET) 412, and a first electrode 413 electrically connected to the FET 412. Note that the number of FETs included in each pixel is not particularly limited and can be set appropriately.

As the FETs 409, 410, 411, and 412, for example, a staggered transistor or an inverted staggered transistor can be used without particular limitation. Furthermore, a top-gate transistor, a bottom-gate transistor, or the like may be used.

Note that there is no particular limitation on the crystallinity of semiconductors that can be used for the FETs 409, 410, 411, and 412, and an amorphous semiconductor or a semiconductor having crystallinity (a microcrystalline semiconductor, a polycrystalline semiconductor, a single crystal semiconductor, or a semiconductor partly including crystal regions) may be used. A semiconductor having crystallinity is preferably used, in which case deterioration of the transistor characteristics can be suppressed.

As the semiconductors, a Group 14 element, a compound semiconductor, an oxide semiconductor, an organic semiconductor, or the like can be used, for example. Typically, a semiconductor containing silicon, a semiconductor containing gallium arsenide, an oxide semiconductor containing indium, or the like can be used.

The driver circuit portion 403 includes the FET 409 and the FET 410. The FET 409 and the FET 410 may be formed with a circuit including transistors having the same conductivity type (either n-channel transistors or p-channel transistors) or a CMOS circuit including an n-channel transistor and a p-channel transistor. Furthermore, a driver circuit may be provided outside.

An end portion of the first electrode 413 is covered with an insulator 414. The insulator 414 can be formed using an organic compound such as a negative photosensitive resin or a positive photosensitive resin (acrylic resin), or an inorganic compound such as silicon oxide, silicon oxynitride, or silicon nitride. The insulator 414 preferably has a curved surface with curvature at an upper end portion or a lower end portion thereof. In that case, favorable coverage with a film formed over the insulator 414 can be obtained.

An EL layer 415 and a second electrode 416 are stacked over the first electrode 413. The EL layer 415 includes a light-emitting layer, a hole-injection layer, a hole-transport layer, an electron-transport layer, an electron-injection layer, a charge generation layer, and the like.

The structure and materials described in any of the other embodiments can be used for the structure of the light-emitting element 417 described in this embodiment. Although not illustrated, the second electrode 416 is electrically connected to the FPC 408 that is an external input terminal.

Although the cross-sectional view in FIG. 4B illustrates only one light-emitting element 417, a plurality of light-emitting elements are arranged in a matrix in the pixel portion 402. Light-emitting elements that emit light of three kinds of colors (R, G, and B) are selectively faulted in the pixel portion 402, whereby a light-emitting device capable of full color display can be obtained. In addition to the light-emitting elements that emit light of three kinds of colors (R, G, and B), for example, light-emitting elements that emit light of white (W), yellow (Y), magenta (M), cyan (C), and the like may be formed. For example, the light-emitting elements that emit light of some of the above colors are used in combination with the light-emitting elements that emit light of three kinds of colors (R, G, and B), whereby effects such as an improvement in color purity and a reduction in power consumption can be achieved. Alternatively, a light-emitting device which is capable of full color display may be fabricated by a combination with color filters.

By bonding the second substrate 406 and the first substrate 401 to each other with the sealant 405, the FETs (409, 410, 411, and 412) and the light-emitting element 417 over the first substrate 401 are provided in a space 418 surrounded by the first substrate 401, the second substrate 406, and the sealant 405. Note that the space 418 may be filled with an inert gas (e.g., nitrogen or argon) or an organic substance (including the sealant 405).

An epoxy-based resin, glass frit, or the like can be used as the sealant 405. It is preferable to use a material that transmits as little moisture and oxygen as possible as the sealant 405. As the second substrate 406, a substrate that can be used as the first substrate 401 can be similarly used. Thus, any of the various substrates described in the other embodiments can be appropriately used. As the substrate, a glass substrate, a quartz substrate, or a plastic substrate made of fiber reinforced plastic (FRP), polyvinyl fluoride (PVF), polyester, acrylic, or the like can be used. In the case where glass frit is used as the sealant, the first substrate 401 and the second substrate 406 are preferably glass substrates in terms of adhesion.

With the above structure, the active matrix light-emitting device can be fabricated.

In the case where the active matrix light-emitting device is provided over a flexible substrate, the FETs and the light-emitting element may be directly formed over the flexible substrate; alternatively, the FETs and the light-emitting element may be formed over a substrate provided with a separation layer and then separated at the separation layer by application of heat, force, laser, or the like to be transferred to a flexible substrate. For the separation layer, a stack including inorganic films such as a tungsten film and a silicon oxide film, or an organic resin film of polyimide or the like can be used, for example. Examples of the flexible substrate include, in addition to the substrates over which a transistor can be formed, a paper substrate, a cellophane substrate, an aramid film substrate, a polyimide film substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), or the like), a leather substrate, and a rubber substrate. With the use of any of these substrates, an increase in durability or heat resistance and a reduction in weight or thickness can be achieved.

Note that the structure described in this embodiment can be combined with any of the structures described in the other embodiments as appropriate.

(Embodiment 5)

In this embodiment, examples of a variety of electronic devices and an automobile manufactured using a light-emitting device of one embodiment of the present invention will be described.

Examples of the electronic device including the light-emitting device are television devices (also referred to as TV or television receivers), monitors for computers and the like, cameras such as digital cameras and digital video cameras, digital photo frames, cellular phones (also referred to as mobile phones or portable telephone devices), portable game machines, portable information terminals, audio playback devices, large game machines such as pachinko machines, and the like. Specific examples of the electronic devices are illustrated in FIGS. 5A, 5B, 5C, 5D, 5D'-1, and 5D'-2 and FIGS. 6A to 6C.

Figure 5A:
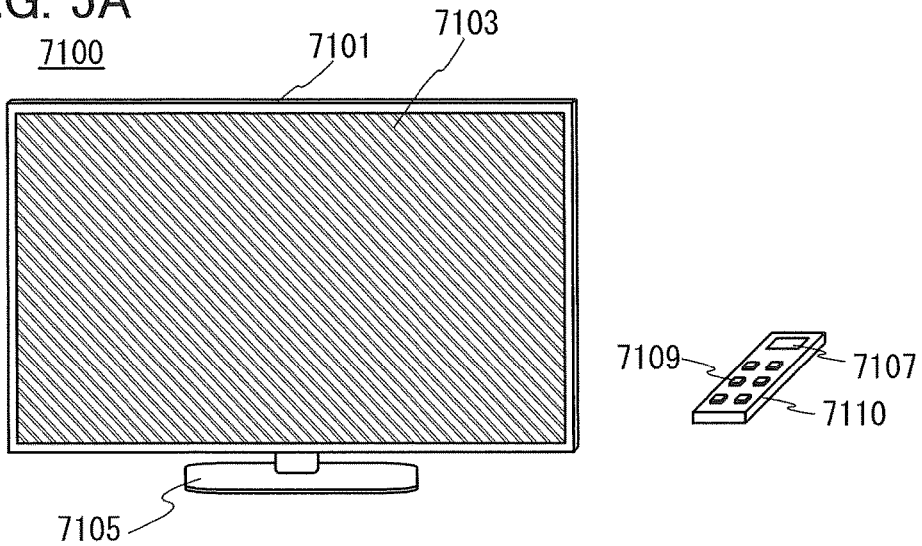
FIGS. 5A, 5B, 5C, 5D, 5D'-1, and 5D'-2 illustrate electronic devices.

FIG. 5A illustrates an example of a television device. In a television device 7100, a display portion 7103 is incorporated in a housing 7101. The display portion 7103 can display images and may be a touch panel (input/output device) including a touch sensor (input device). Note that the light-emitting device of one embodiment of the present invention can be used for the display portion 7103. In addition, here, the housing 7101 is supported by a stand 7105.

The television device 7100 can be operated with an operation switch of the housing 7101 or a separate remote controller 7110. With operation keys 7109 of the remote controller 7110, channels and volume can be controlled and images displayed on the display portion 7103 can be controlled. Furthermore, the remote controller 7110 may be provided with a display portion 7107 for displaying data output from the remote controller 7110.

Note that the television device 7100 is provided with a receiver, a modem, and the like. With the use of the receiver, general television broadcasts can be received. Moreover, when the television device is connected to a communication network with or without wires via the modem, one-way (from a sender to a receiver) or two-way (between a sender and a receiver or between receivers) information communication can be performed.

Figure 5B:
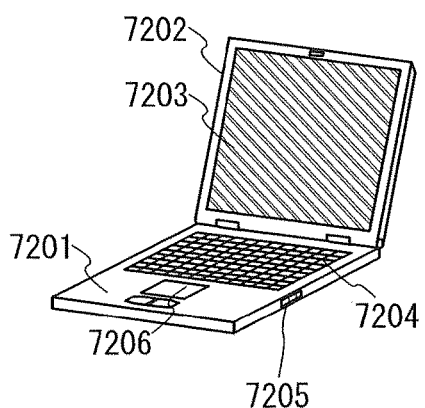

FIG. 5B illustrates a computer, which includes a main body 7201, a housing 7202, a display portion 7203, a keyboard 7204, an external connection port 7205, a pointing device 7206, and the like. Note that this computer can be manufactured using the light-emitting device of one embodiment of the present invention for the display portion 7203. The display portion 7203 may be a touch panel (input/output device) including a touch sensor (input device).

Figure 5C:
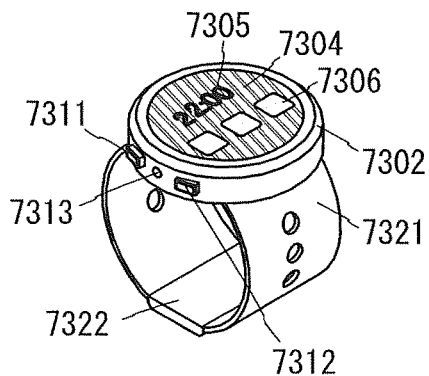

FIG. 5C illustrates a smart watch, which includes a housing 7302, a display portion 7304, operation buttons 7311 and 7312, a connection terminal 7313, a band 7321, a clasp 7322, and the like.

The display portion 7304 mounted in the housing 7302 serving as a bezel includes a non-rectangular display region. The display portion 7304 can display an icon 7305 indicating time, another icon 7306, and the like. The display portion 7304 may be a touch panel (input/output device) including a touch sensor (input device).

The smart watch illustrated in FIG. 5C can have a variety of functions, such as a function of displaying a variety of information (e.g., a still image, a moving image, and a text image) on a display portion, a touch panel function, a function of displaying a calendar, date, time, and the like, a function of controlling processing with a variety of software (programs), a wireless communication function, a function of being connected to a variety of computer networks with a wireless communication function, a function of transmitting and receiving a variety of data with a wireless communication function, and a function of reading a program or data stored in a recording medium and displaying the program or data on a display portion.

The housing 7302 can include a speaker, a sensor (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), a microphone, and the like. Note that the smart watch can be manufactured using the light-emitting device for the display portion 7304.

Figure 5D:
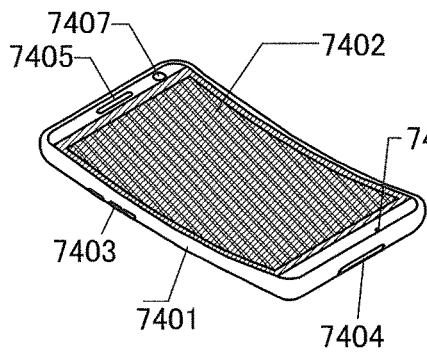
Figure 5D:
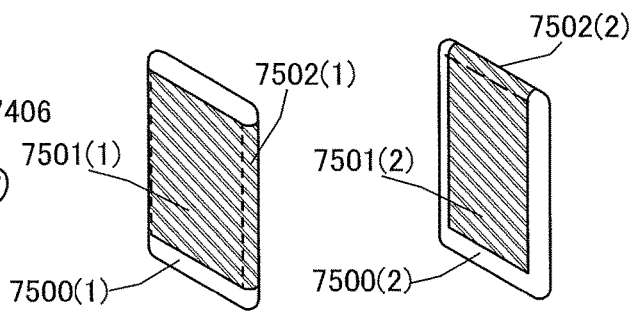

FIG. 5D illustrates an example of a cellular phone (e.g., smartphone). A cellular phone 7400 includes a housing 7401 provided with a display portion 7402, a microphone 7406, a speaker 7405, a camera 7407, an external connection portion 7404, an operation button 7403, and the like. In the case where a light-emitting device is manufactured by forming the light-emitting element of one embodiment of the present invention over a flexible substrate, the light-emitting device can be used for the display portion 7402 having a curved surface as illustrated in FIG. 5D.

When the display portion 7402 of the cellular phone 7400 illustrated in FIG. 5D is touched with a finger or the like, data can be input to the cellular phone 7400. In addition, operations such as making a call and composing e-mail can be performed by touch on the display portion 7402 with a finger or the like.

There are mainly three screen modes of the display portion 7402. The first mode is a display mode mainly for displaying an image. The second mode is an input mode mainly for inputting data such as characters. The third mode is a display-and-input mode in which two modes of the display mode and the input mode are combined.

For example, in the case of making a call or composing e-mail, a character input mode mainly for inputting characters is selected for the display portion 7402 so that characters displayed on the screen can be input. In this case, it is preferable to display a keyboard or number buttons on almost the entire screen of the display portion 7402.

When a detection device such as a gyroscope sensor or an acceleration sensor is provided inside the cellular phone 7400, display on the screen of the display portion 7402 can be automatically changed by determining the orientation of the cellular phone 7400 (whether the cellular phone is placed horizontally or vertically for a landscape mode or a portrait mode).

The screen modes are changed by touch on the display portion 7402 or operation with the operation button 7403 of the housing 7401. The screen modes can be switched depending on the kind of images displayed on the display portion 7402. For example, when a signal of an image displayed on the display portion is a signal of moving image data, the screen mode is switched to the display mode. When the signal is a signal of text data, the screen mode is switched to the input mode.

Moreover, in the input mode, if a signal detected by an optical sensor in the display portion 7402 is detected and the input by touch on the display portion 7402 is not performed for a certain period, the screen mode may be controlled so as to be changed from the input mode to the display mode.

The display portion 7402 may function as an image sensor. For example, an image of a palm print, a fingerprint, or the like is taken by touch on the display portion 7402 with the palm or the finger, whereby personal authentication can be performed. In addition, by providing a backlight or a sensing light source that emits near-infrared light in the display portion, an image of a finger vein, a palm vein, or the like can be taken.

The light-emitting device can be used for a cellular phone having a structure illustrated in FIG. 5D'-1 or FIG. 5D'-2, which is another structure of the cellular phone (e.g., smartphone).

Note that in the case of the structure illustrated in FIG. 5D'-1 or FIG. 5D'-2, text data, image data, or the like can be displayed on second screens 7502(1) and 7502(2) of housings 7500(1) and 7500(2) as well as first screens 7501(1) and 7501(2). Such a structure enables a user to easily see text data, image data, or the like displayed on the second screens 7502(1) and 7502(2) while the cellular phone is placed in the user's breast pocket.

Figure 6A:
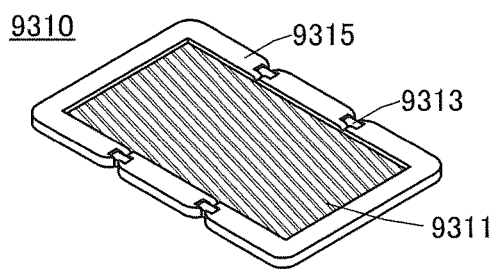
FIGS. 6A to 6C illustrate an electronic device.
Figure 6B:
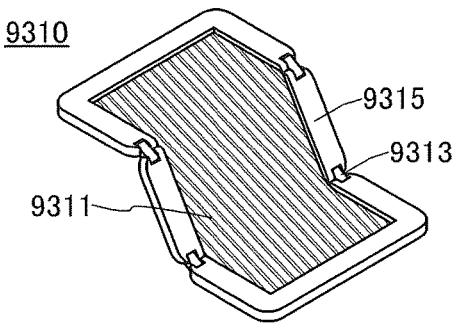
Figure 6C:
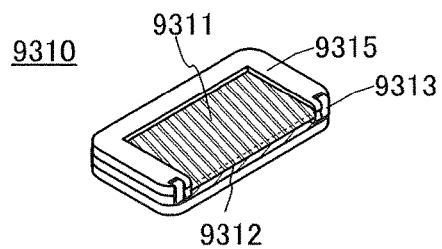

Another electronic device including a light-emitting device is a foldable portable information terminal illustrated in FIGS. 6A to 6C. FIG. 6A illustrates a portable information terminal 9310 which is opened. FIG. 6B illustrates the portable information terminal 9310 which is being opened or being folded. FIG. 6C illustrates the portable information terminal 9310 which is folded. The portable information terminal 9310 is highly portable when folded. The portable information terminal 9310 is highly browsable when opened because of a seamless large display region.

A display portion 9311 is supported by three housings 9315 joined together by hinges 9313. Note that the display portion 9311 may be a touch panel (input/output device) including a touch sensor (input device). By bending the display portion 9311 at a connection portion between two housings 9315 with the use of the hinges 9313, the portable information terminal 9310 can be reversibly changed in shape from an opened state to a folded state. The light-emitting device of one embodiment of the present invention can be used for the display portion 9311. A display region 9312 in the display portion 9311 is a display region that is positioned at a side surface of the portable information terminal 9310 which is folded. On the display region 9312, information icons, file shortcuts of frequently used applications or programs, and the like can be displayed, and confirmation of information and start of application and the like can be smoothly performed.

Figure 7A:
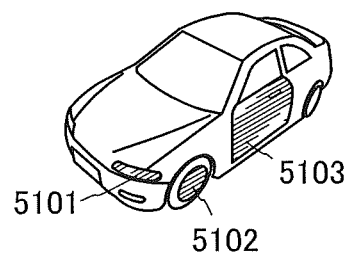
FIGS. 7A and 7B illustrate an automobile.
Figure 7B:
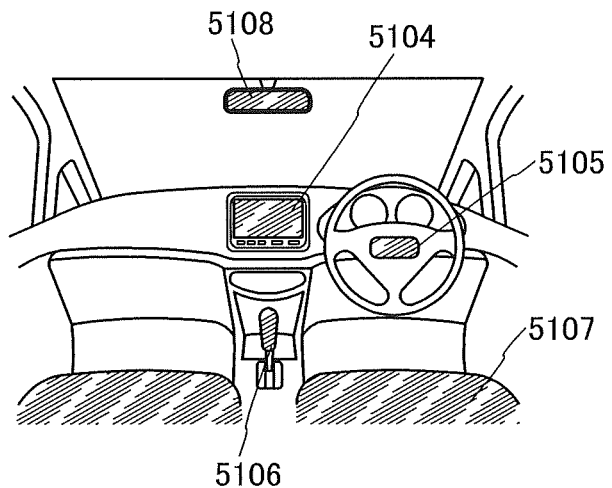

FIGS. 7A and 7B illustrate an automobile including a light-emitting device. The light-emitting device can be incorporated in the automobile, and specifically, can be included in lights 5101 (including lights of the rear part of the car), a wheel cover 5102, a part or whole of a door 5103, or the like on the outer side of the automobile which is illustrated in FIG. 7A. The light-emitting device can also be included in a display portion 5104, a steering wheel 5105, a gear lever 5106, a seat 5107, an inner rearview mirror 5108, or the like on the inner side of the automobile which is illustrated in FIG. 7B, or in a part of a glass window.

As described above, the electronic devices and the automobile can be obtained using the light-emitting device of one embodiment of the present invention. Note that the light-emitting device can be used for electronic devices and automobiles in a variety of fields without being limited to those described in this embodiment.

Note that the structures described in this embodiment can be combined with any of the structures described in the other embodiments as appropriate.

(Embodiment 6)

In this embodiment, the structures of lighting devices fabricated using the light-emitting element of one embodiment of the present invention will be described with reference to FIGS. 8A to 8D.

Figure 8A:
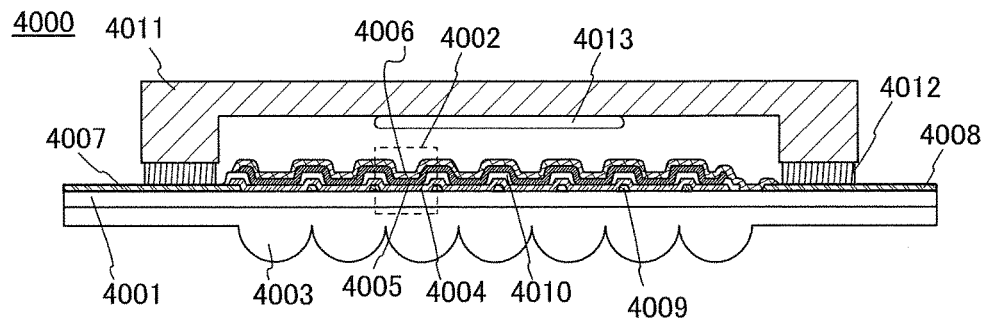
FIGS. 8A to 8D illustrate lighting devices.
Figure 8B:
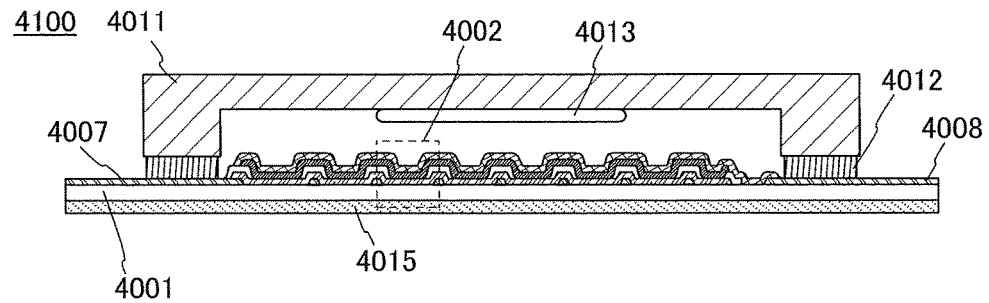
Figure 8C:
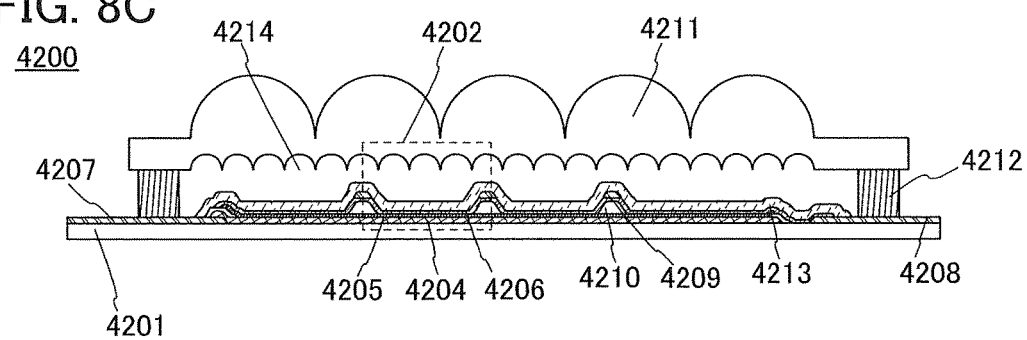
Figure 8D:
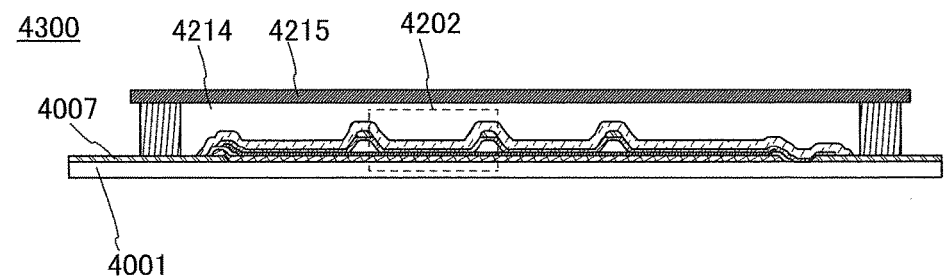

FIGS. 8A to 8D are examples of cross-sectional views of lighting devices. FIGS. 8A and 8B illustrate bottom-emission lighting devices in which light is extracted from the substrate side, and FIGS. 8C and 8D illustrate top-emission lighting devices in which light is extracted from the sealing substrate side.

A lighting device 4000 illustrated in FIG. 8A includes a light-emitting element 4002 over a substrate 4001. In addition, the lighting device 4000 includes a substrate 4003 with unevenness on the outside of the substrate 4001. The light-emitting element 4002 includes a first electrode 4004, an EL layer 4005, and a second electrode 4006.

The first electrode 4004 is electrically connected to an electrode 4007, and the second electrode 4006 is electrically connected to an electrode 4008. In addition, an auxiliary wiring 4009 electrically connected to the first electrode 4004 may be provided. Note that an insulating layer 4010 is formed over the auxiliary wiring 4009.

The substrate 4001 and a sealing substrate 4011 are bonded to each other with a sealant 4012. A desiccant 4013 is preferably provided between the sealing substrate 4011 and the light-emitting element 4002. The substrate 4003 has the unevenness illustrated in FIG. 8A, whereby the extraction efficiency of light emitted from the light-emitting element 4002 can be increased.

Instead of the substrate 4003, a diffusion plate 4015 may be provided on the outside of the substrate 4001 as in a lighting device 4100 illustrated in FIG. 8B.

A lighting device 4200 illustrated in FIG. 8C includes a light-emitting element 4202 over a substrate 4201. The light-emitting element 4202 includes a first electrode 4204, an EL layer 4205, and a second electrode 4206.

The first electrode 4204 is electrically connected to an electrode 4207, and the second electrode 4206 is electrically connected to an electrode 4208. An auxiliary wiring 4209 electrically connected to the second electrode 4206 may be provided. An insulating layer 4210 may be provided under the auxiliary wiring 4209.

The substrate 4201 and a sealing substrate 4211 with unevenness are bonded to each other with a sealant 4212. A barrier film 4213 and a planarization film 4214 may be provided between the sealing substrate 4211 and the light-emitting element 4202. The sealing substrate 4211 has the unevenness illustrated in FIG. 8C, whereby the extraction efficiency of light emitted from the light-emitting element 4202 can be increased.

Instead of the sealing substrate 4211, a diffusion plate 4215 may be provided over the light-emitting element 4202 as in a lighting device 4300 illustrated in FIG. 8D.

As described in this embodiment, the use of the light-emitting element or light-emitting device of one embodiment of the present invention allows fabrication of a lighting device with low power consumption.

Note that the structures described in this embodiment can be combined with any of the structures described in the other embodiments as appropriate.

(Embodiment 7)

Figure 9:
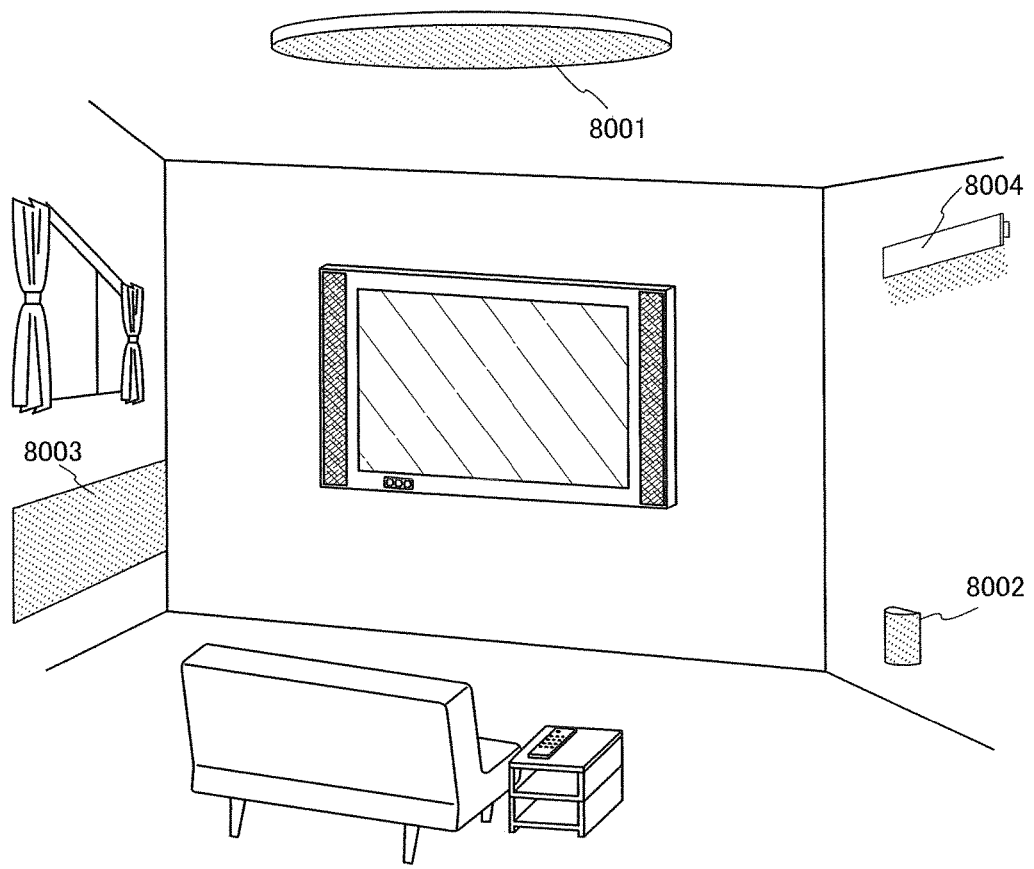
FIG. 9 illustrates lighting devices.

In this embodiment, application examples of a lighting device fabricated using the light-emitting element of one embodiment of the present invention will be described with reference to FIG. 9.

A ceiling light 8001 can be used as an indoor lighting device. Examples of the ceiling light 8001 include a direct-mount light and an embedded light. Besides, application to a cord pendant light (light that is suspended from a ceiling by a cord) is also possible.

A foot light 8002 lights a floor so that safety on the floor can be improved. For example, it can be effectively used in a bed room, on a staircase, or on a passage. In that case, the size or shape of the foot light can be changed according to the area or structure of a room.

A sheet-like lighting 8003 is a thin sheet-like lighting device. The sheet-like lighting, which is used while being attached to a wall surface, is space-saving and thus can be used for a wide variety of uses. Furthermore, the area of the sheet-like lighting can be increased. The sheet-like lighting can also be used on a wall or housing having a curved surface.

In addition, a lighting device 8004 in which the direction of light from a light source is controlled to be only a desired direction can be used.

Besides the above examples, when the light-emitting device is used as part of furniture in a room, a lighting device that functions as the furniture can be obtained.

As described above, a variety of lighting devices that include the light-emitting device can be obtained. Note that these lighting devices are also embodiments of the present invention.

The structures described in this embodiment can be combined with any of the structures described in the other embodiments as appropriate.

(Embodiment 8)

In this embodiment, touch panels including the light-emitting element of one embodiment of the present invention or the light-emitting device of one embodiment of the present invention will be described with reference to FIGS. 10A and 10B, FIGS. 11A and 11B, FIGS. 12A and 12B, FIGS. 13A and 13B, and FIG. 14.

Figure 10A:
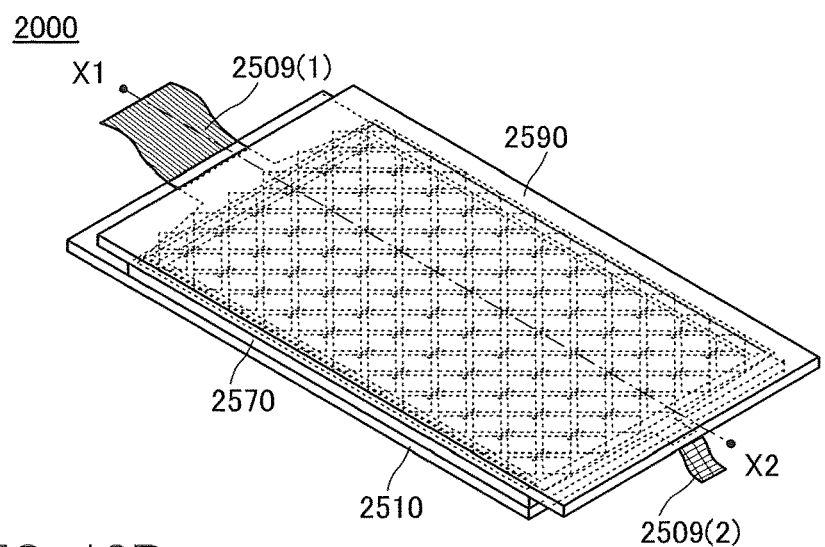
FIGS. 10A and 10B illustrate an example of a touch panel.
Figure 10B:
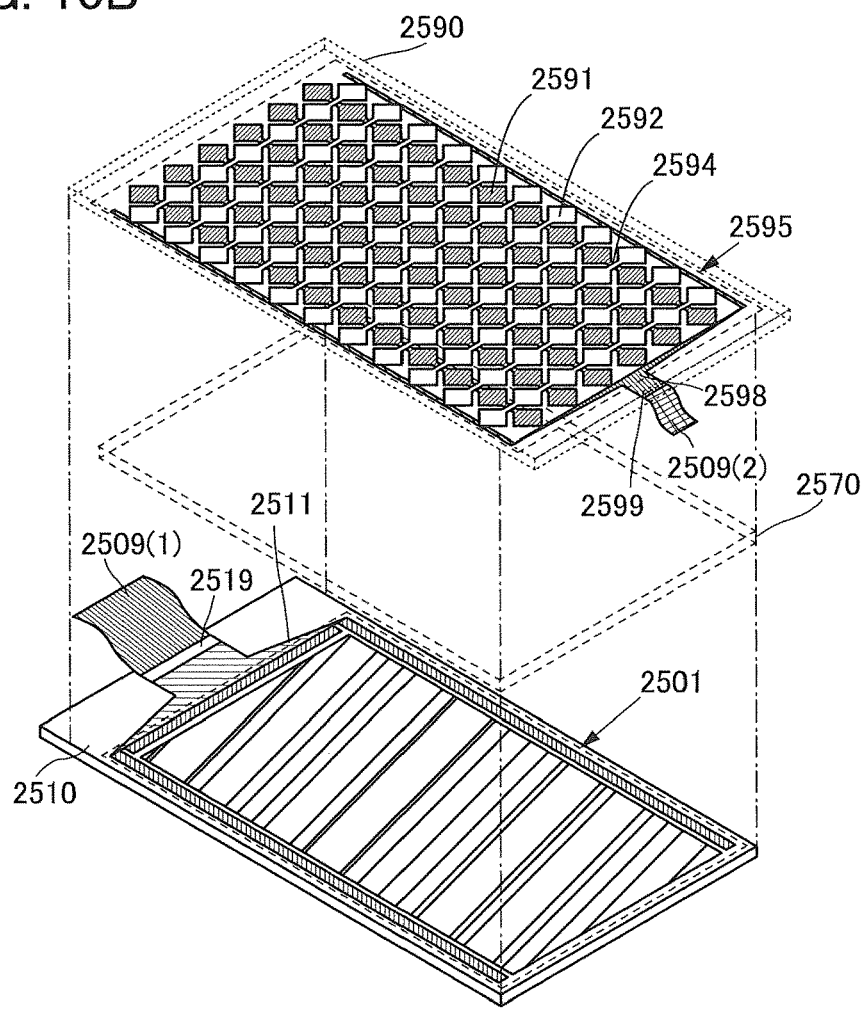

FIGS. 10A and 10B are perspective views of a touch panel 2000. Note that FIGS. 10A and 10B illustrate only main components of the touch panel 2000 for simplicity.

The touch panel 2000 includes a display panel 2501 and a touch sensor 2595 (see FIG. 10B). The touch panel 2000 includes a substrate 2510, a substrate 2570, and a substrate 2590.

The display panel 2501 includes, over the substrate 2510, a plurality of pixels and a plurality of wirings 2511 through which signals are supplied to the pixels. The plurality of wirings 2511 are led to a peripheral portion of the substrate 2510, and parts of the plurality of wirings 2511 form a terminal 2519. The terminal 2519 is electrically connected to an FPC 2509(1).

The substrate 2590 includes the touch sensor 2595 and a plurality of wirings 2598 electrically connected to the touch sensor 2595. The plurality of wirings 2598 are led to a peripheral portion of the substrate 2590, and parts of the plurality of wirings 2598 form a terminal 2599. The terminal 2599 is electrically connected to an FPC 2509(2). Note that in FIG. 10B, electrodes, wirings, and the like of the touch sensor 2595 provided on the back side of the substrate 2590 (the side facing the substrate 2570) are indicated by solid lines for clarity.

As the touch sensor 2595, a capacitive touch sensor can be used, for example. Examples of the capacitive touch sensor include a surface capacitive touch sensor, a projected capacitive touch sensor, and the like.

Examples of the projected capacitive touch sensor are a self-capacitive touch sensor, a mutual capacitive touch sensor, and the like, which differ mainly in the driving method. The use of a mutual capacitive type is preferable because multiple points can be sensed simultaneously.

First, an example of using a projected capacitive touch sensor will be described below with reference to FIG. 10B. Note that in the case of a projected capacitive touch sensor, a variety of sensors that can sense proximity or touch of a sensing target such as a finger can be used.

The projected capacitive touch sensor 2595 includes electrodes 2591 and electrodes 2592. The electrodes 2591 are electrically connected to any of the plurality of wirings 2598, and the electrodes 2592 are electrically connected to any of the other wirings 2598. The electrodes 2592 each have a shape of a plurality of quadrangles arranged in one direction with one corner of a quadrangle connected to one corner of another quadrangle with a wiring 2594, as illustrated in FIGS. 10A and 10B. In the same manner, the electrodes 2591 each have a shape of a plurality of quadrangles arranged with one corner of a quadrangle connected to one corner of another quadrangle; however, the direction in which the electrodes 2591 are connected is a direction crossing the direction in which the electrodes 2592 are connected. Note that the direction in which the electrodes 2591 are connected and the direction in which the electrodes 2592 are connected are not necessarily perpendicular to each other, and the electrodes 2591 may be arranged to intersect with the electrodes 2592 at an angle greater than 0° and less than 90°.

The intersecting area of the electrode 2592 and the wiring 2594 is preferably as small as possible. Such a structure allows a reduction in the area of a region where the electrodes are not provided, reducing variation in transmittance. As a result, variation in luminance of light passing through the touch sensor 2595 can be reduced.

Note that the shapes of the electrodes 2591 and the electrodes 2592 are not limited thereto and can be any of a variety of shapes. For example, the plurality of electrodes 2591 may be provided so that a space between the electrodes 2591 is reduced as much as possible, and the plurality of electrodes 2592 may be provided with an insulating layer located between the electrodes 2591 and 2592. In this case, it is preferable to provide, between two adjacent electrodes 2592, a dummy electrode electrically insulated from these electrodes because the area of regions having different transmittances can be reduced.

Figure 11A:
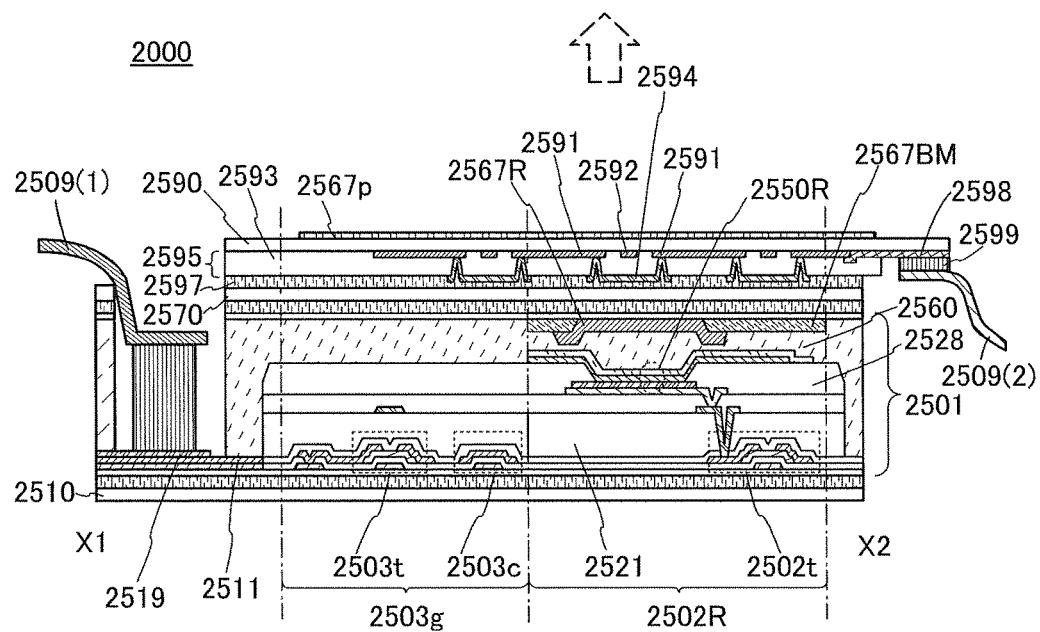
FIGS. 11A and 11B illustrate an example of a touch panel.
Figure 11B:
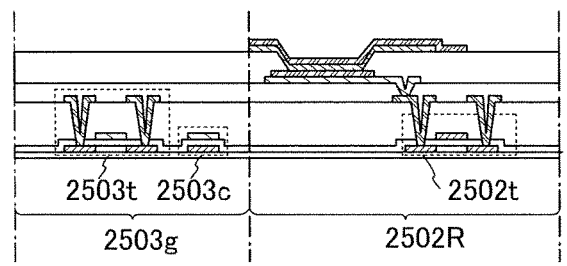

Next, the touch panel 2000 will be described in detail with reference to FIGS. 11A and 11B. FIGS. 11A and 11B correspond to cross-sectional views taken along dashed-dotted line X1-X2 in FIG. 10A.

The touch panel 2000 includes the touch sensor 2595 and the display panel 2501.

The touch sensor 2595 includes the electrodes 2591 and the electrodes 2592 provided in a staggered arrangement in contact with the substrate 2590, an insulating layer 2593 covering the electrodes 2591 and the electrodes 2592, and the wiring 2594 that electrically connects the adjacent electrodes 2591 to each other. Between the adjacent electrodes 2591, the electrode 2592 is provided.

The electrodes 2591 and the electrodes 2592 can be formed using a light-transmitting conductive material. As a light-transmitting conductive material, a conductive oxide such as indium oxide, indium tin oxide, indium zinc oxide, zinc oxide, or zinc oxide to which gallium is added can be used. A graphene compound may be used as well. When a graphene compound is used, it can be formed, for example, by reducing a graphene oxide film. As a reducing method, a method with application of heat, a method with laser irradiation, or the like can be employed.

For example, the electrodes 2591 and 2592 can be formed by depositing a light-transmitting conductive material on the substrate 2590 by a sputtering method and then removing an unneeded portion by any of various patterning techniques such as photolithography.

Examples of a material for the insulating layer 2593 include a resin such as an acrylic resin or an epoxy resin, a resin having a siloxane bond, and an inorganic insulating material such as silicon oxide, silicon oxynitride, or aluminum oxide.

The adjacent electrodes 2591 are electrically connected to each other with the wiring 2594 formed in part of the insulating layer 2593. Note that a material for the wiring 2594 preferably has higher conductivity than materials for the electrodes 2591 and 2592 to reduce electrical resistance.

The wiring 2598 is electrically connected to any of the electrodes 2591 and 2592. Part of the wiring 2598 functions as a terminal. For the wiring 2598, a metal material such as aluminum, gold, platinum, silver, nickel, titanium, tungsten, chromium, molybdenum, iron, cobalt, copper, or palladium or an alloy material containing any of these metal materials can be used.

Through the terminal 2599, the wiring 2598 and the FPC 2509(2) are electrically connected to each other. The terminal 2599 can be formed using any of various kinds of anisotropic conductive films (ACF), anisotropic conductive pastes (ACP), and the like.

An adhesive layer 2597 is provided in contact with the wiring 2594. That is, the touch sensor 2595 is attached to the display panel 2501 so that they overlap with each other with the adhesive layer 2597 provided therebetween. Note that the substrate 2570 as illustrated in FIG. 11A may be provided over the surface of the display panel 2501 that is in contact with the adhesive layer 2597; however, the substrate 2570 is not always needed.

The adhesive layer 2597 has a light-transmitting property. For example, a thermosetting resin or an ultraviolet curable resin can be used; specifically, a resin such as an acrylic-based resin, a urethane-based resin, an epoxy-based resin, or a siloxane-based resin can be used.

The display panel 2501 in FIG. 11A includes, between the substrate 2510 and the substrate 2570, a plurality of pixels arranged in a matrix and a driver circuit. Each pixel includes a light-emitting element and a pixel circuit that drives the light-emitting element.

In FIG. 11A, a pixel 2502R is shown as an example of the pixel of the display panel 2501, and a scan line driver circuit 2503g is shown as an example of the driver circuit.

The pixel 2502R includes a light-emitting element 2550R and a transistor 2502t that can supply electric power to the light-emitting element 2550R.

The transistor 2502t is covered with an insulating layer 2521. The insulating layer 2521 has a function of providing a flat surface by covering unevenness caused by the transistor and the like that have been already formed. The insulating layer 2521 may serve also as a layer for preventing diffusion of impurities. That is preferable because a reduction in the reliability of the transistor or the like due to diffusion of impurities can be prevented.

The light-emitting element 2550R is electrically connected to the transistor 2502t through a wiring. It is one electrode of the light-emitting element 2550R that is directly connected to the wiring. An end portion of the one electrode of the light-emitting element 2550R is covered with an insulator 2528.

The light-emitting element 2550R includes an EL layer between a pair of electrodes. A coloring layer 2567R is provided to overlap with the light-emitting element 2550R, and part of light emitted from the light-emitting element 2550R is transmitted through the coloring layer 2567R and extracted in the direction indicated by an arrow in the drawing. A light-blocking layer 2567BM is provided at an end portion of the coloring layer, and a sealing layer 2560 is provided between the light-emitting element 2550R and the coloring layer 2567R.

Note that when the sealing layer 2560 is provided on the side from which light from the light-emitting element 2550R is extracted, the sealing layer 2560 preferably has a light-transmitting property. The sealing layer 2560 preferably has a higher refractive index than the air.

The scan line driver circuit 2503g includes a transistor 2503t and a capacitor 2503c. Note that the driver circuit and the pixel circuits can be formed in the same process over the same substrate. Thus, in a manner similar to that of the transistor 2502t in the pixel circuit, the transistor 2503t in the driver circuit (the scan line driver circuit 2503g) is also covered with the insulating layer 2521.

The wirings 2511 through which a signal can be supplied to the transistor 2503t are provided. The terminal 2519 is provided in contact with the wiring 2511. The terminal 2519 is electrically connected to the FPC 2509(1), and the FPC 2509(1) has a function of supplying signals such as an image signal and a synchronization signal. Note that a printed wiring board (PWB) may be attached to the FPC 2509(1).

Although the case where the display panel 2501 illustrated in FIG. 11A includes a bottom-gate transistor is described, the structure of the transistor is not limited thereto, and any of transistors with various structures can be used. In each of the transistors 2502t and 2503t illustrated in FIG. 11A, a semiconductor layer containing an oxide semiconductor can be used for a channel region. Alternatively, a semiconductor layer containing amorphous silicon or a semiconductor layer containing polycrystalline silicon that is obtained by crystallization process such as laser annealing can be used for a channel region.

FIG. 11B illustrates the structure that includes a top-gate transistor instead of the bottom-gate transistor illustrated in FIG. 11A. The kind of the semiconductor layer that can be used for the channel region does not depend on the structure of the transistor.

In the touch panel 2000 illustrated in FIG. 11A, an anti-reflection layer 2567p overlapping with at least the pixel is preferably provided on a surface of the touch panel on the side from which light from the pixel is extracted, as illustrated in FIG. 11A. As the anti-reflection layer 2567p, a circular polarizing plate or the like can be used.

For the substrates 2510, 2570, and 2590 in FIG. 11A, for example, a flexible material having a vapor permeability of $1\times10^{-5}$ g/(m$^2$·day) or lower, preferably $1\times10^{-6}$ g/(m$^2$·day) or lower, can be favorably used. Alternatively, it is preferable to use the materials that make these substrates have substantially the same coefficient of thermal expansion. For example, the coefficients of linear expansion of the materials are $1\times10^{-3}$/K or lower, preferably $5\times10^{-5}$/K or lower, and more preferably $1\times10^{-5}$/K or lower.

Next, a touch panel 2000' having a structure different from that of the touch panel 2000 illustrated in FIGS. 11A and 11B will be described with reference to FIGS. 12A and 12B. It can be used as a touch panel as well as the touch panel 2000.

Figure 12A:
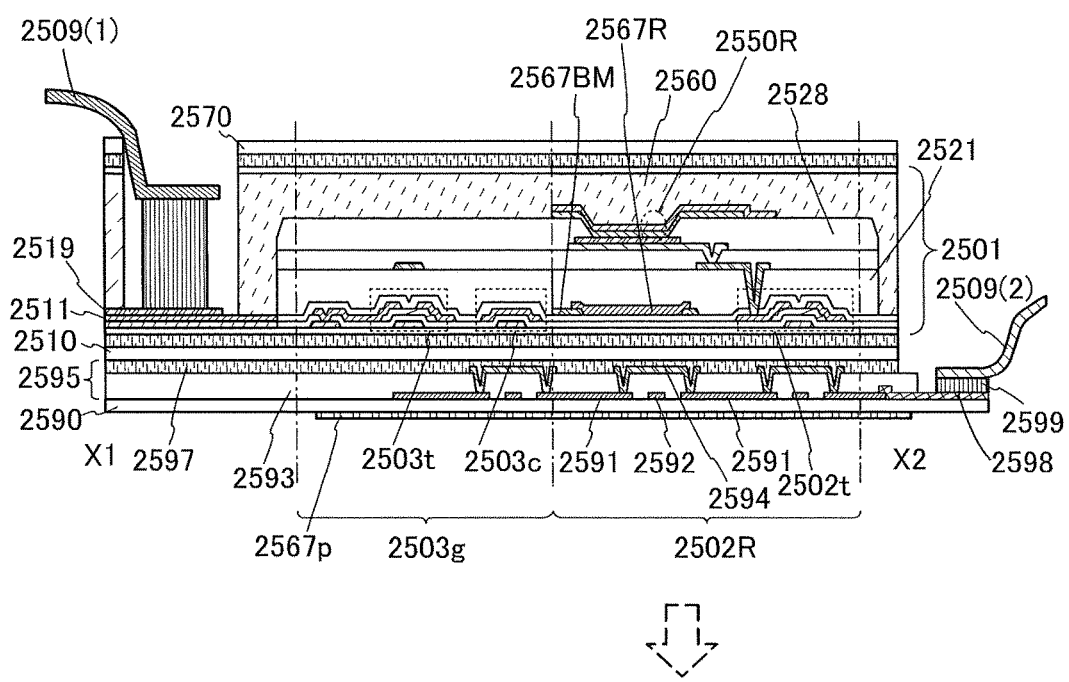
FIGS. 12A and 12B illustrate an example of a touch panel.
Figure 12B:
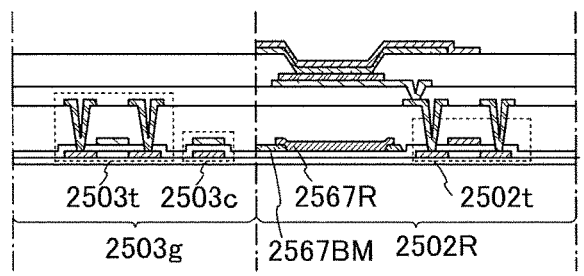

FIGS. 12A and 12B are cross-sectional views of the touch panel 2000'. In the touch panel 2000' illustrated in FIGS. 12A and 12B, the position of the touch sensor 2595 relative to the display panel 2501 is different from that in the touch panel 2000 illustrated in FIGS. 11A and 11B. Only different structures will be described below, and the above description of the touch panel 2000 can be referred to for the other similar structures.

The coloring layer 2567R overlaps with the light-emitting element 2550R. Light from the light-emitting element 2550R illustrated in FIG. 12A is emitted to the side where the transistor 2502t is provided. That is, (part of) light emitted from the light-emitting element 2550R passes through the coloring layer 2567R and is extracted in the direction indicated by an arrow in FIG. 12A. Note that the light-blocking layer 2567BM is provided at an end portion of the coloring layer 2567R.

The touch sensor 2595 is provided on the transistor 2502t side (the far side from the light-emitting element 2550R) of the display panel 2501 (see FIG. 12A).

The adhesive layer 2597 is in contact with the substrate 2510 of the display panel 2501 and attaches the display panel 2501 and the touch sensor 2595 to each other in the structure illustrated in FIG. 12A. The substrate 2510 is not necessarily provided between the display panel 2501 and the touch sensor 2595 that are attached to each other by the adhesive layer 2597.

As in the touch panel 2000, transistors with a variety of structures can be used for the display panel 2501 in the touch panel 2000'. Although a bottom-gate transistor is used in FIG. 12A, a top-gate transistor may be used as illustrated in FIG. 12B.

An example of a driving method of the touch panel will be described with reference to FIGS. 13A and 13B.

Figure 13A:
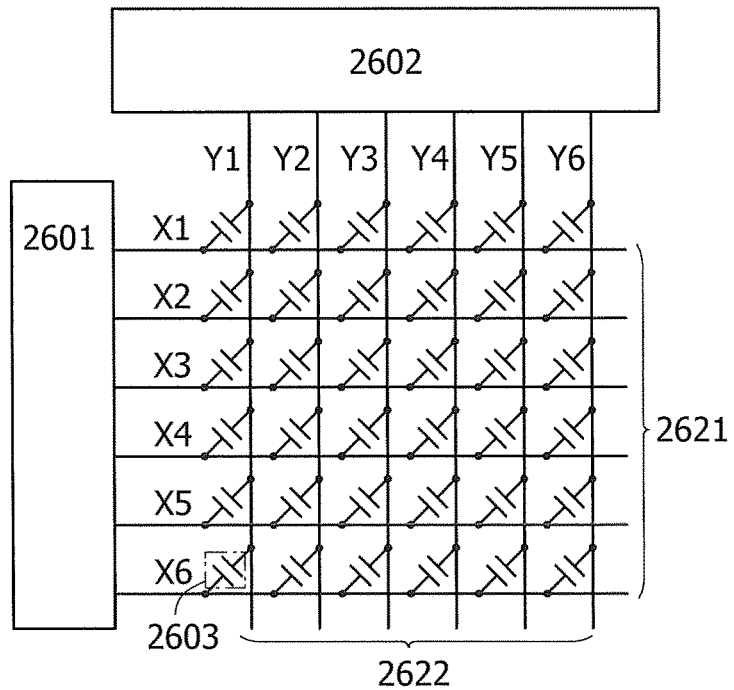
FIGS. 13A and 13B are a block diagram and a timing chart of a touch sensor.

FIG. 13A is a block diagram illustrating the structure of a mutual capacitive touch sensor. FIG. 13A illustrates a pulse voltage output circuit 2601 and a current sensing circuit 2602. Note that in FIG. 13A, six wirings X1 to X6 represent electrodes 2621 to which a pulse voltage is applied, and six wirings Y1 to Y6 represent electrodes 2622 that detect changes in current. FIG. 13A also illustrates capacitors 2603 that are each formed in a region where the electrodes 2621 and 2622 overlap with each other. Note that functional replacement between the electrodes 2621 and 2622 is possible.

The pulse voltage output circuit 2601 is a circuit for sequentially applying a pulse voltage to the wirings X1 to X6. By application of a pulse voltage to the wirings X1 to X6, an electric field is generated between the electrodes 2621 and 2622 of the capacitor 2603. When the electric field between the electrodes is shielded, for example, a change occurs in the capacitor 2603 (mutual capacitance). The approach or contact of a sensing target can be sensed by utilizing this change.

The current sensing circuit 2602 is a circuit for detecting changes in current flowing through the wirings Y1 to Y6 that are caused by the change in mutual capacitance in the capacitor 2603. No change in current value is detected in the wirings Y1 to Y6 when there is no approach or contact of a sensing target, whereas a decrease in current value is detected when mutual capacitance is decreased owing to the approach or contact of a sensing target. Note that an integrator circuit or the like is used for sensing of current values.

Figure 13B:
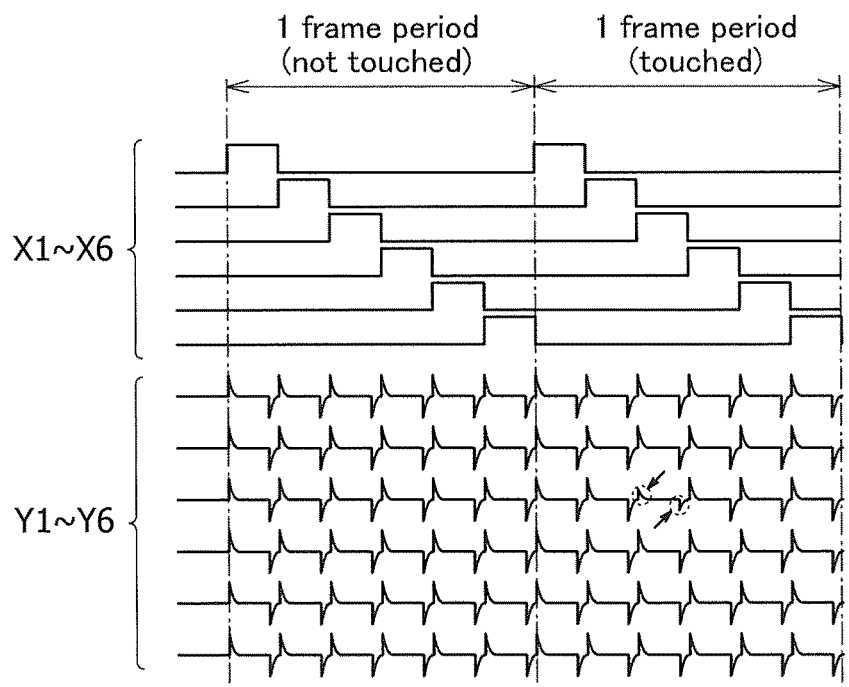

FIG. 13B is a timing chart showing input and output waveforms in the mutual capacitive touch sensor illustrated in FIG. 13A. In FIG. 13B, sensing of a sensing target is performed in all the rows and columns in one frame period. FIG. 13B shows a period when a sensing target is not sensed (not touched) and a period when a sensing target is sensed (touched). Sensed current values of the wirings Y1 to Y6 are shown as the waveforms of voltage values.

A pulse voltage is sequentially applied to the wirings X1 to X6, and the waveforms of the wirings Y1 to Y6 change in accordance with the pulse voltage. When there is no approach or contact of a sensing target, the waveforms of the wirings Y1 to Y6 change uniformly in accordance with changes in the voltages of the wirings X1 to X6. The current value is decreased at the point of approach or contact of a sensing target and accordingly the waveform of the voltage value changes. By detecting a change in mutual capacitance in this manner, the approach or contact of a sensing target can be sensed.

Figure 14:
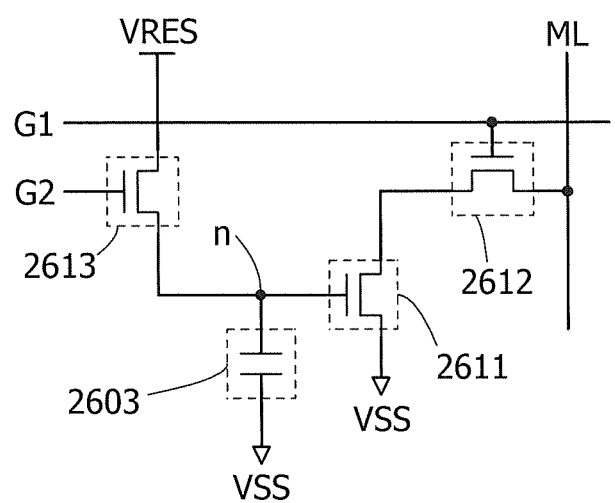
FIG. 14 is a circuit diagram of a touch sensor.

Although FIG. 13A illustrates a passive-type touch sensor in which only the capacitor 2603 is provided at the intersection of wirings as a touch sensor, an active-type touch sensor including a transistor and a capacitor may be used. FIG. 14 illustrates an example of a sensor circuit included in an active-type touch sensor.

The sensor circuit in FIG. 14 includes the capacitor 2603 and transistors 2611, 2612, and 2613.

A signal G2 is input to a gate of the transistor 2613. A voltage VRES is applied to one of a source and a drain of the transistor 2613, and one electrode of the capacitor 2603 and a gate of the transistor 2611 are electrically connected to the other of the source and the drain of the transistor 2613. One of a source and a drain of the transistor 2611 is electrically connected to one of a source and a drain of the transistor 2612, and a voltage VSS is applied to the other of the source and the drain of the transistor 2611. A signal G1 is input to a gate of the transistor 2612, and a wiring ML is electrically connected to the other of the source and the drain of the transistor 2612. The voltage VSS is applied to the other electrode of the capacitor 2603.

Next, the operation of the sensor circuit in FIG. 14 will be described. First, a potential for turning on the transistor 2613 is supplied as the signal G2, and a potential with respect to the voltage VRES is thus applied to a node n to which the gate of the transistor 2611 is connected. Then, a potential for turning off the transistor 2613 is applied as the signal G2, whereby the potential of the node n is maintained. Then, mutual capacitance of the capacitor 2603 changes owing to the approach or contact of a sensing target such as a finger, and accordingly the potential of the node n is changed from VRES.

In reading operation, a potential for turning on the transistor 2612 is supplied as the signal G1. A current flowing through the transistor 2611, that is, a current flowing through the wiring ML is changed in accordance with the potential of the node n. By sensing this current, the approach or contact of a sensing target can be sensed.

In each of the transistors 2611, 2612, and 2613, an oxide semiconductor layer is preferably used as a semiconductor layer in which a channel region is formed. In particular, it is preferable to use such a transistor as the transistor 2613 because the potential of the node n can be held for a long time and the frequency of operation of resupplying VRES to the node n (refresh operation) can be reduced.

Note that the structures described in this embodiment can be combined with any of the structures described in the other embodiments as appropriate.

(Embodiment 9)

In this embodiment, as a display device including the light-emitting element of one embodiment of the present invention, a display device which includes a reflective liquid crystal element and a light-emitting element and is capable of performing display both in a transmissive mode and a reflective mode will be described with reference to FIGS. 15A, 15B1, and 15B2, FIG. 16, and FIG. 17. Such a display device can also be referred to as an emissive OLED and reflective LC hybrid display (ER-hybrid display).

The display device described in this embodiment can be driven with extremely low power consumption for display using the reflective mode in a bright place such as outdoors. Meanwhile, in a dark place such as indoors or at night, an image can be displayed at an optimal luminance with the use of the transmissive mode. Thus, by combination of these modes, the display device can display an image with lower power consumption and higher contrast than a conventional display panel.

As an example of the display device of this embodiment, description will be made of a display device in which a liquid crystal element provided with a reflective electrode and a light-emitting element are stacked and an opening in the reflective electrode is provided in a position overlapping with the light-emitting element. Visible light is reflected by the reflective electrode in the reflective mode and light emitted from the light-emitting element is emitted through the opening in the reflective electrode in the transmissive mode. Note that transistors used for driving these elements (the liquid crystal element and the light-emitting element) are preferably formed on the same plane. It is preferable that the liquid crystal element and the light-emitting element be stacked with an insulating layer therebetween.

Figure 15A:
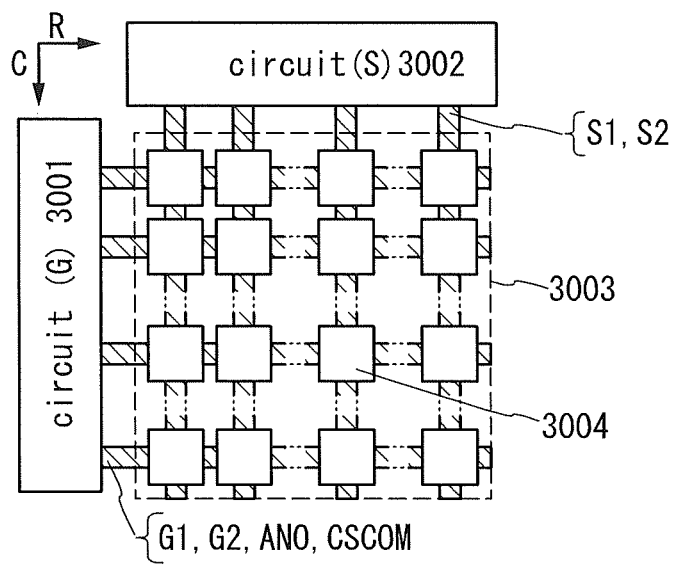
Figure 15A:
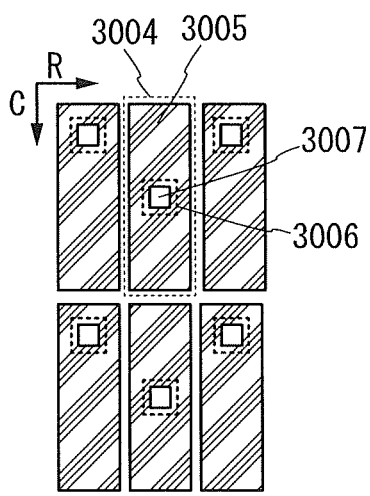
Figure 15A:
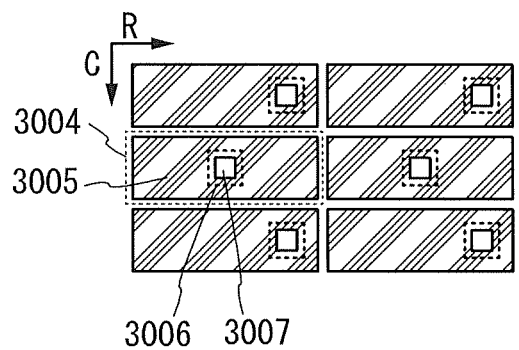

FIG. 15A is a block diagram illustrating a display device described in this embodiment. A display device 3000 includes a circuit (G) 3001, a circuit (S) 3002, and a display portion 3003. In the display portion 3003, a plurality of pixels 3004 are arranged in an R direction and a C direction in a matrix. A plurality of wirings G1, a plurality of wirings G2, a plurality of wirings ANO, and a plurality of wirings CSCOM are electrically connected to the circuit (G) 3001. These wirings are also electrically connected to the plurality of pixels 3004 arranged in the R direction. A plurality of wirings S1 and a plurality of wirings S2 are electrically connected to the circuit (S) 3002, and these wirings are also electrically connected to the plurality of pixels 3004 arranged in the C direction.

Each of the plurality of pixels 3004 includes a liquid crystal element and a light-emitting element. The liquid crystal element and the light-emitting element include portions overlapping with each other.

FIG. 15B1 shows the shape of a conductive film 3005 serving as a reflective electrode of the liquid crystal element included in the pixel 3004. Note that an opening 3007 is provided in a position 3006 which is part of the conductive film 3005 and which overlaps with the light-emitting element. That is, light emitted from the light-emitting element is emitted through the opening 3007.

The pixels 3004 in FIG. 15B1 are arranged such that adjacent pixels 3004 in the R direction exhibit different colors. Furthermore, the openings 3007 are provided so as not to be arranged in a line in the R direction. Such arrangement has an effect of suppressing crosstalk between the light-emitting elements of adjacent pixels 3004. Furthermore, there is an advantage that element formation is facilitated owing to a reduction in the degree of miniaturization.

The opening 3007 can have a polygonal shape, a quadrangular shape, an elliptical shape, a circular shape, a cross shape, a stripe shape, or a slit-like shape, for example.

FIG. 15B2 illustrates another example of the arrangement of the conductive films 3005.

The ratio of the opening 3007 to the total area of the conductive film 3005 (excluding the opening 3007) affects the display of the display device. That is, a problem is caused in that as the area of the opening 3007 is larger, the display using the liquid crystal element becomes darker; in contrast, as the area of the opening 3007 is smaller, the display using the light-emitting element becomes darker. Furthermore, in addition to the problem of the ratio of the opening, a small area of the opening 3007 itself also causes a problem in that extraction efficiency of light emitted from the light-emitting element is decreased. The ratio of the opening 3007 to the total area of the conductive film 3005 (excluding the opening 3007) is preferably 5% or more and 60% or less for maintaining display quality at the time of combination of the liquid crystal element and the light-emitting element.

Figure 16:
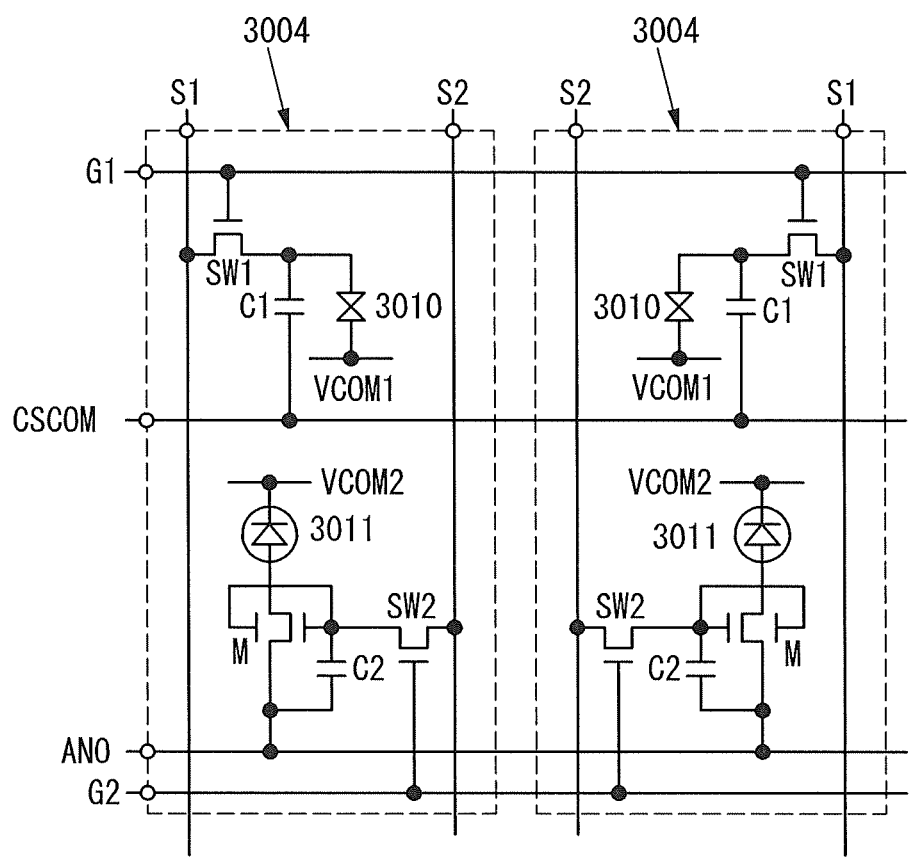
FIG. 16 illustrates a circuit configuration of a display device.

Next, an example of a circuit configuration of the pixel 3004 will be described with reference to FIG. 16. FIG. 16 shows two adjacent pixels 3004.

The pixel 3004 includes a transistor SW1, a capacitor C1, a liquid crystal. element 3010, a transistor SW2, a transistor M, a capacitor C2, a light-emitting element 3011, and the like. Note that these components are electrically connected to any of the wiring G1, the wiring G2, the wiring ANO, the wiring CSCOM, the wiring S1, and the wiring S2 in the pixel 3004. The liquid crystal element 3010 and the light-emitting element 3011 are electrically connected to a wiring VCOM1 and a wiring VCOM2, respectively.

A gate of the transistor SW1 is connected to the wiring G1. One of a source and a drain of the transistor SW1 is connected to the wiring S1, and the other of the source and the drain is connected to one electrode of the capacitor C1 and one electrode of the liquid crystal element 3010. The other electrode of the capacitor C1 is connected to the wiring CSCOM. The other electrode of the liquid crystal element 3010 is connected to the wiring VCOM1.

A gate of the transistor SW2 is connected to the wiring G2. One of a source and a drain of the transistor SW2 is connected to the wiring S2, and the other of the source and the drain is connected to one electrode of the capacitor C2 and a gate of the transistor M. The other electrode of the capacitor C2 is connected to one of a source and a drain of the transistor M and the wiring ANO. The other of the source and the drain of the transistor M is connected to one electrode of the light-emitting element 3011. Furthermore, the other electrode of the light-emitting element 3011 is connected to the wiring VCOM2.

Note that the transistor M includes two gates between which a semiconductor is provided and which are electrically connected to each other. With such a structure, the amount of current flowing through the transistor M can be increased.

The on/off state of the transistor SW1 is controlled by a signal from the wiring G1. A predetermined potential is supplied from the wiring VCOM1. Furthermore, orientation of liquid crystals of the liquid crystal element 3010 can be controlled by a signal from the wiring S1. A predetermined potential is supplied from the wiring CSCOM.

The on/off state of the transistor SW2 is controlled by a signal from the wiring G2. By the difference between the potentials applied from the wiring VCOM2 and the wiring ANO, the light-emitting element 3011 can emit light. Furthermore, the conduction state of the transistor M can be controlled by a signal from the wiring S2.

Accordingly, in the structure of this embodiment, in the case of the reflective mode, the liquid crystal element 3010 is controlled by the signals supplied from the wiring G1 and the wiring S1 and optical modulation is utilized, whereby display can be performed. In the case of the transmissive mode, the light-emitting element 3011 can emit light when the signals are supplied from the wiring G2 and the wiring S2. In the case where both modes are performed at the same time, desired driving can be performed on the basis of the signals from the wiring G1, the wiring G2, the wiring S1, and the wiring S2.

Figure 17:
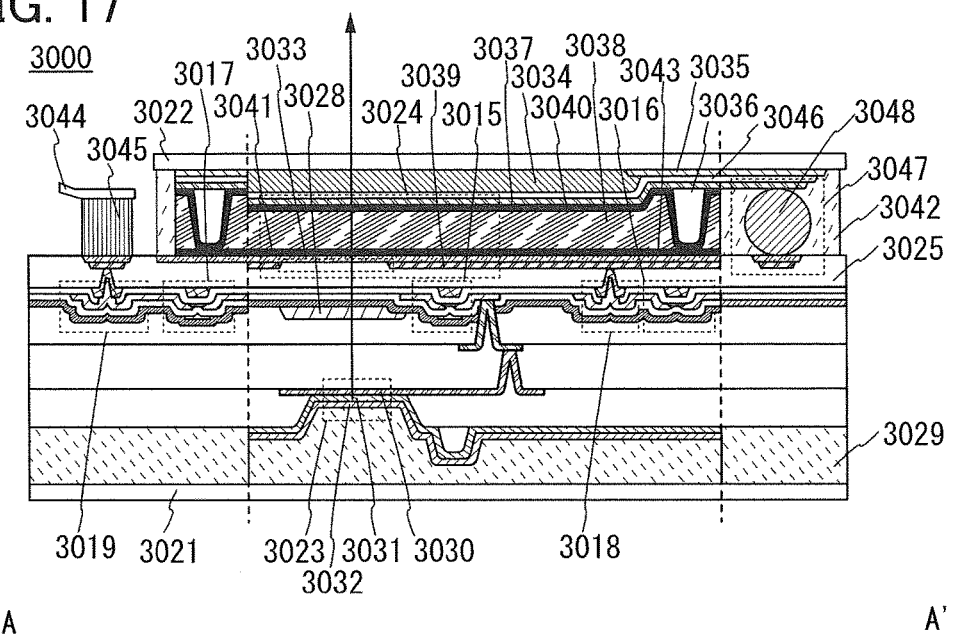
FIG. 17 illustrates a cross-sectional structure of a display device.

Next, specific description will be given with reference to FIG. 17, a schematic cross-sectional view of the display device 3000 described in this embodiment.

The display device 3000 includes a light-emitting element 3023 and a liquid crystal element 3024 between substrates 3021 and 3022. Note that the light-emitting element 3023 and the liquid crystal element 3024 are formed with an insulating layer 3025 positioned therebetween. That is, the light-emitting element 3023 is positioned between the substrate 3021 and the insulating layer 3025, and the liquid crystal element 3024 is positioned between the substrate 3022 and the insulating layer 3025.

A transistor 3015, a transistor 3016, a transistor 3017, a coloring layer 3028, and the like are provided between the insulating layer 3025 and the light-emitting element 3023.

A bonding layer 3029 is provided between the substrate 3021 and the light-emitting element 3023. The light-emitting element 3023 includes a conductive layer 3030 serving as one electrode, an EL layer 3031, and a conductive layer 3032 serving as the other electrode which are stacked in this order over the insulating layer 3025. In the light-emitting element 3023 that is a bottom emission light-emitting element, the conductive layer 3032 and the conductive layer 3030 contain a material that reflects visible light and a material that transmits visible light, respectively. Light emitted from the light-emitting element 3023 is transmitted through the coloring layer 3028 and the insulating layer 3025 and then transmitted through the liquid crystal element 3024 via an opening 3033, thereby being emitted to the outside of the substrate 3022.

In addition to the liquid crystal element 3024, a coloring layer 3034, a light-blocking layer 3035, an insulating layer 3046, a structure 3036, and the like are provided between the insulating layer 3025 and the substrate 3022. The liquid crystal element 3024 includes a conductive layer 3037 serving as one electrode, a liquid crystal 3038, a conductive layer 3039 serving as the other electrode, alignment films 3040 and 3041, and the like. Note that the liquid crystal element 3024 is a reflective liquid crystal element and the conductive layer 3039 serves as a reflective electrode; thus, the conductive layer 3039 is formed using a material with high reflectivity. Furthermore, the conductive layer 3037 serves as a transparent electrode, and thus is formed using a material that transmits visible light. The alignment films 3040 and 3041 are provided on the conductive layers 3037 and 3039 and in contact with the liquid crystal 3038. The insulating layer 3046 is provided so as to cover the coloring layer 3034 and the light-blocking layer 3035 and serves as an overcoat. Note that the alignment films 3040 and 3041 are not necessarily provided.

The opening 3033 is provided in part of the conductive layer 3039. A conductive layer 3043 is provided in contact with the conductive layer 3039. Since the conductive layer 3043 has a light-transmitting property, a material transmitting visible light is used for the conductive layer 3043.

The structure 3036 serves as a spacer that prevents the substrate 3022 from coming closer to the insulating layer 3025 than required. The structure 3036 is not necessarily provided.

One of a source and a drain of the transistor 3015 is electrically connected to the conductive layer 3030 in the light-emitting element 3023. For example, the transistor 3015 corresponds to the transistor M in FIG. 16.

One of a source and a drain of the transistor 3016 is electrically connected to the conductive layer 3039 and the conductive layer 3043 in the liquid crystal element 3024 through a terminal portion 3018. That is, the terminal portion 3018 has a function of electrically connecting the conductive layers provided on both surfaces of the insulating layer 3025. The transistor 3016 corresponds to the transistor SW1 in FIG. 16.

A terminal portion 3019 is provided in a region where the substrates 3021 and 3022 do not overlap with each other. Similarly to the terminal portion 3018, the terminal portion 3019 electrically connects the conductive layers provided on both surfaces of the insulating layer 3025. The terminal portion 3019 is electrically connected to a conductive layer obtained by processing the same conductive film as the conductive layer 3043. Thus, the terminal portion 3019 and an FPC 3044 can be electrically connected to each other through a connection layer 3045.

A connection portion 3047 is provided in part of a region where a bonding layer 3042 is provided. In the connection portion 3047, the conductive layer obtained by processing the same conductive film as the conductive layer 3043 and part of the conductive layer 3037 are electrically connected with a connector 3048. Accordingly, a signal or a potential input from the FPC 3044 can be supplied to the conductive layer 3037 through the connector 3048.

The structure 3036 is provided between the conductive layer 3037 and the conductive layer 3043. The structure 3036 has a function of maintaining a cell gap of the liquid crystal element 3024.

As the conductive layer 3043, a metal oxide, a metal nitride, or an oxide such as an oxide semiconductor whose resistance is reduced is preferably used. In the case of using an oxide semiconductor, a material in which at least one of the concentrations of hydrogen, boron, phosphorus, nitrogen, and other impurities and the number of oxygen vacancies is made to be higher than those in a semiconductor layer of a transistor is used for the conductive layer 3043.

Note that the structures described in this embodiment can be combined with any of the structures described in the other embodiments as appropriate.

EXAMPLE 1

Figure 18:
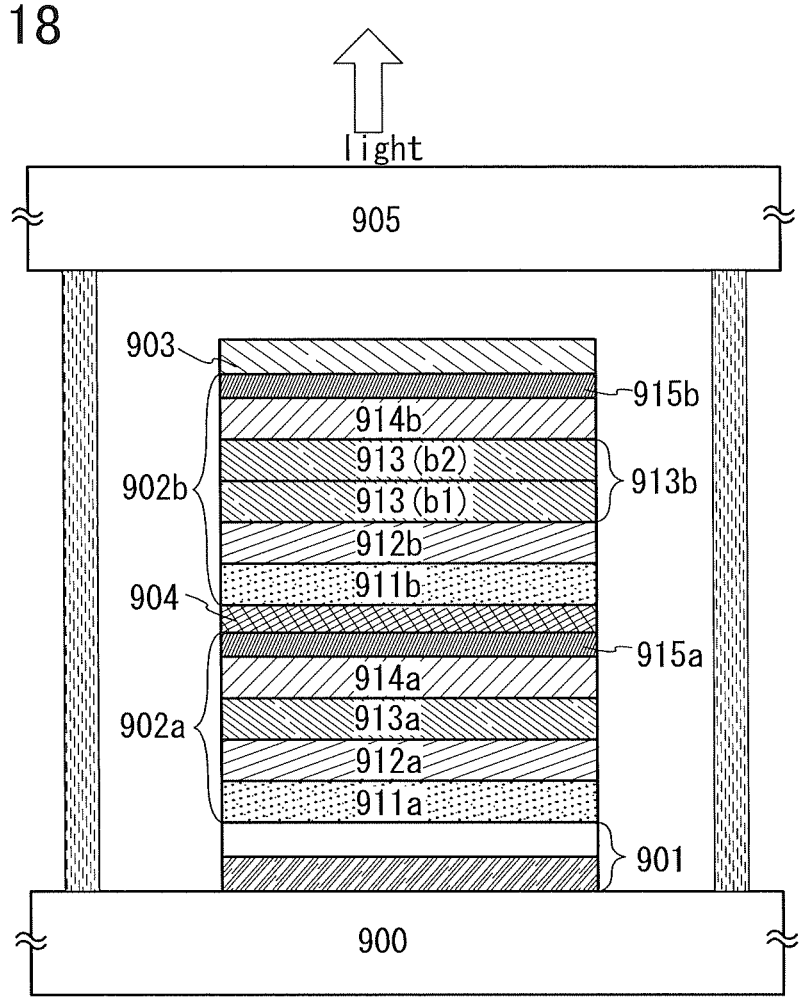
FIG. 18 illustrates a light-emitting element.
Figure 19:
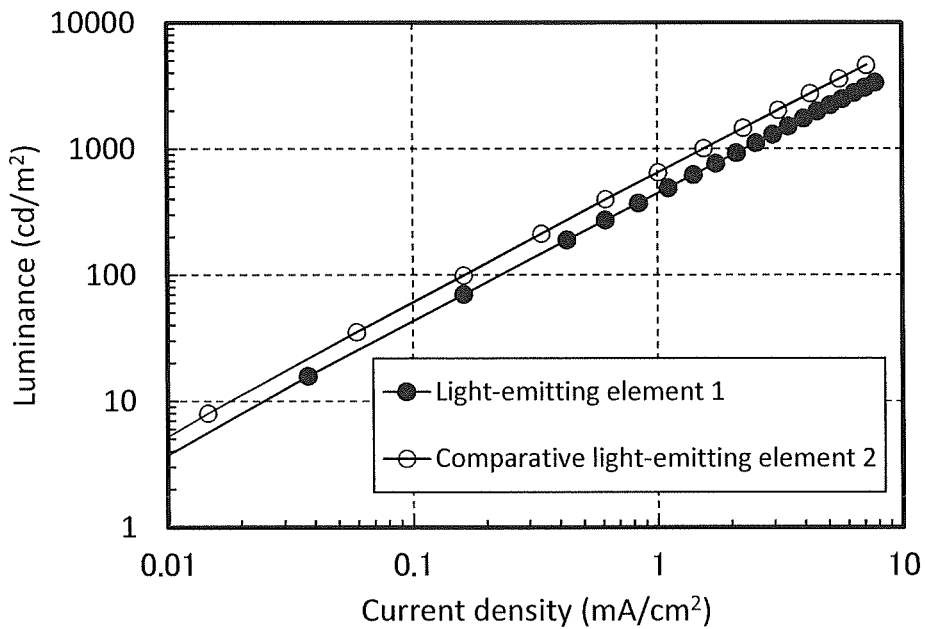
FIG. 19 shows the luminance-current density characteristics of Light-emitting element 1 and Comparative light-emitting element 2.
Figure 20:
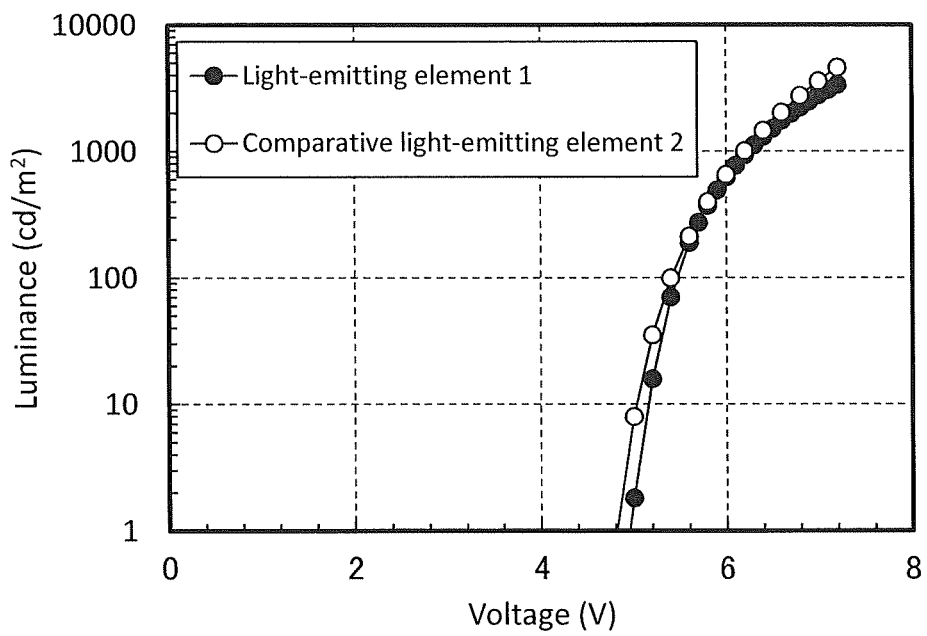
FIG. 20 shows the luminance-voltage characteristics of Light-emitting element 1 and Comparative light-emitting element 2.
Figure 21:
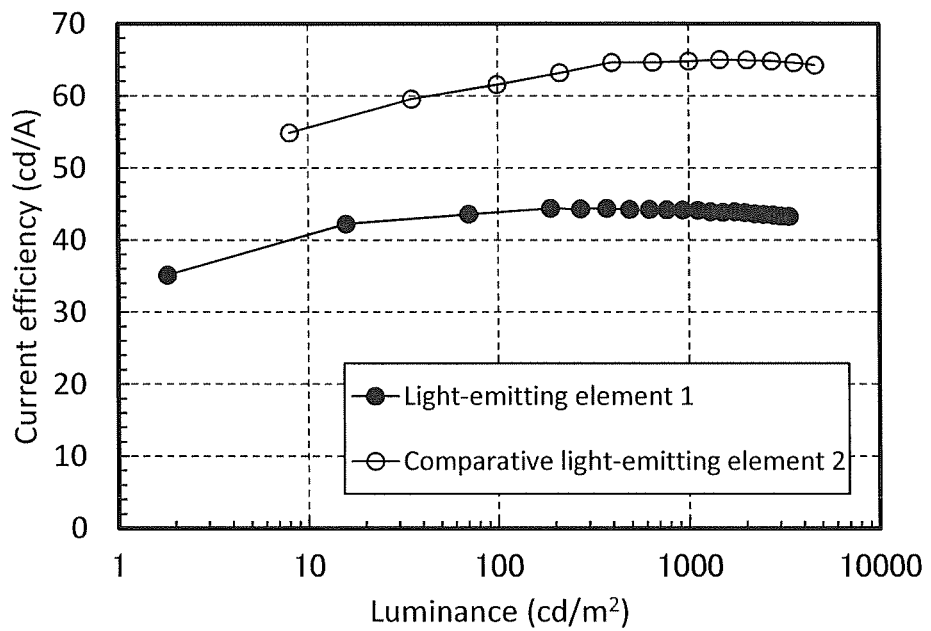
FIG. 21 shows the current efficiency-luminance characteristics of Light-emitting element 1 and Comparative light-emitting element 2.
Figure 22:
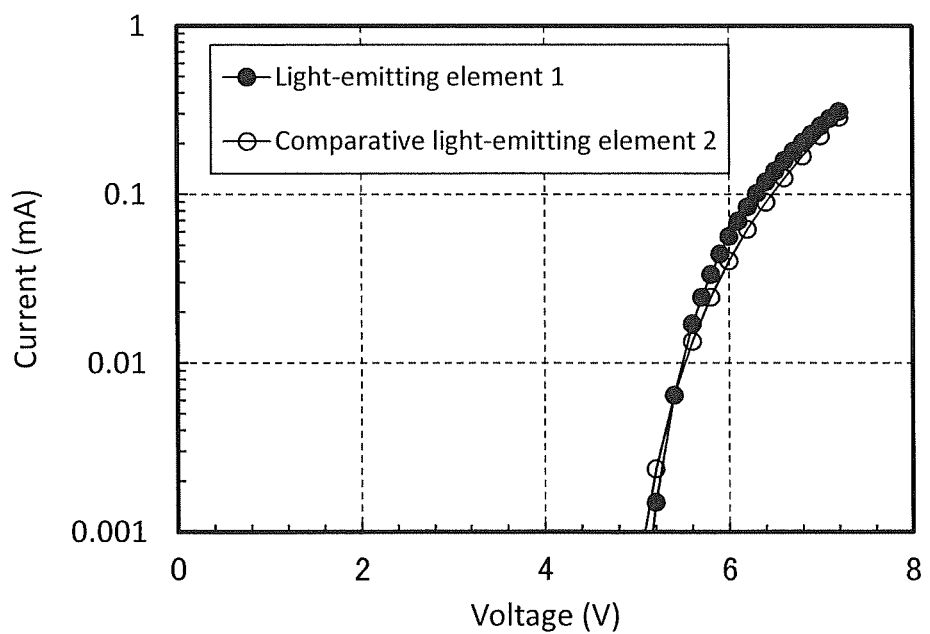
FIG. 22 shows the current-voltage characteristics of Light-emitting element 1 and Comparative light-emitting element 2.

In this example, an element structure and a fabricating method of the light-emitting element of one embodiment of the present invention will be described. Note that FIG. 18 illustrates the element structure of a light-emitting element described in this example, and Table 1 shows specific structures. Chemical formulae of materials used in this example are shown below.

TABLE 1

| | First electrode 901 | First hole-injection layer 911a | First hole-transport layer 912a | Light-emitting layer (A) 913a | | First electron-transport layer 914a | |
|---|---|---|---|---|---|---|---|
| Light-emitting element 1(R) | Al—Ni—La\Ti (200 nm\3 nm) | NITO (75 nm) | PCPPn:MoOx (1:0.5 15 nm) | PCPPn (15 nm) | *1 | CzPA (5 nm) | Bphen (15 nm) |
| Comparative light-emitting element 2(R) | Al—Ni—La\Ti (200 nm\3 nm) | NITO (85 nm) | PCPPn:MoOx (1:0.5 20 nm) | PCPPn (15 nm) | *2 | cgDBCzPA (10 nm) | NBphen (15 nm) |

| | First electron-injection layer 915a | Charge generation layer 904 | Second hole-injection layer 911b | Second hole-transport layer 912b | Light-emitting layer (B) | |
|---|---|---|---|---|---|---|
| | | | | | Light-emitting layer (B1) 913(b1) | Light-emitting layer (B2) 913(b2) |
| Light-emitting element 1(R) | Li$_2$O (0.1 nm) | CuPc (2 nm) | DBT3P-II:MoOx (1:0.5 12.5 nm) | BPAFLP (20 nm) | **1 | ***1 |
| Comparative light-emitting element 2(R) | | | DBT3P-II:MoOx (1:0.5 10 nm) | BPAFLP (15 nm) | **2 | ***2 ****2 |

| | Second electron-transport layer 914b | | Second electron-injection layer 915b | Second electrode 903 | |
|---|---|---|---|---|---|
| Light-emitting element 1(R) | 2mDBTBPDBq-II (30 nm) | Bphen (15 nm) | LiF (1 nm) | Ag:Mg (1:0.1 15 nm) | ITO (70 nm) |
| Comparative light-emitting element 2(R) | | NBphen (15 nm) | | Ag:Mg (0.5:0.05 15 nm) | |

*1CzPA:1,6mMemFLPAPrn (1:0.05 25 nm)

**1 2mDBTBPDBq-II:PCBNBB:[Ir(tBuppm)$_2$(acac)] (0.7:0.3:0.06 20 nm)

***1 2mDBTBPDBq-II:[Ir(dmdppr-P)$_2$(dibm)] (1:0.04 20 nm)

*2cgDBCzPA:1,6mMemFLPAPrn (1:0.03 25 nm)

**2 2mDBTBPDBq-II:PCBBiF:[Ir(tBuppm)$_2$(acac)](0.8:0.2:0.06 20 nm)

***2 2mDBTBPDBq-II:PCBBiF:[Ir(dmdppr-dmp)$_2$(dpm)] (0.8:0.2:0.06 10 nm)

****2 2mDBTBPDBq-II:PCBBiF:[Ir(tBuppm)$_2$(acac)] (0.8:0.2:0.06 10 nm)

[Chemical Formulae 1]
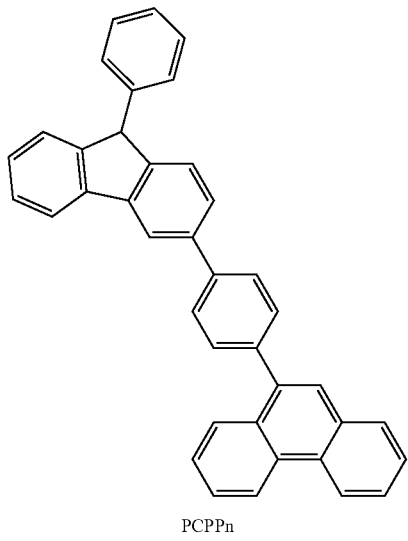
PCPPn
CzPA
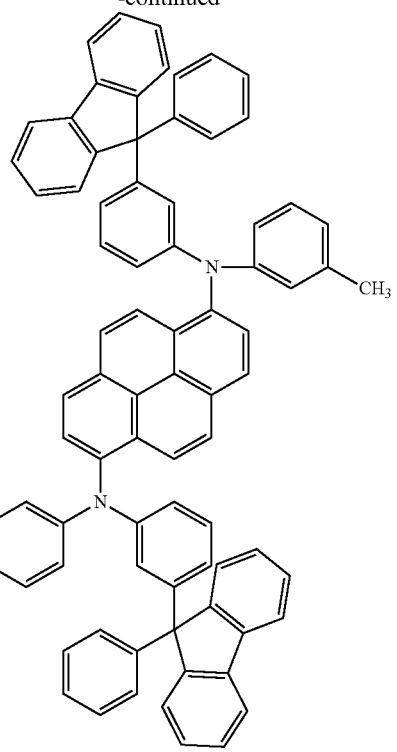
1,6mMemFLPAPrn
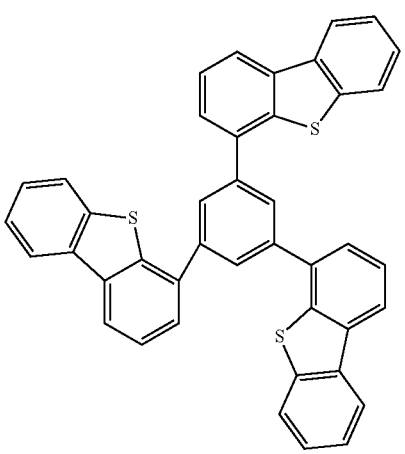
DBT3P-II
2mDBTBPDBq-II

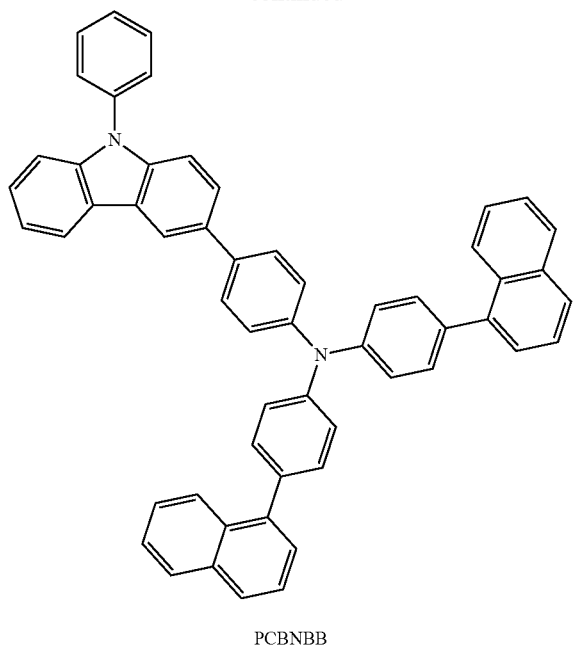
PCBNBB
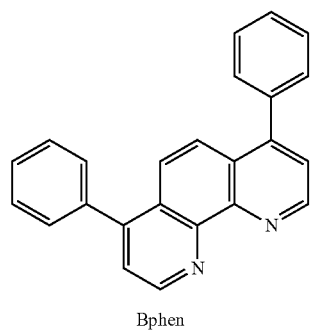
Bphen
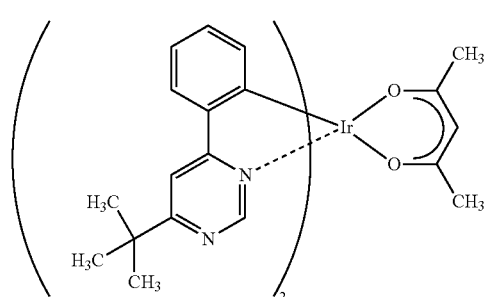
[Ir(tBuppm)₂(acac)]
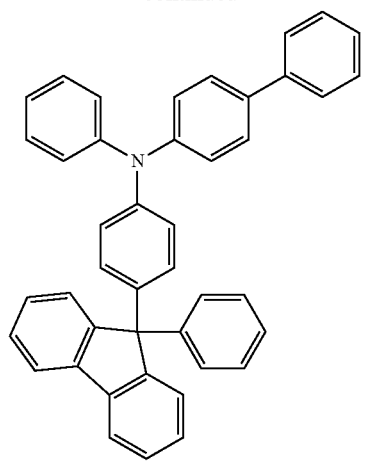
BPAFLP
[Chemical Formulae 2]
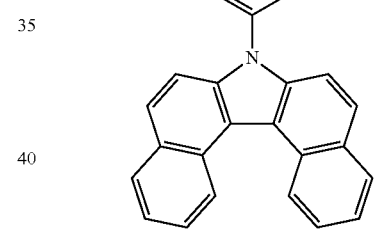
cgDBCzPA
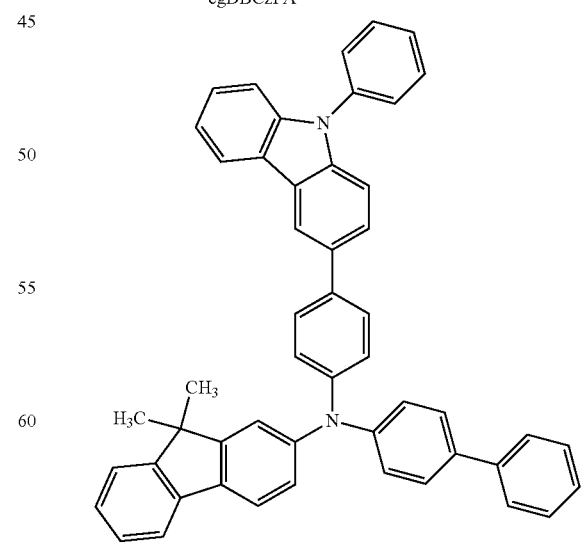
PCBBiF

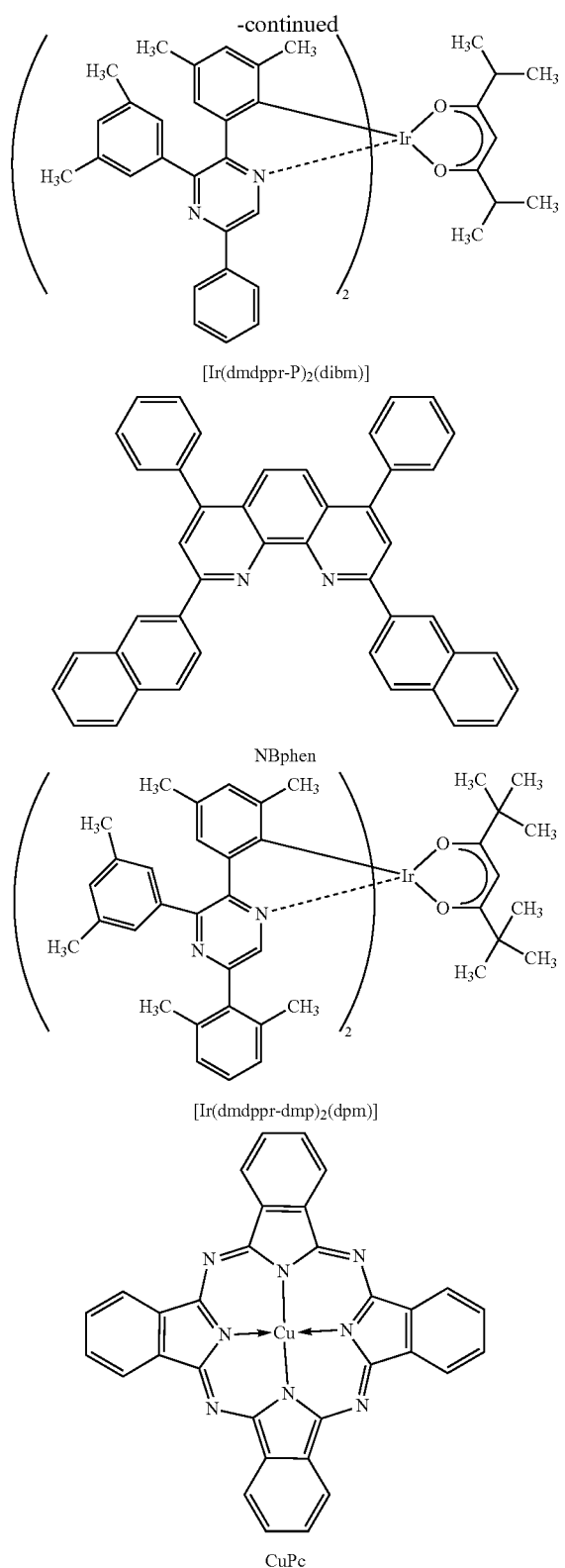

[Ir(dmdppr-P)₂(dibm)]

NBphen

[Ir(dmdppr-dmp)₂(dpm)]

CuPc

<<Fabrication of Light-Emitting Elements>>
<Fabrication of Light-Emitting Element 1 and Comparative Light-Emitting Element 2>

A light-emitting element in this example has a structure illustrated in FIG. 18 in which a first electrode 901 is formed over a substrate 900, a first EL layer 902*a* is formed over the first electrode 901, a charge generation layer 904 is formed over the first EL layer 902*a*, a second EL layer 902*b* is formed over the charge generation layer 904, and a second electrode 903 is formed over the second EL layer 902*b*.

First, the first electrode 901 was formed over the substrate 900. The electrode area was set to 4 mm² (2 mm×2 mm). A glass substrate was used as the substrate 900. The first electrode 901 was formed in such a manner that a 200-nm-thick alloy film of aluminum (Al), nickel (Ni), and lanthanum (La) (Al—Ni—La film) was formed by a sputtering method, Ti was deposited to a thickness of 3 nm by a sputtering method, and ITSO was deposited by a sputtering method. The ITSO was deposited to a thickness of 75 nm for Light-emitting element 1, and to a thickness of 85 nm for Comparative light-emitting element 2. In this example, the first electrode 901 functions as an anode. The first electrode 901 is a reflective electrode having a function of reflecting light.

At pretreatment, a surface of the substrate was washed with water, baking was performed at 200° C. for one hour, and then UV ozone treatment was performed for 370 seconds. After that, the substrate was transferred into a vacuum evaporation apparatus where the pressure had been reduced to approximately $10^{-4}$ Pa, and was subjected to vacuum baking at 170° C. for 60 minutes in a heating chamber of the vacuum evaporation apparatus, and then the substrate was cooled down for about 30 minutes.

Next, a first hole-injection layer 911*a* was formed over the first electrode 901. After the pressure in the vacuum evaporation apparatus was reduced to $10^{-4}$ Pa, the first hole-injection layer 911*a* was formed to a thickness of 15 nm for Light-emitting element 1 and to a thickness of 20 nm for Comparative light-emitting element 2 by co-evaporation such that the weight ratio of 3-[4-(9-phenanthryl)-phenyl]-9-phenyl-9H-carbazole (abbreviation: PCPPn) to molybdenum oxide was 1:0.5.

Then, a first hole-transport layer 912*a* was formed over the first hole-injection layer 911*a*. As the first hole-transport layer 912*a*, PCPPn was deposited by evaporation to a thickness of 15 nm.

Next, a light-emitting layer (A) 913*a* was formed over the first hole-transport layer 912*a*.

In the case of Light-emitting element 1, the light-emitting layer (A) 913*a* was formed to a thickness of 25 nm by co-evaporation of 9-[4-(10-phenyl-9-anthracenyl)phenyl]-9H-carbazole (abbreviation: CzPA) as a host material and N,N'-bis(3-methylphenyl)-N,N'-bis[3-(9-phenyl-9H-fluoren-9-yl)phenyl]-pyrene-1,6-dia mine (abbreviation: 1,6mMemFLPAPm) as a guest material (fluorescent material), such that the weight ratio of CzPA to 1,6mMemFLPAPm was 1:0.05.

In the case of Comparative light-emitting element 2, the light-emitting layer (A) 913*a* was formed to a thickness of 25 nm by co-evaporation of 7-[4-(10-phenyl-9-anthryl)phenyl]-7H-dibenzo[c,g]carbazole (abbreviation: cgDBCzPA) as a host material and 1,6mMemFLPAPm as a guest material (fluorescent material), such that the weight ratio of cgDBCzPA to 1,6mMemFLPAPm was 1:0.03.

Next, a first electron-transport layer 914*a* was formed over the light-emitting layer (A) 913*a*. In the case of Light-emitting element 1, the first electron-transport layer 914*a* was formed in such a manner that CzPA and bathophenanthroline (abbreviation: Bphen) were sequentially deposited by evaporation to thicknesses of 5 nm and 15 nm, respectively. In the case of Comparative light-emitting element 2, the first electron-transport layer 914*a* was formed in such a manner that cgDBCzPA and 2,9-bis(naphthalen-2- yl)-4,7-diphenyl-1,10-phenanthroline (abbreviation: NBphen) were sequentially deposited by evaporation to thicknesses of 10 nm and 15 nm, respectively.

Next, a first electron-injection layer 915a was formed over the first electron-transport layer 914a. The first electron-injection layer 915a was formed to a thickness of 0.1 nm by evaporation of lithium oxide ($Li_2O$).

Then, the charge generation layer 904 was formed over the first electron-injection layer 915a. The charge generation layer 904 was formed to a thickness of 2 nm by evaporation of copper phthalocyanine (abbreviation: CuPc).

Next, a second hole-injection layer 911b was foamed over the charge generation layer 904. The second hole-injection layer 911b was formed to a thickness of 12.5 nm for Light-emitting element 1 and to a thickness of 10 nm for Comparative light-emitting element 2 by co-evaporation such that the weight ratio of 4,4',4''-(benzene-1,3,5-triyl)tri(dibenzothiophene) (abbreviation: DBT3P-II) to molybdenum oxide was 1:0.5.

Then, a second hole-transport layer 912b was formed over the second hole-injection layer 911b. The second hole-transport layer 912b was formed by evaporation of 4-phenyl-4'-(9-phenylfluoren-9-yl)triphenylamine (abbreviation: BPAFLP) to a thickness of 20 nm for Light-emitting element 1 and to a thickness of 15 nm for Comparative light-emitting element 2.

A light-emitting layer (B) 913b was formed over the second hole-transport layer 912b. The light-emitting layer (B) 913b has a stacked-layer structure of a light-emitting layer (B1) 913(b1) and a light-emitting layer (B2) 913(b2).

In the case of Light-emitting element 1, the light-emitting layer (B1) 913(b1) was formed to a thickness of 20 nm by co-evaporation of 2-[3'-(dibenzothiophen-4-yl)biphenyl-3-yl]dibenzo[f,h]quinoxaline (abbreviation: 2mDBTBPDBq-II) as a host material, 4,4'-di(1-naphthyl)-4''-(9-phenyl-9H-carbazol-3-yl)triphenylamine (abbreviation: PCBNBB) as an assist material, and (acetylacetonato)bis(6-tert-butyl-4-phenylpyrimidinato)iridium(III) (abbreviation: [Ir(tBuppm)$_2$(acac)]) as a guest material (phosphorescent material), such that the weight ratio of 2mDBTBPDBq-II:PCBNBB:[Ir(tBuppm)$_2$(acac)] was 0.7:0.3:0.06. In addition, the light-emitting layer (B2) 913(b2) was formed to a thickness of 20 nm by co-evaporation of 2mDBTBPDBq-II as a host material and bis{4,6-dimethyl-2-[3-(3,5-dimethylphenyl)-5-phenyl-2-pyrazinyl-κN]phenyl-κC} (2,6-dimethyl-3,5-heptanedionato-κ$^2$O,O')iridium(III) (abbreviation: [Ir(dmdppr-P)$_2$(dibm)]) as a guest material (phosphorescent material), such that the weight ratio of 2mDBTBPDBq-II to [Ir(dmdppr-P)$_2$(dibm)] was 1:0.04.

In the case of Comparative light-emitting element 2, the light-emitting layer (B1) 913(b1) was formed to a thickness of 20 nm by co-evaporation of 2mDBTBPDBq-II as a host material, N-(1,1'-biphenyl-4-yl)-N-[4-(9-phenyl-9H-carbazol-3-yl)phenyl]-9,9-dimethyl-9H-fluor en-2-amine (abbreviation: PCBBiF) as an assist material, and [Ir(tBuppm)$_2$(acac)] as a guest material (phosphorescent material), such that the weight ratio of 2mDBTBPDBq-II:PCBBiF:[Ir(tBuppm)$_2$(acac)] was 0.8:0.2:0.06. In addition, the light-emitting layer (B2) 913(b2) having a stacked-layer structure was foamed by co-evaporation of 2mDBTBPDBq-II as a host material, PCBBiF as an assist material, and bis [2-(5-(2,6-dimethylphenyl)-3-(3,5-dimethylphenyl)-2-pyrazinyl-κN)-4,6-dimethylpheny 1-κC](2,2,6,6-tetramethyl-3,5-heptanedionato-κ$^2$O,O')iridium(III) (abbreviation: [Ir(dmdppr-dmp)$_2$(dpm)]) as a guest material (phosphorescent material) at a weight ratio of 2mDBTBPDBq-II:PCBBiF:[Ir(dmdppr-dmp)$_2$(dpm)]=0.8:0.2:0.06 to a thickness of 10 nm and then co-evaporation of 2mDBTBPDBq-II as a host material, PCBBiF as an assist material, and [Ir(tBuppm)$_2$(acac)] as a guest material (phosphorescent material) at a weight ratio of 2mDBTBPDBq-II:PCBBiF:[Ir(tBuppm)$_2$(acac)]=0.8:0.2:0.06 to a thickness of 10 nm.

Next, a second electron-transport layer 914b was formed over the light-emitting layer (B2) 913(b2). In the case of Light-emitting element 1, the second electron-transport layer 914b was foamed in such a manner that 2mDB IBPDBq-II and Bphen were sequentially deposited by evaporation to thicknesses of 30 nm and 15 nm, respectively. In the case of Comparative light-emitting element 2, the second electron-transport layer 914b was formed in such a manner that 2mDB IBPDBq-II and NBphen were sequentially deposited by evaporation to thicknesses of 30 nm and 15 nm, respectively.

Then, a second electron-injection layer 915b was formed over the second electron-transport layer 914b. The second electron-injection layer 915b was formed by evaporation of lithium fluoride (LiF) to a thickness of 1 nm.

Then, the second electrode 903 was formed over the second electron-injection layer 915b. In the case of Light-emitting element 1, the second electrode 903 was formed in such a manner that silver (Ag) and magnesium (Mg) were deposited to a thickness of 15 nm by co-evaporation at a volume ratio of Ag:Mg=1:0.1, and then indium tin oxide (ITO) was deposited to a thickness of 70 nm by a sputtering method. In the case of Comparative light-emitting element 2, the second electrode 903 was formed in such a manner that silver (Ag) and magnesium (Mg) were deposited to a thickness of 15 nm by co-evaporation at a volume ratio of Ag:Mg=1:0.05, and then indium tin oxide (ITO) was deposited to a thickness of 70 nm by a sputtering method. In this example, the second electrode 903 functions as a cathode. The second electrode 903 is a semi-transmissive and semi-reflective electrode having a function of reflecting light and a function of transmitting light.

Through the above steps, the light-emitting element in which the EL layers are provided between the pair of electrodes was formed over the substrate 900. The first hole-injection layer 911a, the first hole-transport layer 912a, the light-emitting layer (A) 913a, the first electron-transport layer 914a, the first electron-injection layer 915a, the second hole-injection layer 911b, the second hole-transport layer 912b, the light-emitting layer (B) 913b, the second electron-transport layer 914b, and the second electron-injection layer 915b that are described in the above steps are functional layers forming the EL layers of one embodiment of the present invention. Furthermore, in all the evaporation steps in the above fabricating method, evaporation was performed by a resistance-heating method.

The light-emitting element fabricated in this example is sealed between the substrate 900 and a substrate 905 as illustrated in FIG. 18. The sealing between the substrate 900 and the substrate 905 was performed in such a manner that the substrate 905 was fixed to the substrate 900 with a sealant in a glove box containing a nitrogen atmosphere, a sealant was applied to surround the light-emitting element formed over the substrate 900, and then for sealing, irradiation with 365-nm ultraviolet light at 6 $J/cm^2$ was performed and heat treatment was performed at 80° C. for 1 hour.

The Light-emitting element 1 and Comparative light-emitting element 2 each have a structure in which light is emitted in the direction indicated by the arrow from the second electrode 903 side of the light-emitting element.

<<Operation Characteristics of Light-Emitting Elements>>

Operation characteristics of the fabricated light-emitting elements were measured. Note that the measurement was performed at room temperature (in an atmosphere kept at 25° C.). The results are shown in FIGS. 19 to 22.

Table 2 lists the initial values of main characteristics of the light-emitting elements at around 1000 cd/m$^2$.

TABLE 2

|  | Voltage (V) | Chromaticity (x, y) | Luminance (cd/m$^2$) | Current efficiency (cd/A) | Power efficiency (lm/W) |
| --- | --- | --- | --- | --- | --- |
| Light-emitting element 1 | 6.2 | (0.538, 0.391) | 930 | 44 | 22 |
| Comparative light-emitting element 2 | 6.2 | (0.523, 0.368) | 1000 | 65 | 33 |

Figure 23:
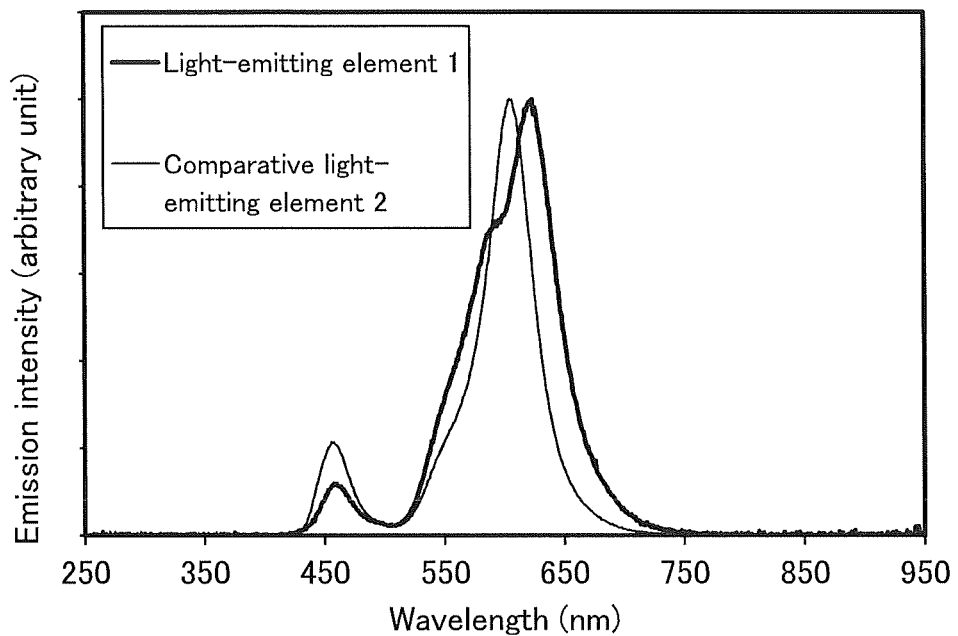
FIG. 23 shows emission spectra of Light-emitting element 1 and Comparative light-emitting element 2.

FIG. 23 shows the emission spectra of Light-emitting element 1 and Comparative light-emitting element 2 to which a current is supplied at a current density of 2.5 mA/cm$^2$. Each of the elements is a white tandem light-emitting element including light-emitting materials of three colors, i.e., red ([Ir(dmdppr-P)$_2$(dibm)] and [Ir(dmdppr-dmp)$_2$(dpm)]), green ([Ir(tBuppm)$_2$(acac)]), and blue (1,6mMemFLPAPm), and the emission intensity of light in the red region (at 600 nm or more) is increased in each of the elements by a microcavity effect. Note that the half widths of the spectra of Light-emitting element 1 and Comparative light-emitting element 2 are approximately 80 nm and approximately 40 nm, respectively. As shown in FIG. 23, the emission spectrum of Light-emitting element 1 has a peak at around 624 nm and the emission spectrum of Comparative light-emitting element 2 has a peak at around 605 nm. That is, the peak of the emission spectrum of Light-emitting element 1 is on the longer wavelength side than that of Comparative light-emitting element 2.

Next, the characteristics of Light-emitting element 1 and Comparative light-emitting element 2 with the above structures each of which was combined with an optical element (color filter) were evaluated.

Figure 24:
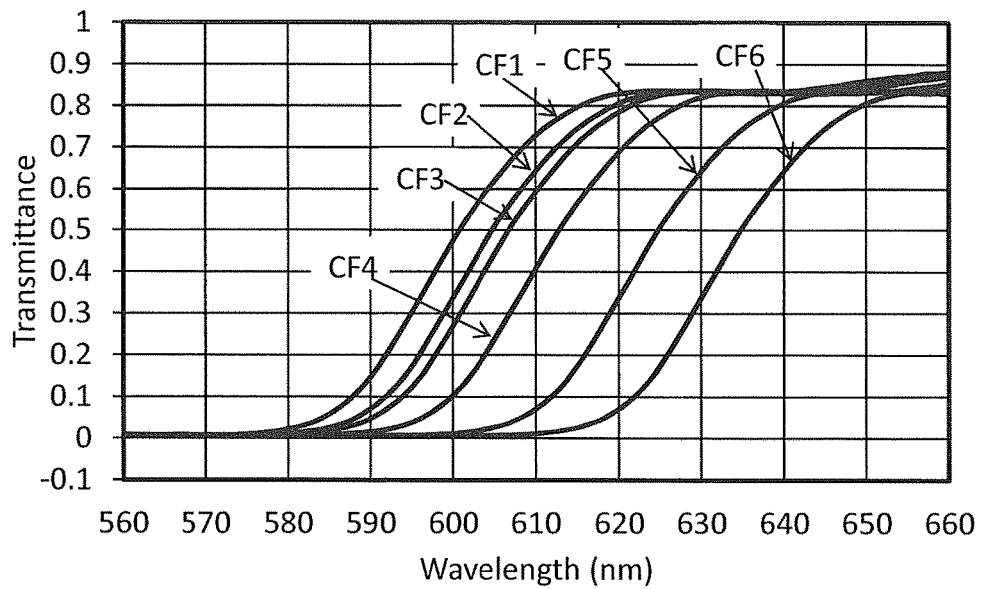
FIG. 24 is a graph showing the relation between wavelength and transmittance of color filters.

As the optical element (color filter: CF), six kinds of color filters (CF1, CF2, CF3, CF4, CF5, and CF6) having the optical characteristics shown in FIG. 24 were used.

Figure 25:
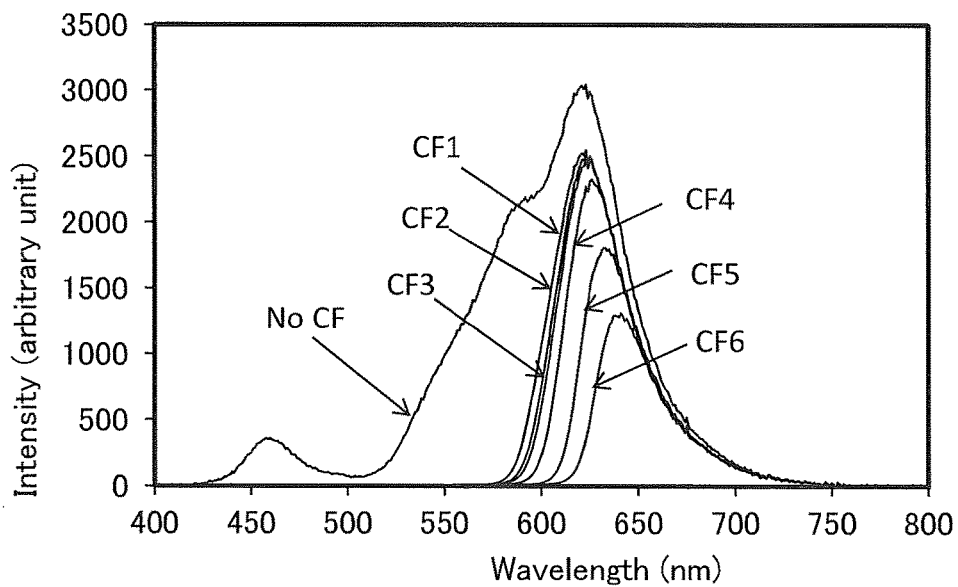
FIG. 25 shows emission spectra of Light-emitting elements 1 including color filters.
Figure 26:
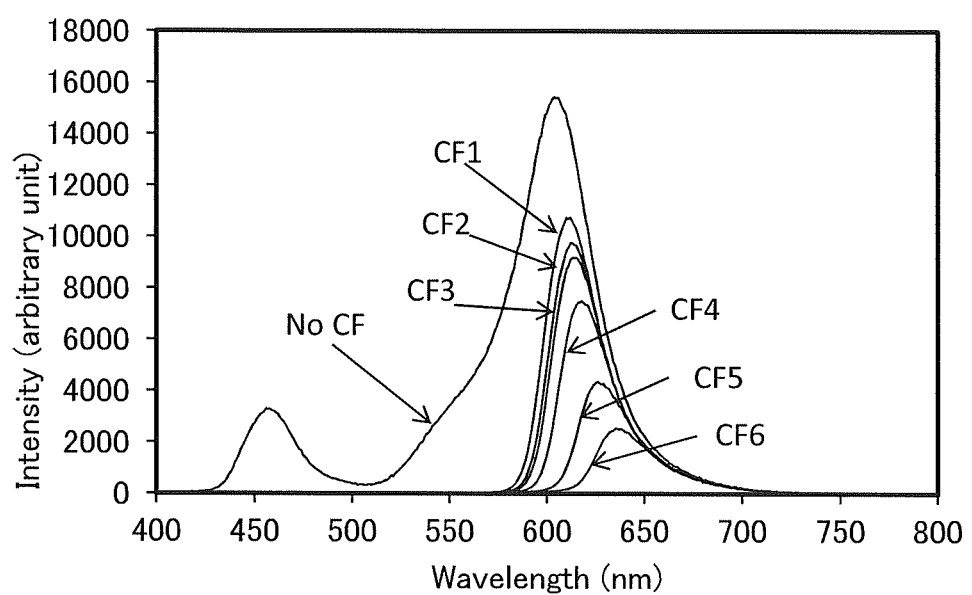
FIG. 26 shows emission spectra of Comparative light-emitting elements 2 including color filters.

FIG. 25 shows the emission spectra of Light-emitting elements 1 combined with the six kinds of color filters and the emission spectrum of Light-emitting element 1 not combined with any of the color filters. FIG. 26 shows the emission spectra of Comparative light-emitting elements 2 combined with the six kinds of color filters and the emission spectrum of Comparative light-emitting elements 2 not combined with any of the color filters. Table 3 lists the chromaticities of Light-emitting elements 1 combined with the color filters and Comparative light-emitting elements 2 combined with the color filters.

TABLE 3

| CF No. | Chromaticity | |
| --- | --- | --- |
|  | Light-emitting element 1 | Comparative light-emitting element 2 |
| 1 | (0.677, 0.322) | (0.664, 0.334) |
| 2 | (0.682, 0.317) | (0.670, 0.328) |
| 3 | (0.685, 0.314) | (0.672, 0.325) |
| 4 | (0.691, 0.308) | (0.680, 0.317) |
| 5 | (0.700, 0.299) | (0.688, 0.306) |
| 6 | (0.700, 0.296) | (0.681, 0.306) |

According to the results, the x-coordinate of the chromaticity of Light-emitting element 1 combined with CF1 is less than 0.68, whereas the x-coordinate of the chromaticity of Light-emitting element 1 combined with CF2 is greater than or equal to 0.68, which suggests that the color filter that is used for Light-emitting element 1 preferably has a transmittance of 40% or less of light with a wavelength of 600 nm. Considering that the x-coordinate of the chromaticity of Light-emitting element 1 combined with CF3 is 0.685, which means that the chromaticity is further improved, the color filter that is used for Light-emitting element 1 more preferably has a transmittance of 30% or less of light with a wavelength of 600 nm. The x-coordinate of the chromaticity of Light-emitting element 1 combined with CF4 is 0.691, which is greater than 0.69. Thus, for further improvement in chromaticity, the color filter that is used for Light-emitting element 1 still more preferably has a transmittance of 20% or less of light with a wavelength of 600 nm. The important point here is that the intensities of the emission spectrum peaks are maintained when CF2, CF3, and CF4 are used as shown in FIG. 25. This means that like Light-emitting element 1, a light-emitting element whose emission spectrum has a peak at a wavelength of greater than or equal to 620 nm and a half width of less than or equal to 120 nm can keep high efficiency even when combined with the specific color filter described above so that red light with chromaticity whose x-coordinate is greater than or equal to 0.68 is obtained.

The x-coordinate of the chromaticity of each of Light-emitting element 1 combined with CF5 and Light-emitting element 1 combined with CF6 is 0.70. However, comparison of the intensity of the emission spectrum peak shows that Light-emitting element 1 combined with CF5 maintains the peak intensity higher than or equal to half (approximately 60%) of that of Light-emitting element 1 not combined with any of the color filters, whereas the peak intensity of Light-emitting element 1 combined with CF6 is significantly lower than that of Light-emitting element 1 combined with CF5, and is approximately 40% of that of Light-emitting element 1 not combined with any of the color filters. This implies that only shifting the transmittance characteristics of a color filter to the long wavelength side as in the case of CF6 does not help either increase color purity or maintain peak emission intensity (maintain emission efficiency). Thus, a color filter preferably has a transmittance of 40% or more of light with a wavelength of 630 nm.

According to the results in this example, high color purity and high efficiency of Light-emitting element 1 are achieved when it is combined with CF2, CF3, CF4, or CF5. Thus, when a color filter with a transmittance of 40% or less of light with a wavelength of 600 nm and a transmittance of 40% or more of light with a wavelength of 630 nm is combined with a light-emitting element that emits light whose emission spectrum has a half width of greater than or equal to 5 nm and less than or equal to 120 nm and a peak at greater than or equal to 620 nm and less than or equal to 680 nm, like Light-emitting element 1 in this example, red light emission with favorable chromaticity, or chromaticity whose x-coordinate is greater than or equal to 0.68, can be obtained efficiently.

Meanwhile, when a color filter whose transmittance characteristics are shifted to the long wavelength side to be the same as that of CF4 is combined with Comparative light-emitting element 2, an x-coordinate of the chromaticity of 0.68 is achieved. However, the peak emission intensity in that case is lower than or equal to half of that of Comparative light-emitting element 2 not combined with any or the color filters. The use of CF5 or CF6, transmittance characteristics of which are further shifted to the long wavelength side, does not increase the x-coordinate of chromaticity (does not increase color purity) and only decreases peak emission intensity.

In other words, unlike in the case of Light-emitting element 1, even the use of a color filter whose transmittance characteristics are shifted to the long wavelength side does not result in an x-coordinate of the chromaticity of greater than or equal to 0.69 in the case of Comparative light-emitting element 2. In addition, in a region where the x-coordinate of chromaticity is greater than or equal to 0.68, emission efficiency is noticeably low.

Figure 27:
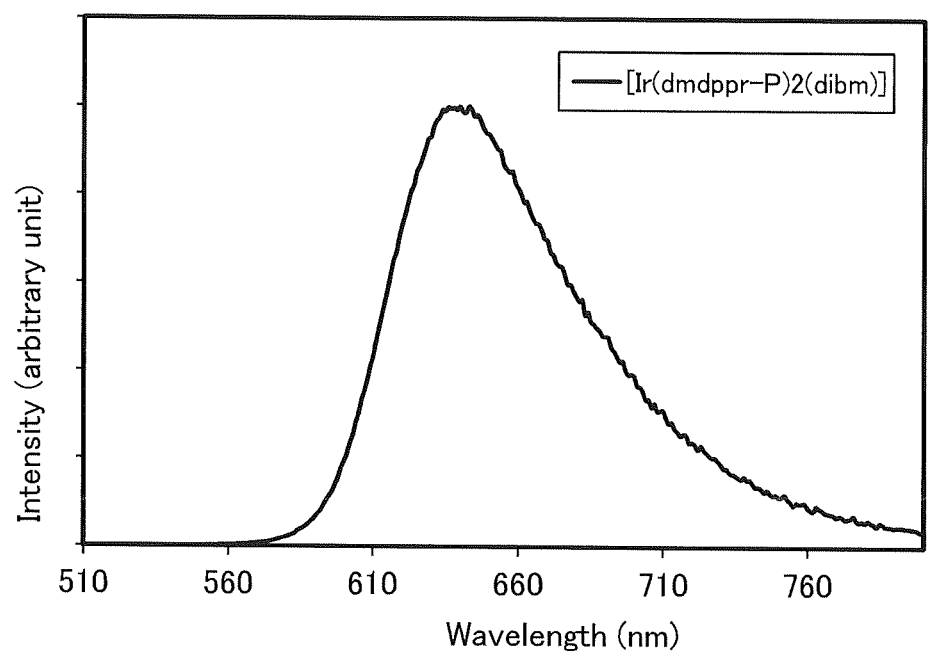
FIG. 27 shows the photoluminescence (PL) spectrum of [Ir(dmdppr-P)$_2$(dibm)] in a solution.

Thus, the light-emitting element of one embodiment of the present invention preferably emits light whose emission spectrum has a half width of greater than or equal to 5 nm and less than or equal to 120 nm and a peak at greater than or equal to 620 nm and less than or equal to 680 nm when it is not combined with any of the color filters like Light-emitting element 1 described in Example 1. Note that to achieve such element characteristics, it is preferable to use a light-emitting substance with an emission spectrum peak at greater than or equal to 600 nm and less than or equal to 700 nm, such as [Ir(dmdppr-P)$_2$(dibm)], which is used for the light-emitting layer of Light-emitting element 1 in this example. FIG. 27 shows the photoluminescence (PL) spectrum of the substance in a dichloromethane solution. The concentration of the solution is approximately $1 \times 10^5$ mol/L. As shown in the graph, the substance has an emission spectrum peak at around 640 nm.

REFERENCE EXAMPLE

In this reference example, a synthesis method of bis{4,6-dimethyl-2-[5-(4-cyano-2,6-dimethylphenyl)-3-(3,5-dimethylphenyl)-2-pyrazin yl-κN]phenyl-κC}(2,2,6,6-tetramethyl-3,5-heptanedionato-κ$^2$O,O')iridium(III) (abbreviation: [Ir(dmdppr-dmCP)$_2$(dpm)]) (Structural Formula (100)), which is the organometallic complex with an emission spectrum peak at greater than or equal to 600 nm and less than or equal to 700 nm, a light-emitting substance that can be used for the light-emitting layer of the light-emitting element of one embodiment of the present invention, is described. The structure of [Ir(dmdppr-dmCP)$_2$(dpm)] is shown below.

[Chemical Formula 3]

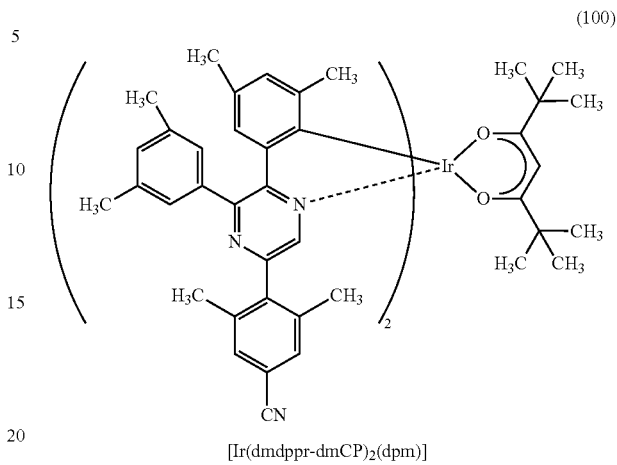

[Ir(dmdppr-dmCP)$_2$(dpm)]

Step 1: Synthesis of 5-hydroxy-2,3-(3,5-dimethylphenyl)pyrazine

First, 5.27 g of 3,3',5,5'-tetramethylbenzyl, 2.61 g of glycinamide hydrochloride, 1.92 g of sodium hydroxide, and 50 mL of methanol were put into a three-neck flask equipped with a reflux pipe, and the air in the flask was replaced with nitrogen. After that, the mixture was stirred at 80° C. for 7 hours to cause a reaction. Furthermore, 2.5 mL of 12M hydrochloric acid was added to the mixture and stirring was performed for 30 minutes. Then, 2.02 g of potassium hydrogencarbonate was added, and stirring was performed for 30 minutes. After the resulting suspension was subjected to suction filtration, the obtained solid was washed with water and methanol to give the target pyrazine derivative as milky white powder in a yield of 79%. A synthesis scheme of Step 1 is shown in (a-1).

[Chemical Formula 4]

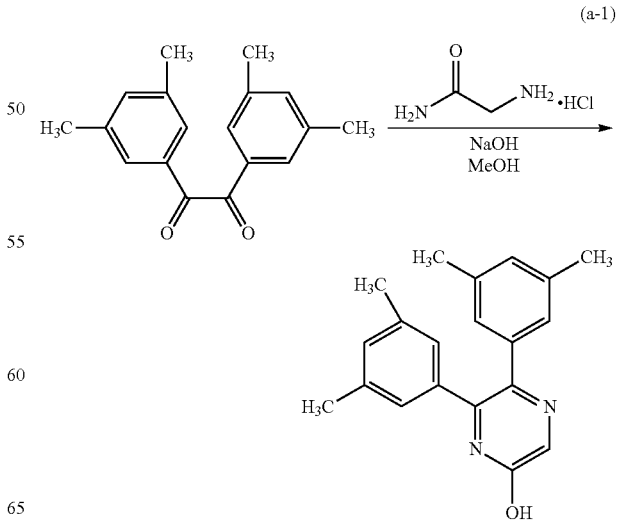

Step 2: Synthesis of 5,6-bis(3,5-dimethylphenyl)pyrazin-2-yl trifluoromethanesulfonate Next, 4.80 g of 5-hydroxy-2,3-(3,5-dimethylphenyl)pyrazine which was obtained in Step 1, 4.5 mL of triethylamine, and 80 mL of dehydrated dichloromethane were put into a three-neck flask, and the air in the flask was replaced with nitrogen. The flask was cooled down to −20° C., 3.5 mL of trifluoromethanesulfonic anhydride was dropped therein, and stirring was performed at room temperature for 17.5 hours. Then, the flask was cooled down to 0° C., 0.7 mL of trifluoromethanesulfonic anhydride was further dropped therein, and stirring was performed at room temperature for 22 hours to cause a reaction. Next, 50 mL of water and 5 mL of 1M hydrochloric acid were added to the reaction solution and then, dichloromethane was added, so that a substance contained in the reaction solution was extracted in the dichloromethane. This dichloromethane solution was washed with a saturated aqueous solution of sodium hydrogencarbonate, and saturated brine. Then, magnesium sulfate was added thereto for drying. After being dried, the solution was filtered, and the filtrate was concentrated and the obtained residue was purified by silica gel column chromatography using toluene:hexane=1:1 (volume ratio) as a developing solvent, so that the target pyrazine derivative was obtained as yellow oil in a yield of 96%. A synthesis scheme of Step 2 is shown in (a-2).

[Chemical Formula 5]

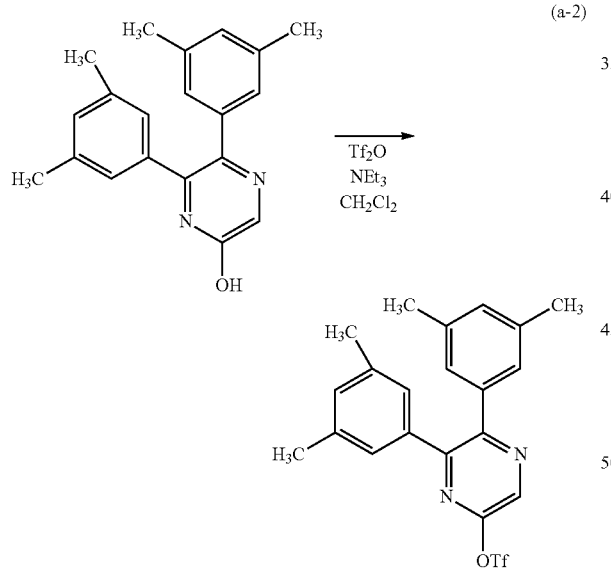

Step 3: Synthesis of 5-(4-cyano-2,6-dimethylphenyl)-2,3-bis(3,5-dimethylphenyl)pyrazine (abbreviation: Hdmdppr-dmCP)

Next, 2.05 g of 5,6-bis(3,5-dimethylphenyl)pyrazin-2-yl trifluoromethanesulfonate that was obtained in Step 2, 1.00 g of 4-cyano-2,6-dimethylphenylboronic acid, 3.81 g of tripotassium phosphate, 40 mL of toluene, and 4 mL of water were put into a three-neck flask, and the air in the flask was replaced with nitrogen. The mixture in the flask was degassed by being stirred under reduced pressure, 0.044 g of tris(dibenzylideneacetone)dipalladium(0) and 0.084 g of tris(2,6-dimethoxyphenyl)phosphine were then added thereto, and the mixture was refluxed for 7 hours. Water was added to the reaction solution, and then toluene was added, so that the substance contained in the reaction solution was extracted in the toluene. The toluene solution was washed with saturated brine. Then, magnesium sulfate was added for drying. After being dried, the solution was filtered, and the filtrate was concentrated and the obtained residue was purified by silica gel column chromatography using hexane:ethyl acetate=5:1 (volume ratio) as a developing solvent, so that the target pyrazine derivative Hdmdppr-dmCP was obtained as white powder in a yield of 90%. A synthesis scheme of Step 3 is shown in (a-3).

[Chemical Formula 6]

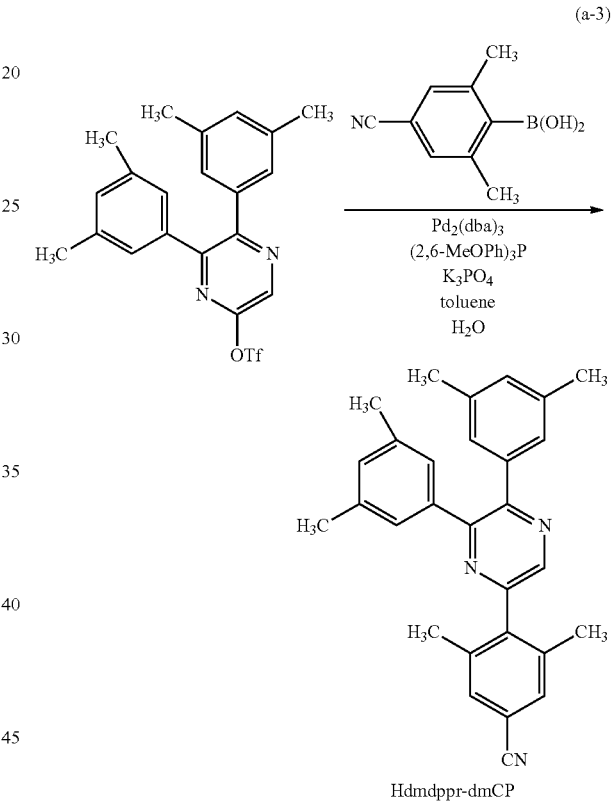

Step 4: Synthesis of di-μ-chloro-tetrakis{4,6-dimethyl-2-[5-(4-cyano-2,6-dimethylphenyl)-3-(3,5-dimethylphenyl)-2-pyrazinyl-κN]phenyl-κC}diiridium(III) (abbreviation: [Ir(dmdppr-dmCP)$_2$Cl]$_2$)

Next, 15 mL of 2-ethoxyethanol, 5 mL of water, 1.74 g of Hdmdppr-dmCP (abbreviation) obtained in Step 3 described above, and 0.60 g of iridium chloride hydrate (IrCl$_3$.H$_2$O) (produced by Furuya Metal Co., Ltd.) were put into a recovery flask equipped with a reflux pipe, and the air in the flask was replaced with argon. After that, microwave irradiation (2.45 GHz, 100 W) was performed for 1 hour to cause a reaction. The solvent was distilled off, and the obtained residue was suction-filtered and washed with hexane to give a dinuclear complex [Ir(dmdppr-dmCP)$_2$Cl]$_2$ as brown powder in a yield of 89%. The synthesis scheme of Step 4 is shown in (a-4).

[Chemical Formula 7]

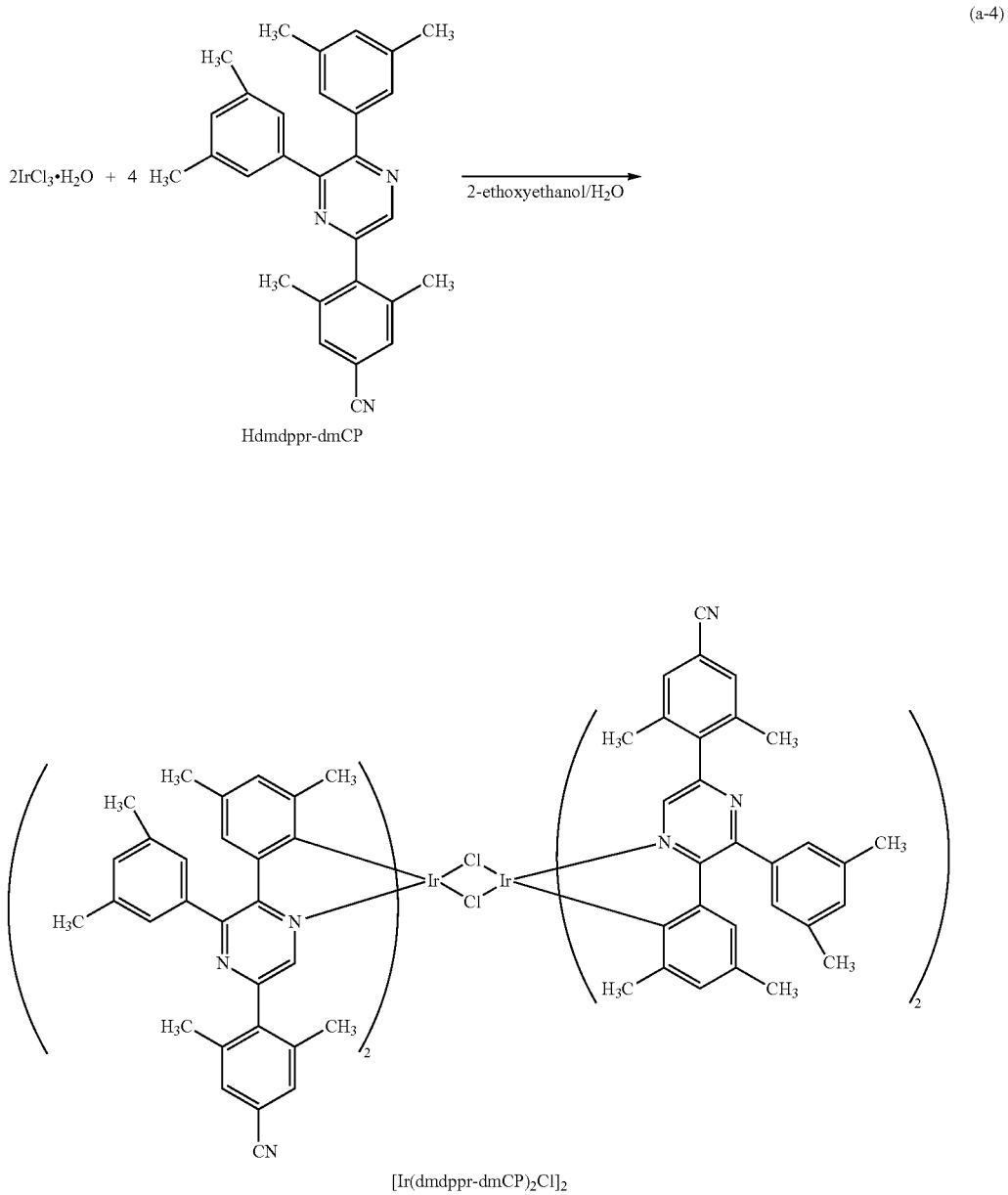

(a-4)

Step 5: Synthesis of bis{4,6-dimethyl-2-[5-(4-cyano-2,6-dimethylphenyl)-3-(3,5-dimethylphenyl)-2-pyrazin yl-κN]phenyl-κC}(2,2,6,6-tetramethyl-3,5-heptanedionato-κ²O,O')iridium(III) (abbreviation: [Ir(dmdppr-dmCP)₂(dpm)]

Furthermore, 30 mL of 2-ethoxyethanol, 0.96 g of [Ir(dmdppr-dmCP)₂Cl]₂ that is the dinuclear complex obtained in Step 4 described above, 0.26 g of dipivaloylmethane (abbreviation: Hdpm), and 0.48 g of sodium carbonate were put into a recovery flask equipped with a reflux pipe, and the air in the flask was replaced with argon. After that, the mixture was irradiated with microwaves (2.45 GHz, 100 W) for 60 minutes. Moreover, 0.13 g of Hdpm was added thereto, and the reaction container was subjected to microwave irradiation (2.45 GHz, 120 W) for 60 minutes to cause a reaction. The solvent was distilled off, and then the obtained residue was purified by silica gel column chromatography using dichloromethane:hexane=1:1 (volume ratio) as a developing solvent. The obtained residue was purified by silica gel column chromatography using dichloromethane as a developing solvent, and then recrystallization was performed with a mixed solvent of dichloromethane and methanol to give the organometallic complex [Ir(dmdppr-dmCP)₂(dpm)] as red powder in a yield of 37%. By a train sublimation method, 0.39 g of the obtained red powdered solid was purified. In the purification by sublimation, the solid was heated at 300° C. under a pressure of 2.6 Pa with an argon gas flow rate of 5 mL/min. After the purification by sublimation, a red solid of the target substance was obtained in a yield of 85%. The synthesis scheme of Step 5 is shown in (a-5).

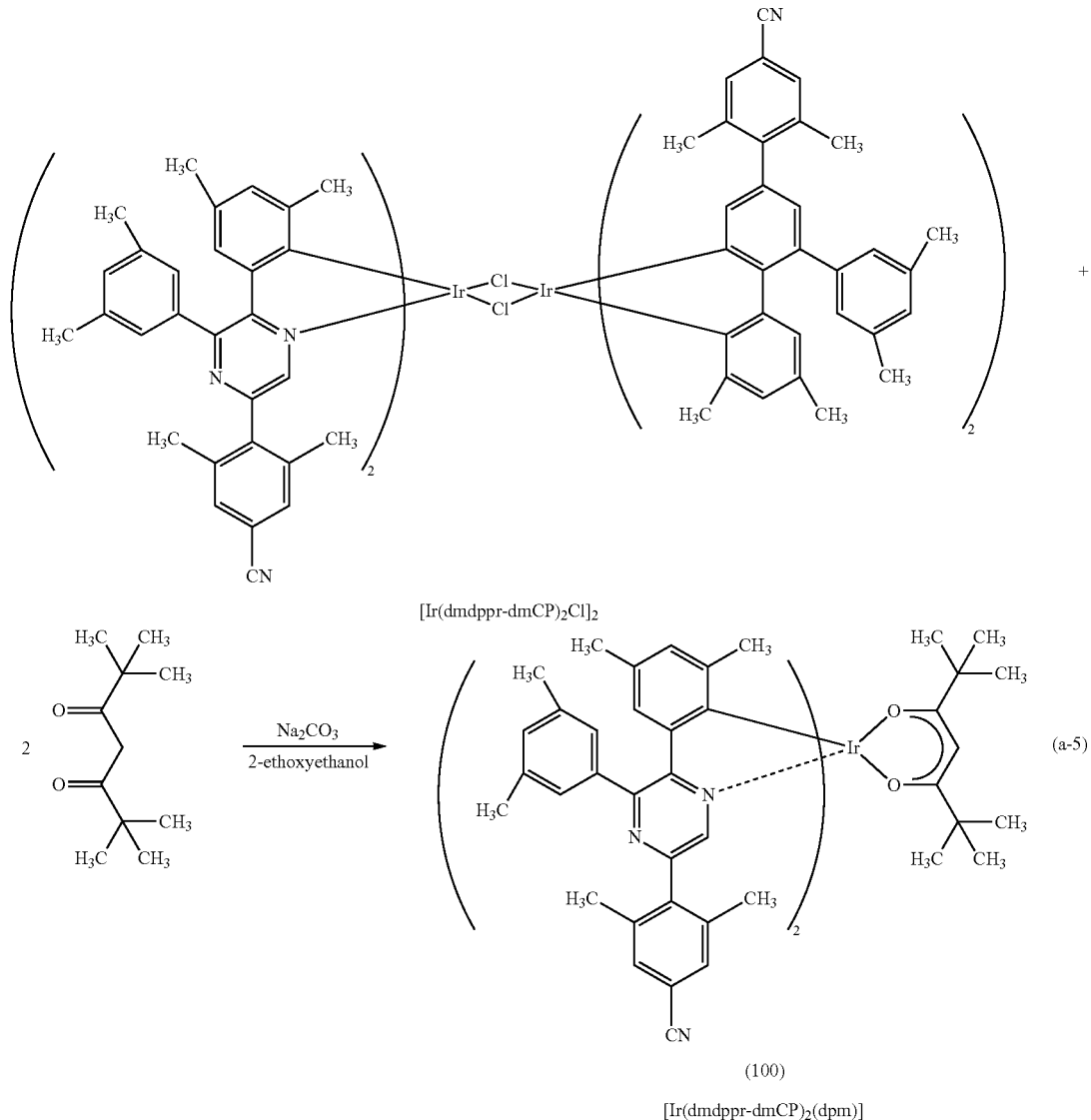

Note that results of the analysis of the red powder obtained in Step 5 by nuclear magnetic resonance spectrometry ($^1$H-NMR) are given below. These results revealed that [Ir(dmdppr-dmCP)$_2$(dpm)], which is the organometallic complex represented by Structural Formula (100), was obtained in this synthesis example.

$^1$H-NMR. δ (CD$_2$Cl$_2$): 0.91 (s, 18H), 1.41 (s, 6H), 1.95 (s, 6H), 2.12 (s, 12H), 2.35 (s, 12H), 5.63 (s, 1H), 6.49 (s, 2H), 6.86 (s, 2H), 7.17 (s, 2H), 7.34 (s, 4H), 7.43 (s, 4H), 8.15 (s, 2H).

This application is based on Japanese Patent Application serial No. 2016-096369 filed with Japan Patent Office on May 12, 2016, the entire contents of which are hereby incorporated by reference.

What is claimed is:

1. A light-emitting element comprising an EL layer between a first electrode and a second electrode,
   wherein the EL layer is capable of emitting white light,
   wherein a light-emitting substance in the EL layer is an organometallic iridium complex,
   wherein a color filter having a transmittance of 40% or less of light with a wavelength of 600 nm and a transmittance of 40% or more of light with a wavelength of 630 nm is provided on a second electrode side of the light-emitting element, and
   wherein emission of light whose emission spectrum has a half width of greater than or equal to 5 nm and less than or equal to 120 nm and a peak at greater than or equal to 620 nm and less than or equal to 680 nm is obtained from the light-emitting element.

2. The light-emitting element according to claim 1,
   wherein a transparent conductive layer is provided between the first electrode and the EL layer, and
   wherein an optical path length between the transparent conductive layer and the second electrode is set such that red light emission obtained from the EL layer is relatively intensified.

3. The light-emitting element according to claim 1,
   wherein the first electrode is reflective, and
   wherein the second electrode is semi-transmissive and semi-reflective.

4. A light-emitting device comprising:
the light-emitting element according to claim 1; and
a transistor,
wherein the transistor comprises an oxide semiconductor in a channel formation region.

5. An electronic device comprising:
the light-emitting device according to claim 4; and
an operation key, a speaker, a microphone, or an external connection portion.

6. A lighting device comprising:
the light-emitting device according to claim 4; and
a housing.

7. A light-emitting device comprising:
the light-emitting element according to claim 1; and
an FPC.

8. A light-emitting element comprising a plurality of EL layers between a first electrode and a second electrode,
wherein the EL layer is capable of emitting white light,
wherein a color filter having a transmittance of 40% or less of light with a wavelength of 600 nm and a transmittance of 40% or more of light with a wavelength of 630 nm is provided on a second electrode side of the light-emitting element, and
wherein emission of light whose emission spectrum has a half width of greater than or equal to 5 nm and less than or equal to 120 nm and a peak at greater than or equal to 620 nm and less than or equal to 680 nm is obtained from the light-emitting element.

9. The light-emitting element according to claim 8,
wherein a transparent conductive layer is provided between the first electrode and the EL layers, and
wherein an optical path length between the transparent conductive layer and the second electrode is set such that red light emission obtained from the EL layers is relatively intensified.

10. The light-emitting element according to claim 8,
wherein a charge generation layer is provided between the EL layers.

11. The light-emitting element according to claim 8,
wherein the first electrode is reflective, and
wherein the second electrode is semi-transmissive and semi-reflective.

12. A light-emitting device comprising:
the light-emitting element according to claim 8; and
an FPC.

13. An electronic device comprising:
the light-emitting device according to claim 12; and
an operation key, a speaker, a microphone, or an external connection portion.

14. A lighting device comprising:
the light-emitting device according to claim 12; and
a housing.

15. A light-emitting device comprising:
a light-emitting element on a single crystal substrate,
wherein the light-emitting element comprises an EL layer between a first electrode and a second electrode,
wherein the EL layer is capable of emitting white light,
wherein a color filter having a transmittance of 40% or less of light with a wavelength of 600 nm and a transmittance of 40% or more of light with a wavelength of 630 nm is provided on a second electrode side of the light-emitting element, and
wherein emission of light whose emission spectrum has a half width of greater than or equal to 5 nm and less than or equal to 120 nm and a peak at greater than or equal to 620 nm and less than or equal to 680 nm is obtained from the light-emitting element.

16. The light-emitting device according to claim 15,
wherein the first electrode is reflective, and
wherein the second electrode is semi-transmissive and semi-reflective.

17. The light-emitting device according to claim 15, further comprising:
an FPC.

18. An electronic device comprising:
the light-emitting device according to claim 15; and a housing.

* * * * *